(12) United States Patent
Bae et al.

(10) Patent No.: US 11,251,306 B2
(45) Date of Patent: Feb. 15, 2022

(54) INTEGRATED CIRCUIT DEVICE

(71) Applicant: SAMSUNG ELECTRONICS CO., LTD., Suwon-si (KR)

(72) Inventors: Deokhan Bae, Hwaseong-si (KR); Juhun Park, Seoul (KR); Myungyoon Um, Seoul (KR); Kwangyong Jang, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/028,191

(22) Filed: Sep. 22, 2020

(65) Prior Publication Data

US 2021/0305427 A1    Sep. 30, 2021

(30) Foreign Application Priority Data

Mar. 27, 2020 (KR) .......................... 10-2020-0037797

(51) Int. Cl.
*H01L 29/78* (2006.01)
*H01L 27/088* (2006.01)
*H01L 29/66* (2006.01)
*H01L 29/417* (2006.01)
*H01L 21/8234* (2006.01)

(52) U.S. Cl.
CPC .. *H01L 29/7851* (2013.01); *H01L 21/823431* (2013.01); *H01L 27/0886* (2013.01); *H01L 29/41725* (2013.01); *H01L 29/66545* (2013.01)

(58) Field of Classification Search
CPC .......... H01L 29/7851; H01L 29/41725; H01L 29/66545; H01L 21/823431; H01L 27/0886
See application file for complete search history.

(56) References Cited

U.S. PATENT DOCUMENTS

| | | |
|---|---|---|
| 9,461,143 B2 | 10/2016 | Pethe et al. |
| 9,543,211 B1 | 1/2017 | Lu et al. |
| 10,062,763 B2 | 8/2018 | Bao et al. |
| 10,204,994 B2 | 2/2019 | Xie et al. |
| 10,243,053 B1 | 3/2019 | Xie et al. |
| 10,388,747 B1 | 8/2019 | Xie et al. |
| 10,497,612 B2 | 12/2019 | Xie et al. |

(Continued)

FOREIGN PATENT DOCUMENTS

KR    20190056886 A    5/2019

*Primary Examiner* — Christine A Enad
(74) *Attorney, Agent, or Firm* — Myers Bigel, P.A.

(57) ABSTRACT

An integrated circuit device includes a fin-type active region extending on a substrate in a first horizontal direction, a gate line extending on the fin-type active region in a second horizontal direction, first and second source/drain regions arranged on the fin-type active region; a first source/drain contact pattern connected to the first source/drain region and including a first segment having a first height in a vertical direction, a second source/drain contact pattern connected to the second source/drain region and including a second segment having a second height less than the first height in the vertical direction, and an insulating capping line extending on the gate line in the second horizontal direction and including an asymmetric capping portion between the first segment and the second segment, the asymmetric capping portion having a variable thickness in the first horizontal direction.

18 Claims, 62 Drawing Sheets

(56) References Cited

U.S. PATENT DOCUMENTS

| | | | |
|---|---|---|---|
| 2015/0187905 A1* | 7/2015 | Cai | H01L 29/6681 |
| | | | 257/288 |
| 2019/0157406 A1 | 5/2019 | Hwang et al. | |
| 2019/0165114 A1* | 5/2019 | Lee | H01L 27/088 |
| 2019/0295889 A1 | 9/2019 | Bai et al. | |
| 2019/0371654 A1 | 12/2019 | Cheng et al. | |
| 2020/0075595 A1* | 3/2020 | Shin | H01L 21/823828 |
| 2020/0335401 A1* | 10/2020 | Fan | H01L 29/66795 |
| 2021/0082757 A1* | 3/2021 | Lee | H01L 23/5283 |

\* cited by examiner

INTEGRATED CIRCUIT DEVICE

CROSS-REFERENCE TO RELATED APPLICATION

This application claims the benefit of Korean Patent Application No. 10-2020-0037797, filed on Mar. 27, 2020, in the Korean Intellectual Property Office, the disclosure of which is incorporated herein in its entirety by reference.

BACKGROUND

The inventive concept relates to an integrated circuit device, and more particularly, to an integrated circuit device including a fin field-effect transistor.

With the recent rapid development of down-scaling of integrated circuit devices, it may be necessary to secure the accuracy of the operations of integrated circuit devices as well as the fast operating speed thereof. Accordingly, there is need to develop techniques relating to an integrated circuit device for reducing an area occupied by wirings and contacts in a relatively small area, reliably securing an insulation distance between wirings and contacts, and increasing reliability.

SUMMARY

The inventive concept provides an integrated circuit device including a structure for increasing the reliability of the integrated circuit device having a device region reduced by down-scaling.

According to some embodiments of the inventive concept, there is provided an integrated circuit device including a fin-type active region extending on a substrate in a first horizontal direction, a gate line extending on the fin-type active region in a second horizontal direction perpendicular to the first horizontal direction, a first source/drain region on the fin-type active region to be adjacent to a first side wall of the gate line, a second source/drain region on the fin-type active region to be adjacent to a second side wall opposite the first side wall of the gate line, a first source/drain contact pattern electrically connected to the first source/drain region and including a first segment having a first height in a vertical direction that is perpendicular to the first horizontal direction and the second horizontal direction, a second source/drain contact pattern electrically connected to the second source/drain region and including a second segment having a second height less than the first height in the vertical direction, and an insulating capping line on the gate line and that extends in the second horizontal direction and including an asymmetric capping portion between the first segment of the first source/drain contact pattern and the second segment of the second source/drain contact pattern, the asymmetric capping portion having a variable thickness in the first horizontal direction.

According to some embodiments of the inventive concept, there is provided an integrated circuit device including a plurality of fin-type active regions extending on a substrate in a first horizontal direction and parallel with each other, a plurality of gate lines on the plurality of fin-type active regions that extend in a second horizontal direction perpendicular to the first horizontal direction, a plurality of insulating capping lines on the plurality of gate lines and extending in the second horizontal direction, a plurality of source/drain regions arranged on the plurality of fin-type active regions, each of the plurality of source/drain regions are between respective adjacent gate lines among the plurality of gate lines, and a plurality of source/drain contact patterns electrically connected to respective ones of the plurality of source/drain regions, wherein at least one insulating capping line among the plurality of insulating capping lines includes an asymmetric capping portion between adjacent source/drain contact patterns among the plurality of source/drain contact patterns, the asymmetric capping portion having a variable thickness in the first horizontal direction.

According to some embodiments of the inventive concept, there is provided an integrated circuit device including a substrate including a first device region, a second device region, and a device isolation region between the first device region and the second device region, a plurality of fin-type active regions extending in a first horizontal direction and parallel with each other in the first device region and the second device region, a gate line extending in a second horizontal direction perpendicular to the first horizontal direction in the first device region, the second device region, and the device isolation region and on the plurality of fin-type active regions, an insulating capping line extending in the second horizontal direction in the first device region, the second device region, and the device isolation region and on the gate line, a first pair of source/drain regions in the first device region and respectively arranged at both sides of the gate line, and a first pair of source/drain contact patterns in the first device region and electrically connected to the first pair of source/drain regions, wherein the insulating capping line includes an asymmetric capping portion between the first pair of source/drain contact patterns, the asymmetric capping portion having a variable thickness in the first horizontal direction.

BRIEF DESCRIPTION OF THE DRAWINGS

Embodiments of the inventive concept will be more clearly understood from the following detailed description taken in conjunction with the accompanying drawings in which:

FIGS. 2A through 2C are cross-sectional views of an integrated circuit device according to some embodiments, wherein FIG. 2A shows a partial configuration of a cross-section taken along line X1-X1' in FIG. 1 and a partial configuration of a cross-section taken along line X2-X2' in FIG. 1, FIG. 2B shows a partial configuration of a cross-section taken along line Y1-Y1' in FIG. 1, and FIG. 2C shows a partial configuration of a cross-section taken along line Y2-Y2' in FIG. 1;

FIGS. 4A through 4C are cross-sectional views of an integrated circuit device according to embodiments, wherein FIG. 4A shows a partial configuration of a region corresponding to the cross-section taken along line X1-X1' in FIG. 1 and a partial configuration of a region corresponding to the cross-section taken along line X2-X2' in FIG. 1, FIG. 4B shows a partial configuration of a region corresponding to the cross-section taken along line Y1-Y1' in FIG. 1, and FIG. 4C shows a partial configuration of a region corresponding to the cross-section taken along line Y2-Y2' in FIG. 1;

DETAILED DESCRIPTION

Figure 1:
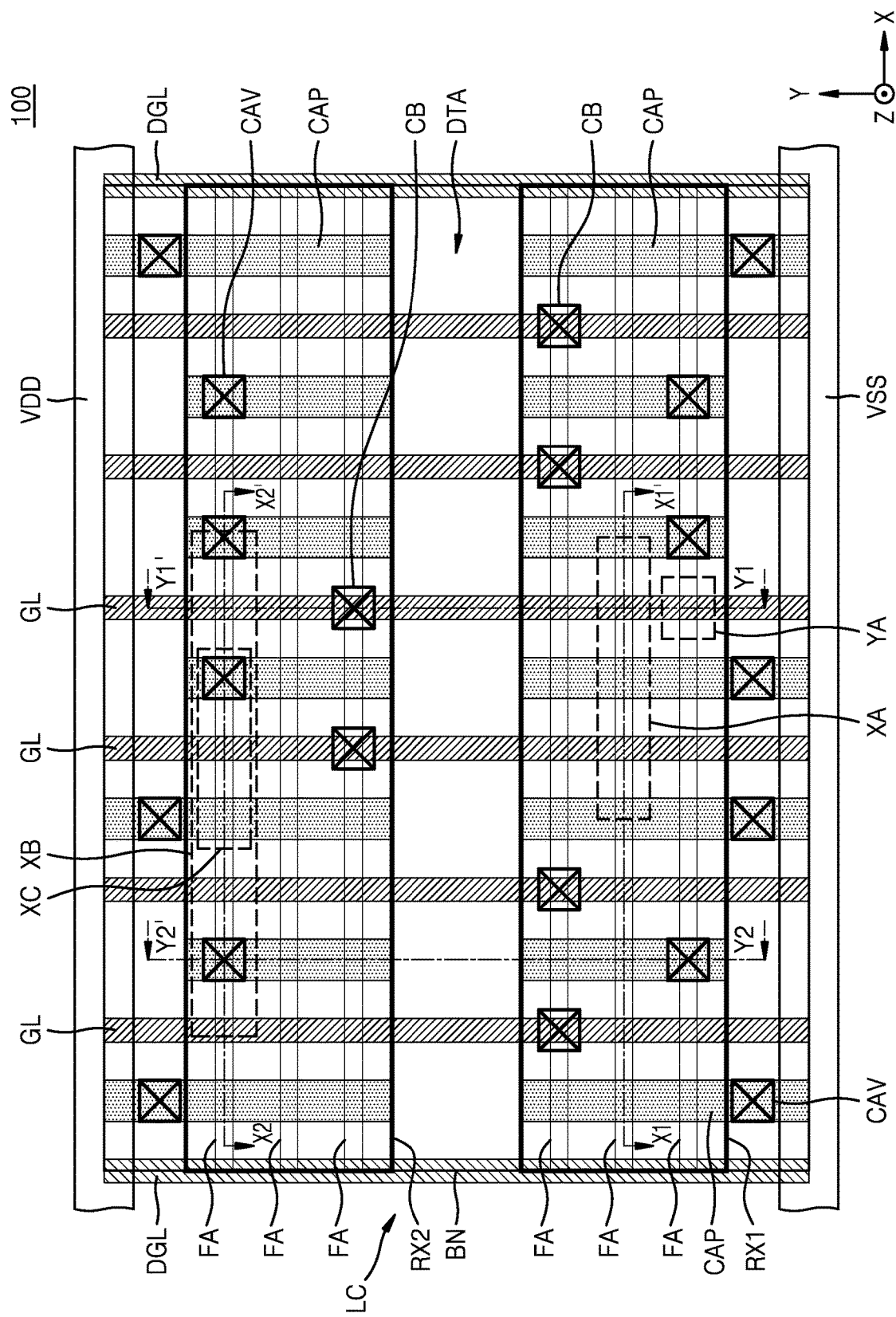
FIG. 1 is a plane layout diagram of an integrated circuit device according to some embodiments.

Hereinafter, embodiments will be described in detail with reference to the accompanying drawings. In the drawings, like reference characters denote like elements, and redundant descriptions thereof will be omitted.

Figure 2A:
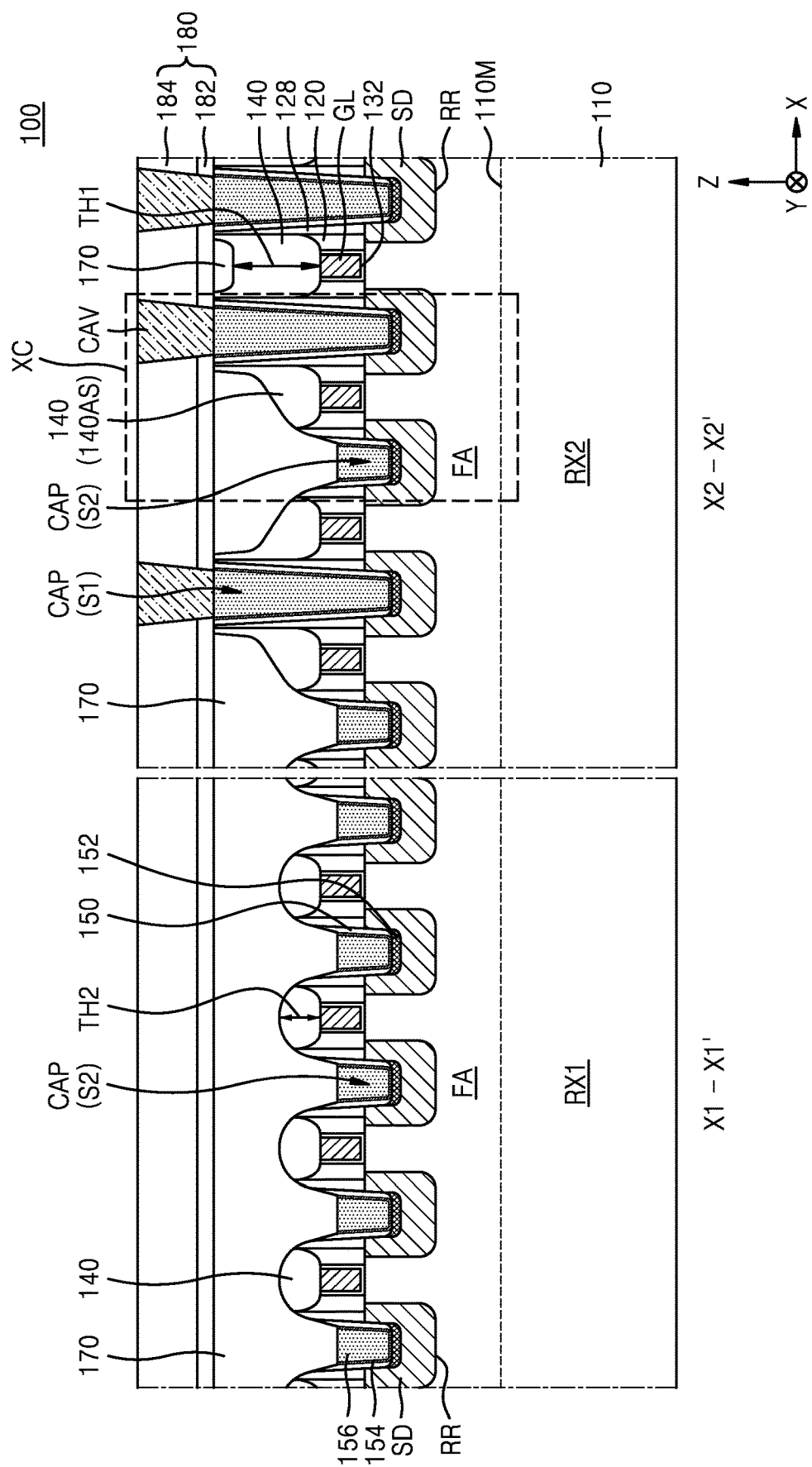
Figure 2B:
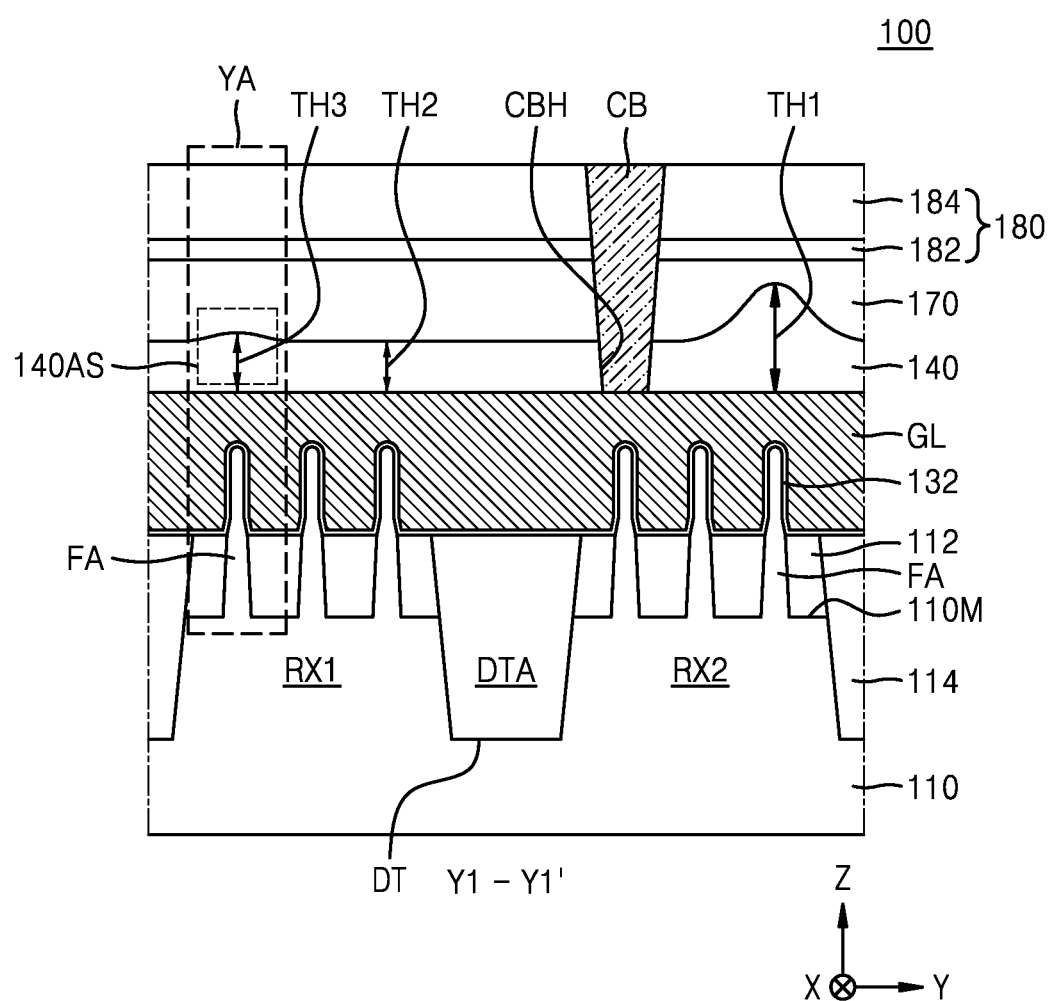
Figure 2C:
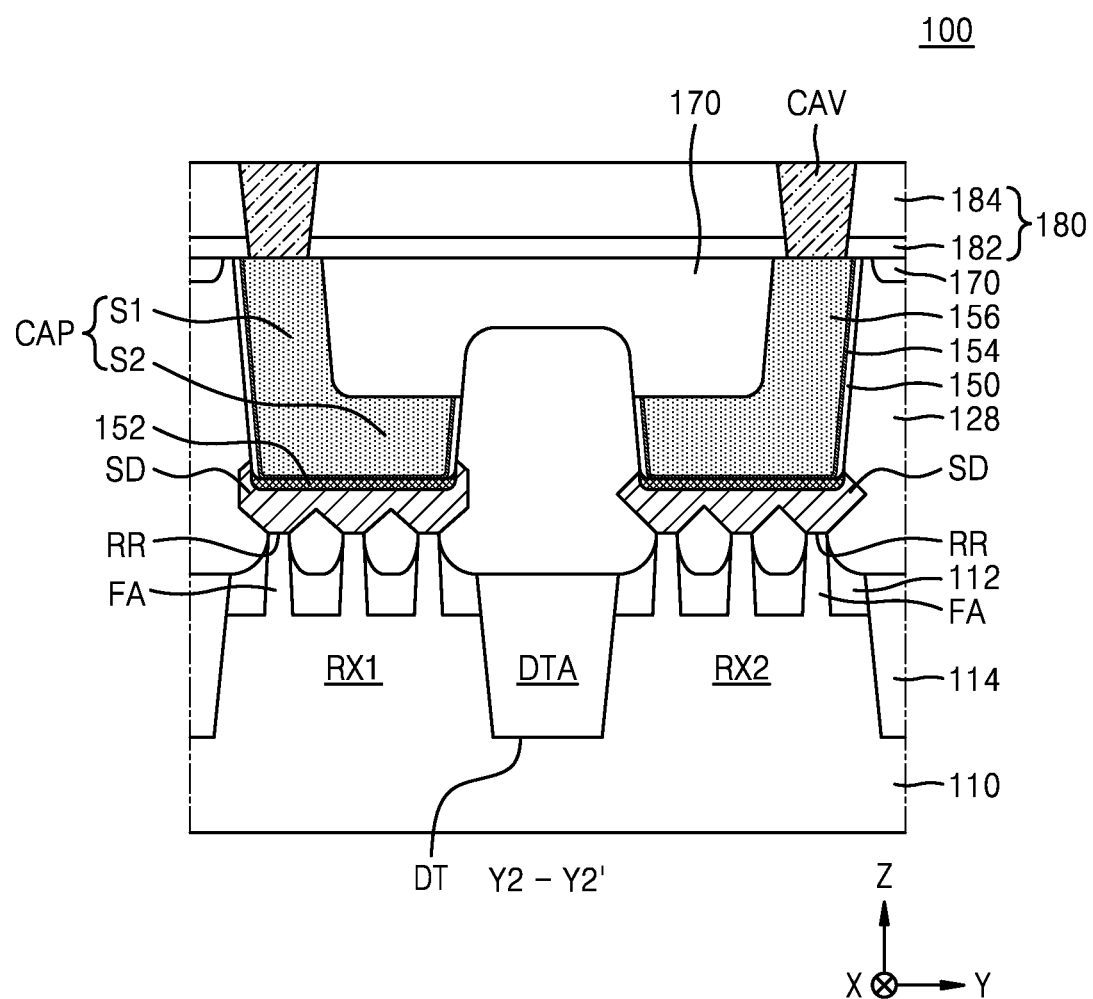
Figure 3:
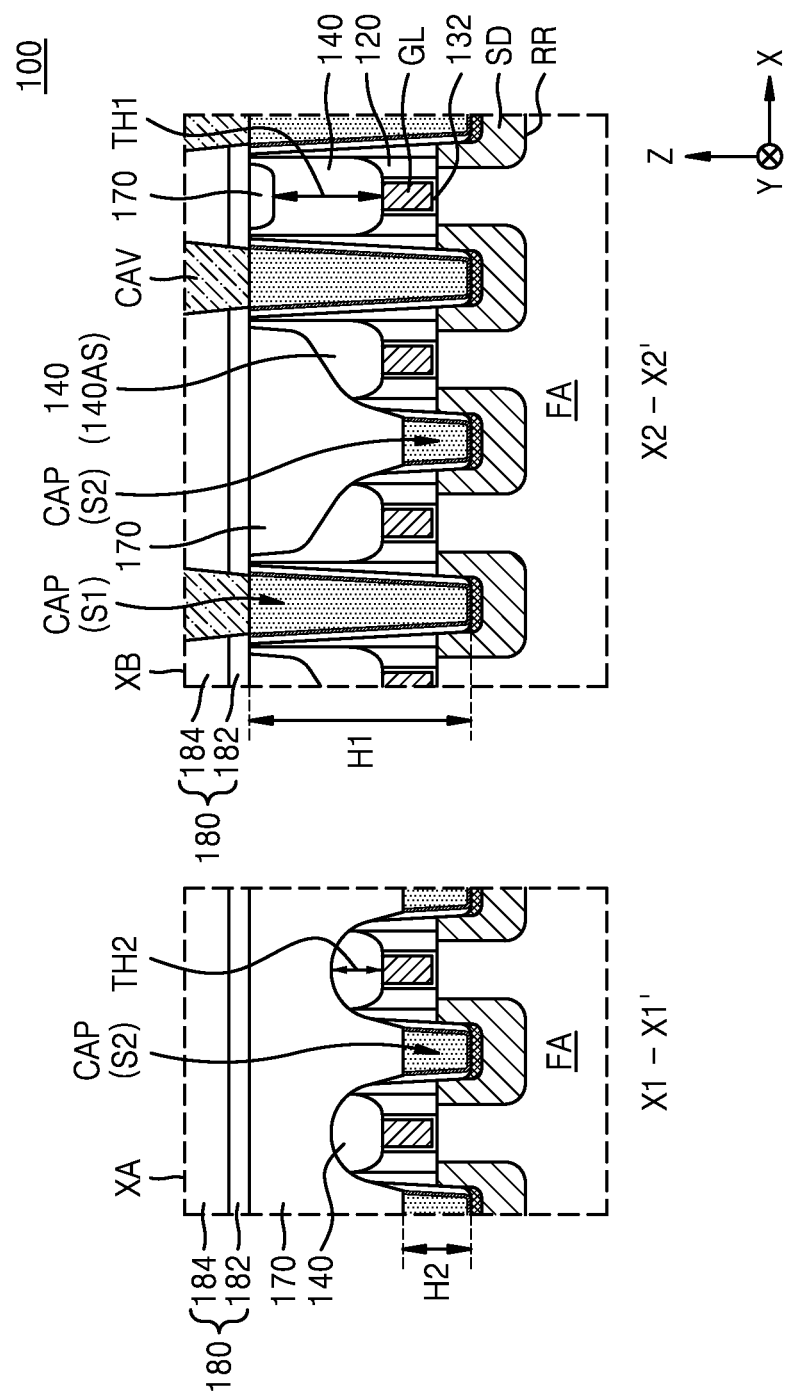
FIG. 3 is an enlarged cross-sectional view of regions XA and XB in FIG. 1.

FIG. 1 is a plane layout diagram of an integrated circuit device 100 according to some embodiments. FIGS. 2A through 2C are cross-sectional views of the integrated circuit device 100 according to embodiments, wherein FIG. 2A shows a partial configuration of a cross-section taken along line X1-X1' in FIG. 1 and a partial configuration of a cross-section taken along line X2-X2' in FIG. 1, FIG. 2B shows a partial configuration of a cross-section taken along line Y1-Y1' in FIG. 1, and FIG. 2C shows a partial configuration of a cross-section taken along line Y2-Y2' in FIG. 1. FIG. 3 is an enlarged cross-sectional view of regions XA and XB in FIG. 1.

Referring to FIGS. 1 through 3, the integrated circuit device 100 may form a logic cell including a fin field-effect transistor (FinFET). The integrated circuit device 100 includes a logic cell LC formed in a region defined by a cell boundary BN on a substrate 110.

The substrate 110 has a main surface 110M extending in a horizontal direction (e.g., an XY-plane direction). The substrate 110 may include a semiconductor such as Si or Ge or a compound semiconductor such as SiGe, SiC, GaAs, InAs, or InP. The substrate 110 may include a conductive region, e.g., an impurity-doped well or an impurity-doped structure.

The logic cell LC includes a first device region RX1 and a second device region RX2. A plurality of fin-type active regions FA protruding from the substrate 110 may be formed in each of the first device region RX1 and the second device region RX2. A device isolation region DTA may be between the first device region RX1 and the second device region RX2.

The fin-type active regions FA may extend in a width direction of the logic cell LC, i.e., a first horizontal direction (e.g., an X direction), to be parallel with each other. As shown in FIGS. 2B and 2C, an isolation film 112 may be formed in the substrate 110 among the fin-type active regions FA, and an isolation insulating film 114 may be formed in the substrate 110 in the device isolation region DTA. Each of the isolation film 112 and the isolation insulating film 114 may include an oxide film. The fin-type active regions FA may protrude from the isolation film 112 to have a fin shape in the first device region RX1 and the second device region RX2.

A plurality of gate insulating films 132 and a plurality of gate lines GL are formed on the substrate 110 to extend in a height direction of the logic cell LC, i.e., a second horizontal direction (e.g., a Y direction), crossing the fin-type active regions FA. The gate insulating films 132 and the gate lines GL may cover the top surface and both side walls of each of the fin-type active regions FA, the top surface of the isolation film 112, and the top surface of the isolation insulating film 114.

A plurality of metal-oxide semiconductor (MOS) transistors may be formed along the gate lines GL in the first device region RX1 and the second device region RX2. Each of the MOS transistors may have a three-dimensional (3D) structure, in which a channel is formed on the top surface and both side walls of each of the fin-type active regions FA.

A dummy gate line DGL may extend along the cell boundary BN in the second horizontal direction (e.g., the Y direction). The dummy gate line DGL may include the same material as the gate lines GL but may function as an electrical isolation region between the logic cell LC and another neighboring logic cell by maintaining an electrical floating state during the operation of the integrated circuit device 100.

The gate lines GL and a plurality of dummy gate lines DGL may have the same width in the first horizontal direction (e.g., the X direction) and may be arranged at a certain pitch in the first horizontal direction (e.g., the X direction).

The gate insulating films 132 may include a silicon oxide film, a high-k dielectric film, or a combination thereof. The high-k dielectric film may include a material having a higher dielectric constant than a silicon oxide film. The high-k dielectric film may include metal oxide or metal oxynitride. An interface film (not shown) may be between a fin-type active region FA and a gate insulating film 132. The interface film may include an oxide film, a nitride film, or an oxynitride film.

The gate lines GL and the dummy gate lines DGL may have a structure, in which a metal nitride layer, a metal layer, a conductive capping layer, and a gap-fill metal film are sequentially stacked. The metal nitride layer and the metal layer may include at least one metal selected from Ti, Ta, W, Ru, Nb, Mo, and Hf. The gap-fill metal film may include a W film or an Al film. The gate lines GL and the dummy gate lines DGL may include a work function metal layer. The work function metal layer may include at least one metal selected from Ti, W, Ru, Nb, Mo, Hf, Ni, Co, Pt, Yb, Tb, Dy, Er, and Pd. In some embodiments, the gate lines GL and the dummy gate lines DGL may include a stack structure of TiAlC/TiN/W, TiN/TaN/TiAlC/TiN/W, or TiN/TaN/TiN/TiAlC/TiN/W but are not limited thereto.

A plurality of insulating spacers 120 may cover or overlap both side walls of the gate lines GL and both side walls of the dummy gate lines DGL. Each of the insulating spacers 120 may extend in a line shape in a length direction (e.g., the Y direction) of the logic cell LC. The insulating spacers 120 may include a silicon nitride film, a SiOCN film, a SiCN film, or a combination thereof but are not limited thereto.

The top surface of each of the gate lines GL, the gate insulating films 132, the insulating spacers 120, and the dummy gate lines DGL may be covered with an insulating capping line 140. A plurality of insulating capping lines 140 may include a silicon nitride film.

A plurality of recess regions RR may be formed in top surfaces of the fin-type active regions FA to be respectively at both sides of each of the gate lines GL, and a plurality of source/drain regions SD may be formed in the recess regions RR. A gate line GL may be separated from a source/drain region SD with a gate insulating film 132 and an insulating spacer 120 between the gate line GL and the source/drain region SD. A plurality of source/drain regions SD may include a semiconductor epitaxial layer epitaxially grown on a plurality of recess regions RR in a fin-type active region FA or a combination of semiconductor epitaxial layers. The source/drain regions SD may include an epitaxially grown Si layer, an epitaxially grown SiC layer, or an epitaxially grown SiGe layer. An intergate insulating film 128 may include a silicon oxide film. In example embodiments, the source/drain regions SD may be covered with an insulating liner (not shown). The insulating liner may conformally cover or overlap the surface of each of the source/drain regions SD. The insulating liner may include SiN, SiCN, SiBN, SiON, SiOCN, SiBCN, SiOC, SiO$_2$, or a combination thereof.

In example embodiments, the first device region RX1 may correspond to an N-channel MOS (NMOS) transistor region, and the second device region RX2 may correspond to a P-channel MOS (PMOS) transistor region. In this case, a plurality of source/drain regions SD in the first device region RX1 may include an epitaxially grown Si layer or an epitaxially grown SiC layer, and a plurality of source/drain regions SD in the second device region RX2 may include a plurality of epitaxially grown SiGe layers. As shown in FIG. 2C, the source/drain regions SD in the first device region RX1 may have a different shape and size than the source/drain regions SD in the second device region RX2. However, embodiments are not limited thereto, and a plurality of source/drain regions SD may have various shapes and sizes in the first device region RX1 and the second device region RX2.

A plurality of source/drain contact patterns CAP may be formed on the source/drain regions SD. The source/drain regions SD may be connected to a conductive line (not shown) thereabove through the source/drain contact patterns CAP. The source/drain contact patterns CAP may include a conductive barrier film 154 and a metal plug 156. The conductive barrier film 154 may surround the side wall and bottom surface of the metal plug 156. A metal silicide film 152 may be formed between a source/drain region SD and a source/drain contact pattern CAP.

In example embodiments, the metal silicide film 152 may include Ti, W, Ru, Nb, Mo, Hf, Ni, Co, Pt, Yb, Tb, Dy, Er, or Pd. For example, the metal silicide film 152 may include titanium silicide. The conductive barrier film 154 may include Ti, Ta, TiN, TaN, or a combination thereof, and the metal plug 156 may include W, Co, Cu, Ru, Mn, or a combination thereof.

The side wall of each of the source/drain contact patterns CAP may be covered with or overlapped by a contact insulating spacer 150. In example embodiments, the contact insulating spacer 150 may include SiCN, SiCON, silicon nitride (SiN), or a combination thereof but is not limited thereto.

The source/drain contact patterns CAP may have different heights according to the positions thereof. Each of the source/drain contact patterns CAP may include a first segment Si and a second segment S2, which respectively have different heights in a vertical direction (e.g., a Z direction) and are integrally connected to each other. In other words, the first segment Si and the second segment S2 are monolithic.

The first segment Si of a source/drain contact pattern CAP above a fin-type active region FA may have a first height H1 in the vertical direction (e.g., the Z direction), and the second segment S2 of the source/drain contact pattern CAP may have a second height H2 less than the first height H1 in the vertical direction (e.g., the Z direction). In example embodiments, the topmost surface of the first segment S1 may be higher than the topmost surface of each of a plurality of gate lines GL in the vertical direction (e.g., the Z direction), and the topmost surface of the second segment S2 may be lower than the topmost surface of each of the gate lines GL in the vertical direction (e.g., the Z direction). In other words, a distance from the main surface 110M of the substrate 110 to the topmost surface of the first segment Si may be greater than a distance from the main surface 110M of the substrate 110 to the topmost surface of each of the gate lines GL in the vertical direction (e.g., the Z direction), and a distance from the main surface 110M of the substrate 110 to the topmost surface of the second segment S2 may be less than a distance from the main surface 110M of the substrate 110 to the topmost surface of each of the gate lines GL in the vertical direction (e.g., the Z direction). However, embodiments are not limited thereto. For example, the topmost surface of each of the first and second segments Si and S2 may be higher than the topmost surface of each of the gate lines GL.

At least some of the insulating capping lines 140 may include an asymmetric capping portion 140AS, which is between the first segment Si of one source/drain contact pattern CAP and the second segment S2 of another source/drain contact pattern CAP in the first horizontal direction (e.g., the X direction). For example, as shown in a region XC in FIGS. 1 and 2A, an insulating capping line 140 between the first segment Si of one source/drain contact pattern CAP and the second segment S2 of another source/drain contact pattern CAP may include the asymmetric capping portion 140AS, which has a variable thickness in the first horizontal direction (e.g., the X direction). The first segment Si of one source/drain contact pattern CAP may be adjacent to one of both side walls of a gate line GL, which are covered with the asymmetric capping portion 140AS of the insulating capping line 140, and the second segment S2 of another source/drain contact pattern CAP may be adjacent to an opposite one of the both side walls of the gate line GL.

The thickness of the asymmetric capping portion 140AS of the insulating capping line 140 may decrease toward the second segment S2 in the first horizontal direction (e.g., the X direction). In example embodiments, a portion of the asymmetric capping portion 140AS of the insulating capping line 140, which is closest to the first segment Si in the first horizontal direction (e.g., the X direction), is thickest in the vertical direction (e.g., the Z direction), and a portion of the asymmetric capping portion 140AS of the insulating capping line 140, which is closest to the second segment S2 in the first horizontal direction (e.g., the X direction), is thinnest in the vertical direction (e.g., the Z direction).

In example embodiments, two adjacent source/drain contact patterns CAP with the asymmetric capping portion 140AS of the insulating capping line 140 therebetween may be arranged to have different heights in the vertical direction (e.g., the Z direction) at positions facing each other with the asymmetric capping portion 140AS therebetween.

In example embodiments, the first segment Si of one source/drain contact pattern CAP may be between two adjacent insulating capping lines 140 among a plurality of insulating capping lines 140. In this case, each of the two adjacent insulating capping lines 140 may include the asymmetric capping portion 140AS, which is in alignment with the first segment Si between the two adjacent insulating capping lines 140 in the first horizontal direction (e.g., the X direction). The asymmetric capping portion 140AS of each of the two adjacent insulating capping lines 140 may be thicker toward the first segment Si between the two adjacent insulating capping lines 140.

In example embodiments, the second segment S2 of one source/drain contact pattern CAP may be between two adjacent insulating capping lines 140 among a plurality of insulating capping lines 140. In this case, each of the two adjacent insulating capping lines 140 may include the asymmetric capping portion 140AS, which is in alignment with the second segment S2 between the two adjacent insulating capping lines 140 in the first horizontal direction (e.g., the X direction). The asymmetric capping portion 140AS of each of the two adjacent insulating capping lines 140 may be thinner toward the second segment S2 between the two adjacent insulating capping lines 140.

In example embodiments, as shown in FIGS. 2B and 3, a portion of a plurality of insulating capping lines 140, which is between two adjacent first segments Si, may cover or overlap a gate line GL to a first thickness TH1 in the vertical direction (e.g., the Z direction). A portion of the insulating capping lines 140, which is between two adjacent second segments S2, may cover a gate line GL to a second thickness less than the first thickness TH1 in the vertical direction (e.g., the Z direction). Accordingly, a portion of a plurality of gate lines GL, which is between two adjacent first segments S1, may be covered with the portion of the insulating capping lines 140, which has the first thickness TH1 that is relatively great, and a portion of the gate lines GL, which is between two adjacent second segments S2, may be covered with the portion of the insulating capping lines 140, which has the second thickness TH2 that is relatively less than the first thickness TH1.

In example embodiments, as shown in FIG. 2B, a portion of the asymmetric capping portion 140AS may cover or overlap a gate line GL to a thickness that is less than the first thickness TH1 and equal to or greater than the second thickness TH2. For example, as shown in a region YA in FIGS. 1 and 2B, a portion of the asymmetric capping portion 140AS may cover the gate line GL to a third thickness TH3 that is less than the first thickness TH1 and greater than the second thickness TH2.

The maximum thickness of a portion of the insulating capping line 140 covering the isolation insulating film 114 in the device isolation region DTA may be less than the maximum thickness of a portion covering either the first device region RX1 or the second device region RX2. In example embodiments, the insulating capping line 140 in the device isolation region DTA may have a thickness that is less than the first thickness TH1 and equal or similar to the second thickness TH2. In this specification, the thickness similar to the second thickness TH2 may be in a range of about 10% of the second thickness TH2.

In example embodiments, as shown in FIG. 2B, at least one insulating capping line 140 may have a variable thickness in the second horizontal line (e.g., the Y direction). A portion of the insulating capping line 140 between two adjacent first segments Si may cover the gate line GL to the first thickness TH1. A portion of the insulating capping line 140 between two adjacent second segments S2 may cover the gate line GL to the second thickness TH2 that is less than the first thickness TH1. The asymmetric capping portion 140AS of the insulating capping line 140 may cover the gate line GL to the third thickness TH3 that is less than the first thickness TH1 and greater than the second thickness TH2. A portion of the insulating capping line 140 covering the isolation insulating film 114 in the device isolation region DTA may have a thickness that is less than the first thickness TH1 and equal or similar to the second thickness TH2.

In example embodiments, as shown in FIGS. 2A and 3, the asymmetric capping portion 140AS of the insulating capping line 140 may have a portion overlapping a fin-type active region FA in the vertical direction (e.g., the Z direction). The first segment S1 of a source/drain contact pattern CAP closest to a side wall of a gate line GL covered with the asymmetric capping portion 140AS of the insulating capping line 140 may have a portion, which overlaps, in the vertical direction (e.g., the Z direction), the fin-type active region FA with the source/drain region SD between the portion and the fin-type active region FA. The second segment S2 of a source/drain contact pattern CAP adjacent to an opposite side wall of the gate line GL may have a portion, which overlaps, in the vertical direction (e.g., the Z direction), the fin-type active region FA with the source/drain region SD between the portion and the fin-type active region FA.

In example embodiments, the asymmetric capping portion 140AS of the insulating capping line 140 may include a portion, which overlaps, in the vertical direction (e.g., the Z direction), the isolation film 112 between two adjacent fin-type active regions FA.

The integrated circuit device 100 may include a buried insulating film 170, which covers or overlaps the top surface of the second segment of each of a plurality of source/drain contact patterns CAP and the top surface of the insulating capping line 140, and an insulating structure 180 covering or overlapping the top surface of the buried insulating film 170. The buried insulating film 170 may be in contact with the top surface of each of a plurality of second segments S2 and the top surface of each of a plurality of insulating capping lines 140. The insulating structure 180 may include an etch stop film 182 and an interlayer insulating film 184, which are sequentially stacked on the buried insulating film 170 and the source/drain contact patterns CAP. The buried insulating film 170 may have a planarized top surface. The buried insulating film 170 may include a portion filling a space above the second segment S2 of each of the source/drain contact patterns CAP among a plurality of gate lines GL. The bottommost surface of the buried insulating film 170 may be in contact with the second segment S2 of each of the source/drain contact patterns CAP. The topmost surface of the buried insulating film 170 may be in contact with the bottom surface of the etch stop film 182.

The buried insulating film 170 may include a silicon oxide film, SiOC, SiOCN, SiON, SiCN, SiN, or a combination thereof but is not limited thereto. The etch stop film 182 may include silicon carbide (SiC), SiN, nitrogen-doped silicon carbide (SiC:N), SiOC, AN, AlON, AlO, AlDC, or a combination thereof. The interlayer insulating film 184 may include an oxide film, a nitride film, an ultra low-k (ULK)

film having an ultra low dielectric constant K of about 2.2 to about 2.4, or a combination thereof. For example, the interlayer insulating film 184 may include a tetraethylorthosilicate (TEOS) film, a high density plasma (HDP) film, a boro-phospho-silicate glass (BPSG) film, a flowable chemical vapor deposition (FCVD) oxide film, a SiON film, a SiN film, a SiOC film, a SiCOH film, or a combination thereof.

A plurality of via contacts CAV may be respectively formed on the source/drain contact patterns CAP. Each of the via contacts CAV may pass through the insulating structure 180 and be in contact with the top surface of the first segment S1 of a source/drain contact pattern CAP. Each of the via contacts CAV may be separated from the buried insulating film 170 and may be at a level higher than the buried insulating film 170.

A plurality of gate contacts CB may be respectively formed on the gate lines GL. Each of the gate contacts CB may pass through the insulating structure 180, the buried insulating film 170, and the insulating capping line 140 and may be connected to the top surface of a gate line GL. A portion of the insulating capping line 140, through which each gate contact CB passes, may be relatively thinner in the insulating capping line 140. The portion of the insulating capping line 140, through which the gate contact CB passes, may have a thickness that is less than the first thickness TH1 of a portion of the insulating capping line 140 between two adjacent first segments S1. The portion of the insulating capping line 140, through which the gate contact CB passes, may have a thickness that is less than a maximum thickness of a portion of the asymmetric capping portion 140AS covering the gate line GL. In example embodiments, each of the gate contacts CB may pass through a portion of the insulating capping line 140, which has a thickness equal or similar to the second thickness TH2 that is relatively thin, and may be in contact with the top surface of the gate line GL.

Each of the via contacts CAV and the gate contacts CB may include a buried metal film and a conductive barrier film surrounding the buried metal film. The buried metal film may include Co, Cu, W, Ru, Mn, or a combination thereof, and the conductive barrier film may include Ti, Ta, TiN, TaN, or a combination thereof. Side walls of each of the via contacts CAV and the gate contacts CB may be covered with or overlapped by an insulating liner (not shown). The insulating liner may include a silicon nitride film but is not limited thereto.

In the logic cell LC, a ground line VSS may be connected to fin-type active regions FA in the first device region RX1 through some of the source/drain contact patterns CAP, and a power supply line VDD may be connected to fin-type active regions FA in the second device region RX2 through others of the source/drain contact patterns CAP. The ground line VSS and the power supply line VDD may be formed at a level higher than the top surface of each of the source/drain contact patterns CAP and the gate contacts CB. Each of the ground line VSS and the power supply line VDD may include a conductive barrier film and a wiring conductive layer. The conductive barrier film may include Ti, Ta, TiN, TaN, or a combination thereof. The wiring conductive layer may include Co, Cu, W, an alloy thereof, or a combination thereof.

In the integrated circuit device 100 shown in FIGS. 1 through 3, a gate contact CB connected to a gate line GL may not be arranged in the device isolation region DTA but only in either the first device region RX1 or the second device region RX2. Accordingly, an area occupied by the device isolation region DTA in the logic cell LC may be reduced to contribute to the decrease in size of the logic cell LC.

In the integrated circuit device 100 shown in FIGS. 1 through 3, a plurality of gate contacts CB may have a structure passing through a portion of the insulating capping line 140, which is relatively thin. Accordingly, when a gate contact hole CBH for a gate contact CB is formed to pass through the insulating structure 180, the buried insulating film 170, and the insulating capping line 140, the portion of the insulating capping line 140, which is relatively thin, is etched, and accordingly, an etch target thickness of the insulating capping line 140 may be reduced during an etching process of forming the gate contact hole CBH, thereby increasing a process margin.

In addition, when the buried insulating film 170 is formed in the integrated circuit device 100 shown in FIGS. 1 through 3, a space above the second segment S2 and adjacent to the first segment S1 of a source/drain contact pattern CAP may be filled with the buried insulating film 170 without problems caused by a void or poor filling because the asymmetric capping portion 140AS of the insulating capping line 140 between the first segment S1 and the second segment S2 has a variable thickness, which decreases toward the second segment S2 in the first horizontal direction (e.g., the X direction). The top surface of the second segment S2 is at a relatively lower level than the insulating capping line 140, with respect to the substrate 110. Accordingly, manufacturing processes of the integrated circuit device 100 may be simplified, and a structure preventing failure such as an unintended short-circuit between adjacent conductive regions may be provided.

Figure 4A:
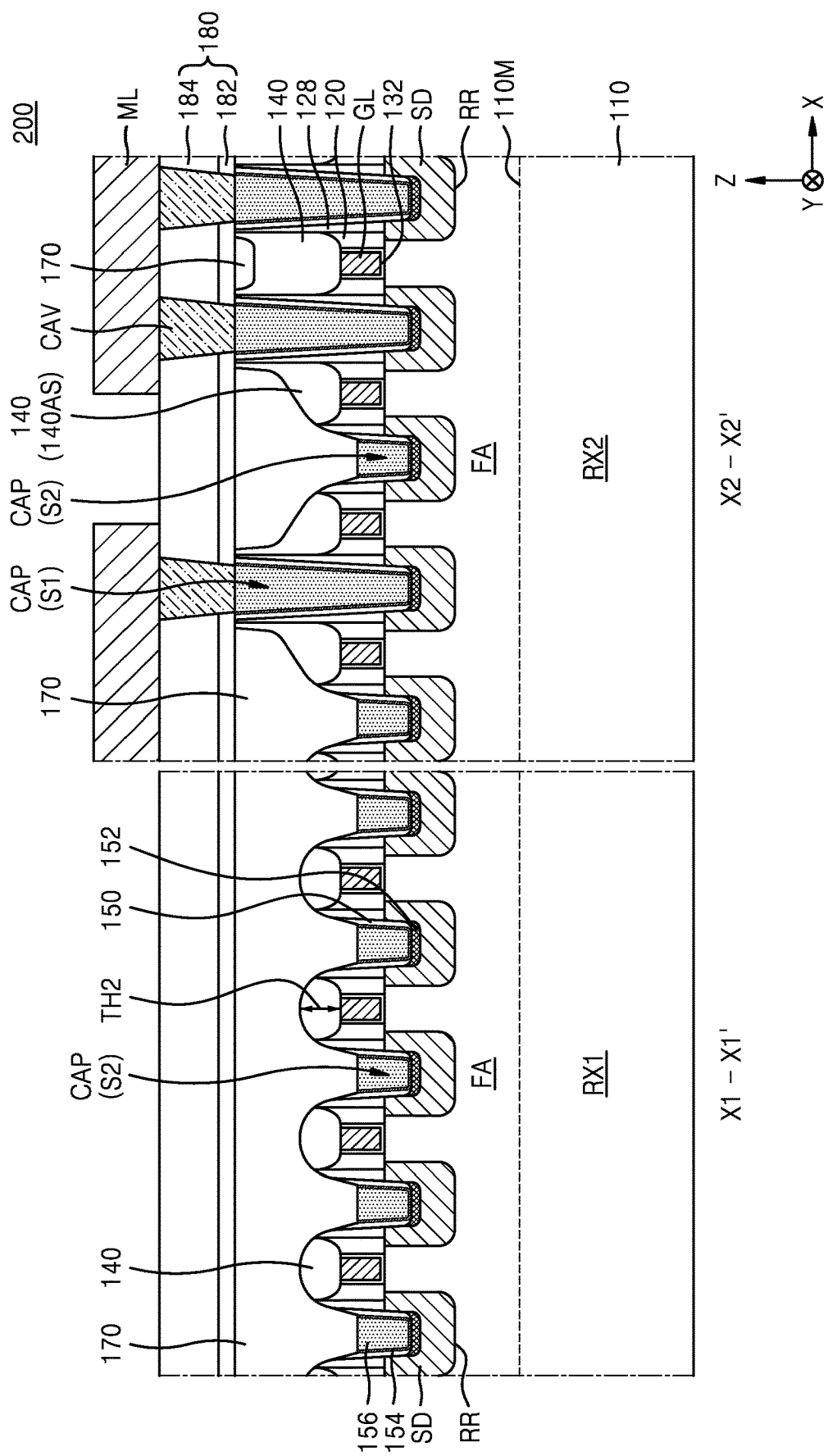
Figure 4B:
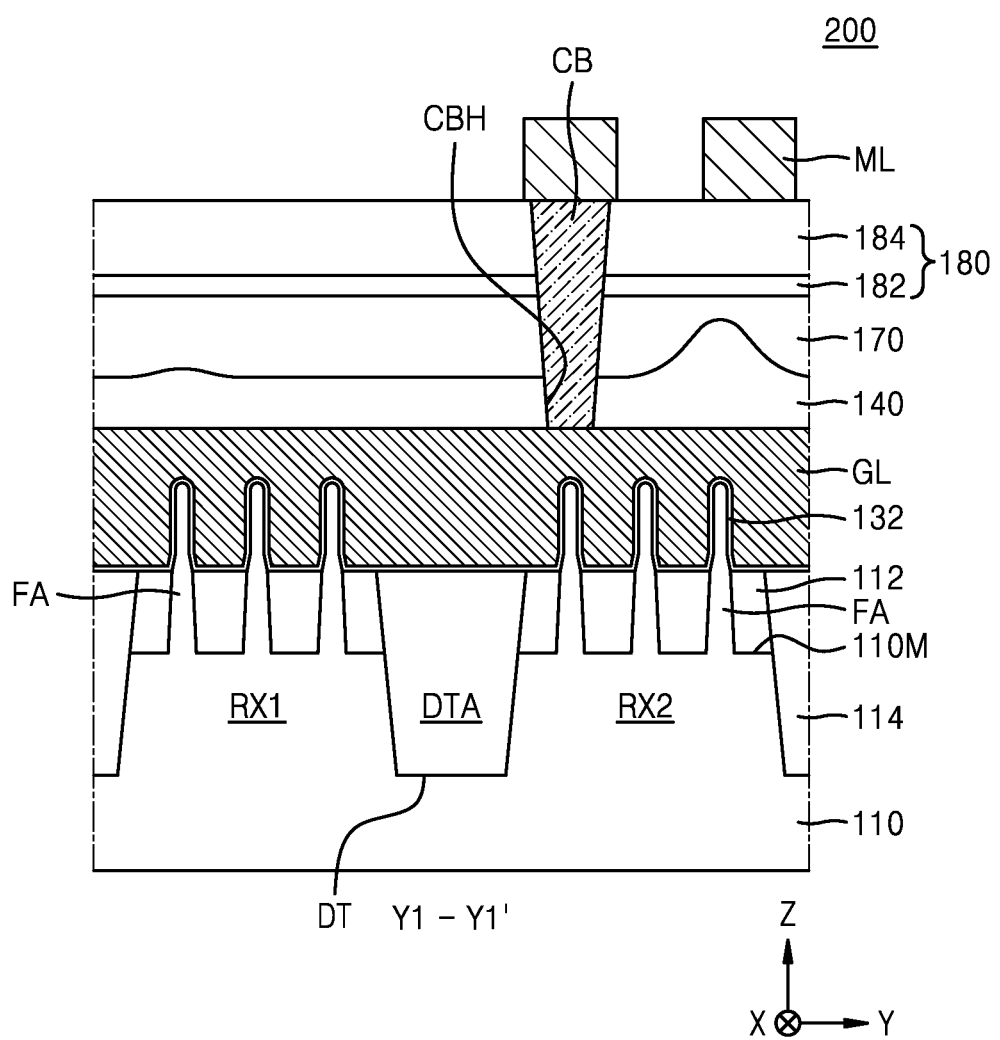
Figure 4C:
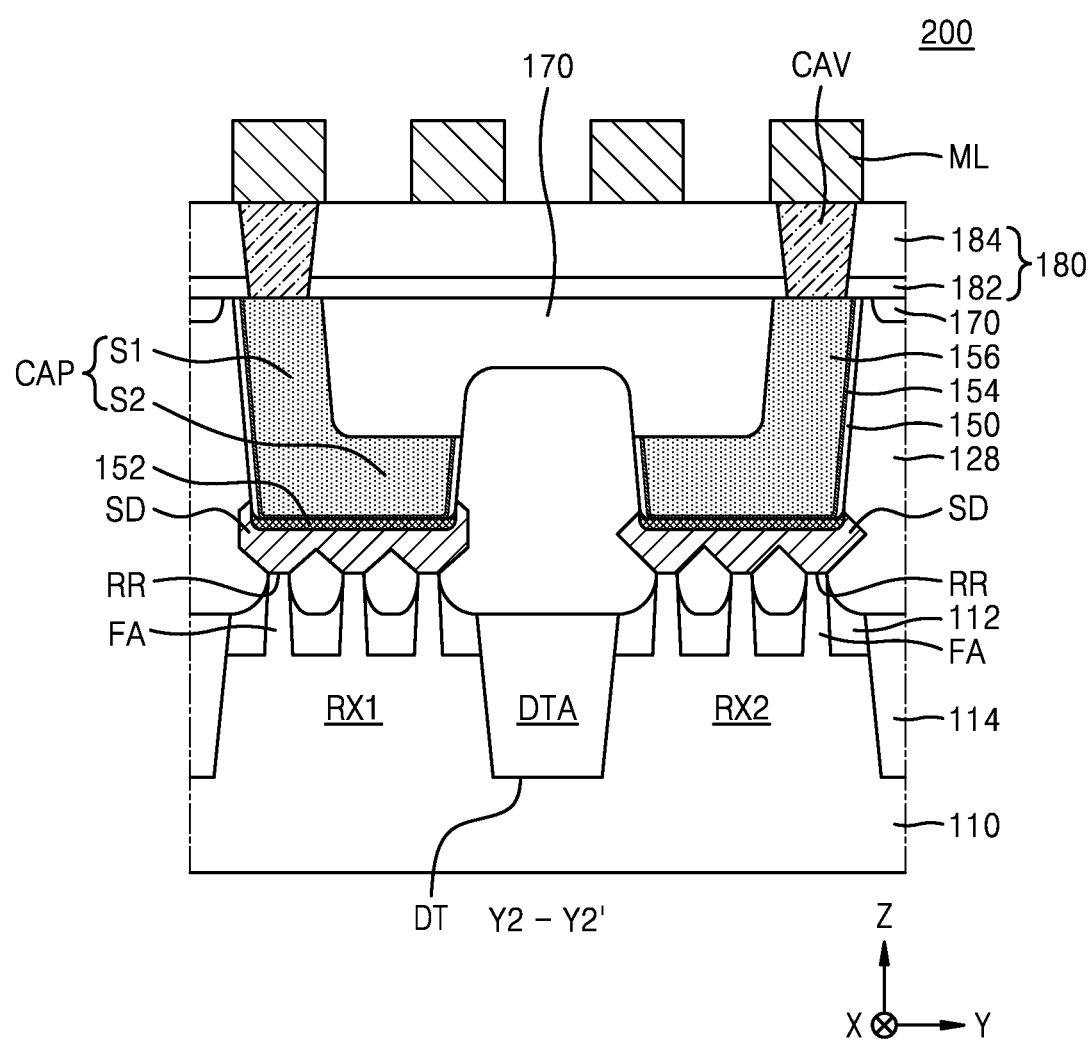

FIGS. 4A through 4C are cross-sectional views of an integrated circuit device 200 according to embodiments, wherein FIG. 4A shows a partial configuration of a region corresponding to the cross-section of the integrated circuit device 200 taken along line X1-X1' in FIG. 1 and a partial configuration of a region corresponding to the cross-section of the integrated circuit device 200 taken along line X2-X2' in FIG. 1, FIG. 4B shows a partial configuration of a region corresponding to the cross-section of the integrated circuit device 200 taken along line Y1-Y1' in FIG. 1, and FIG. 4C shows a partial configuration of a region corresponding to the cross-section of the integrated circuit device 200 taken along line Y2-Y2' in FIG. 1.

Referring to FIGS. 4A through 4C, the integrated circuit device 200 may substantially have the same configuration as the integrated circuit device 100 described with reference to FIGS. 1 through 3. However, the integrated circuit device 200 includes a plurality of conductive lines ML, which extend on the via contacts CAV in a direction crossing a plurality of gate lines GL.

As illustrated in FIGS. 4A and 4C, some of the conductive lines ML may each be connected to a source/drain region SD through a via contact CAV and a source/drain contact pattern CAP. As illustrated in FIG. 4B, others of the conductive lines ML may each be connected to a gate line GL through a gate contact CB.

The conductive lines ML may be formed at the same level as the ground line VSS and the power supply line VDD on the substrate 110. The conductive lines ML may include a plurality of unidirectional wiring layers extending in the first horizontal direction (e.g., the X direction) to be parallel with each other. Each of the conductive lines ML may include a conductive barrier film and a wiring conductive layer. The conductive barrier film may include Ti, Ta, TiN, TaN, or a combination thereof. The wiring conductive layer may include Co, Cu, W, an alloy thereof, or a combination thereof.

Figure 5:
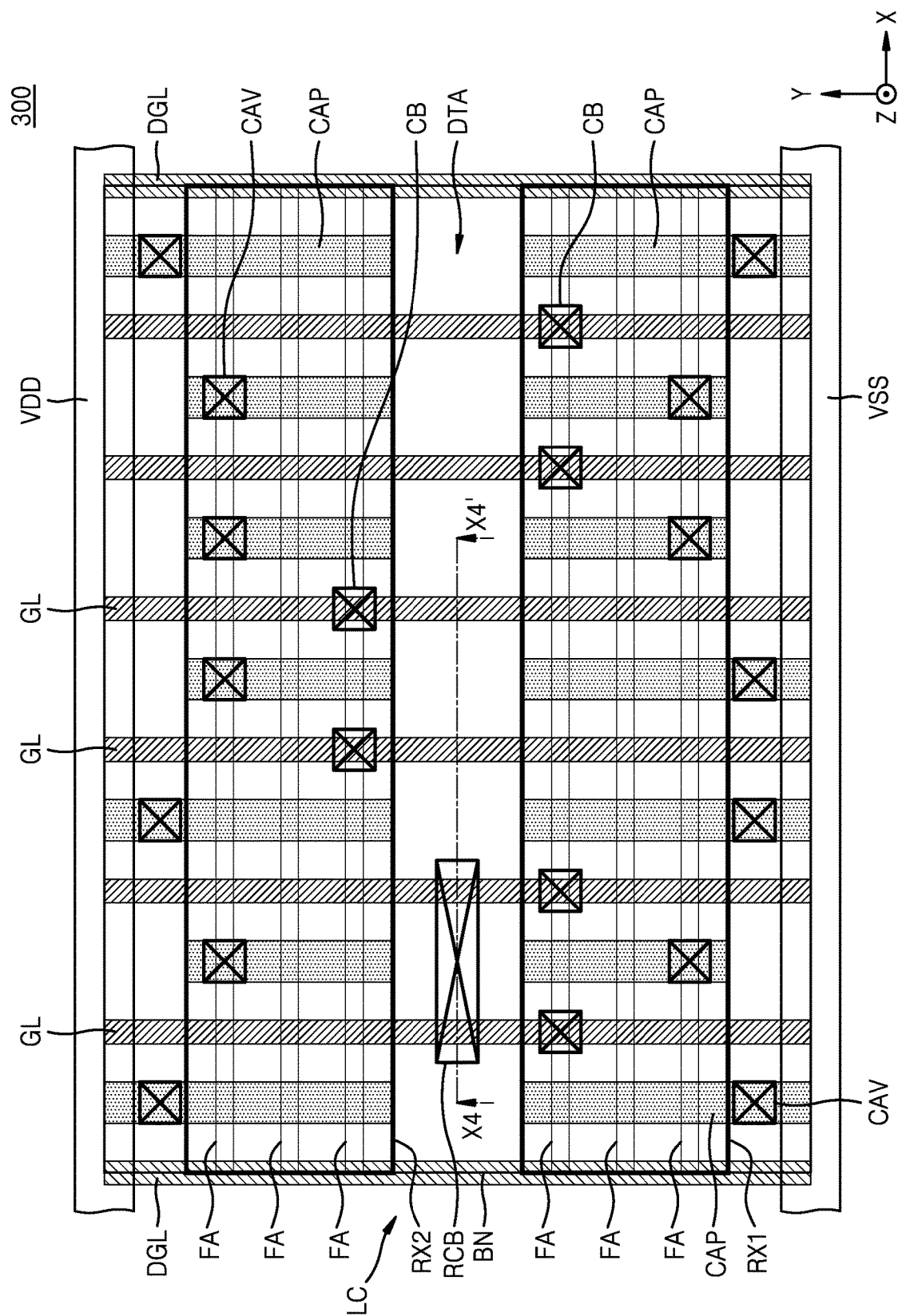
FIG. 5 is a plane layout diagram of an integrated circuit device according to some embodiments.
Figure 6:
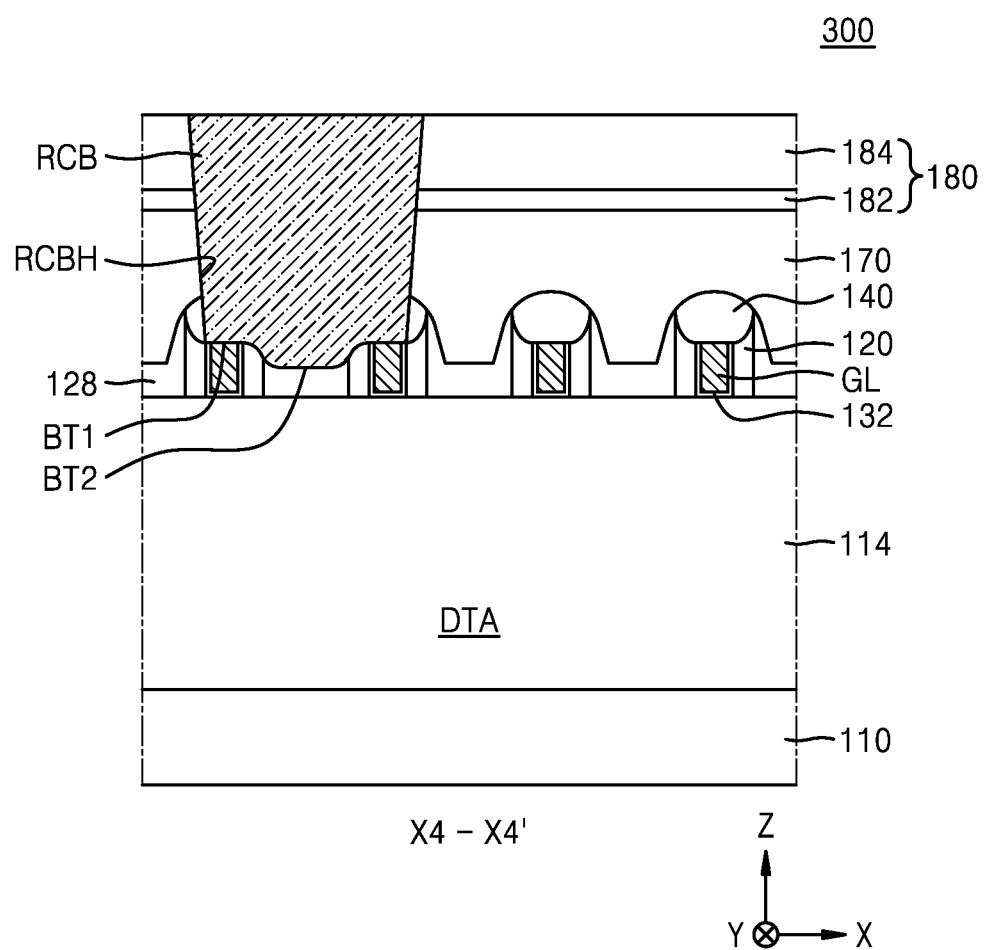
FIG. 6 is a cross-sectional view showing a partial configuration of a cross-section taken along line X4-X4' in FIG. 5.

FIG. 5 is a plane layout diagram of an integrated circuit device 300 according to embodiments. FIG. 6 is a cross-sectional view showing a partial configuration of a cross-section taken along line X4-X4' in FIG. 5.

Referring to FIGS. 5 and 6, the integrated circuit device 300 may substantially have the same configuration as the integrated circuit device 100 described with reference to FIGS. 1 through 3. However, the integrated circuit device 300 may further include a multi-gate contact RCB in the device isolation region DTA. The multi-gate contact RCB is connected in common to a plurality of gate lines GL.

The multi-gate contact RCB may be above the gate lines GL to extend long in a direction, e.g., the first horizontal direction (e.g., the X direction), crossing the gate lines GL. The multi-gate contact RCB may vertically overlap the gate lines GL and the isolation insulating film 114 in the device isolation region DTA.

The multi-gate contact RCB may be formed in a multi-gate contact hole RCBH passing through the insulating structure 180, the buried insulating film 170, and the insulating capping line 140. The multi-gate contact RCB may be in contact with the top surface of each of the gate lines GL in the multi-gate contact hole RCBH. The bottom surface of the multi-gate contact RCB may include a first bottom surface portion BT1, which is in contact with the top surface of each of the gate lines GL, and a second bottom surface portion BT2, which is in contact with the intergate insulating film 128 between the gate lines GL.

In example embodiments, the second bottom surface portion BT2 of the multi-gate contact RCB may be closer to the substrate 110 than the first bottom surface portion BT1 illustrated in FIG. 6. In example embodiments, a vertical level of the first bottom surface portion BT1 of the multi-gate contact RCB may be substantially the same as or similar to a vertical level of the second bottom surface portion BT2 thereof. Although the second bottom surface portion BT2 of the multi-gate contact RCB is in contact with the intergate insulating film 128 in FIG. 6, embodiments are not limited thereto. For example, the multi-gate contact hole RCBH may pass through the insulating structure 180, the buried insulating film 170, the insulating capping line 140, and the intergate insulating film 128 and extend toward the substrate 110 to a level lower than the bottommost surface of the gate lines GL or lower than the topmost surface of the isolation insulating film 114. In this case, a vertical level of the bottommost surface of the multi-gate contact RCB may be lower than the bottommost surface of the gate lines GL or lower than the topmost surface of the isolation insulating film 114.

In the integrated circuit device 300, the multi-gate contact RCB may be formed passing through a portion of the insulating capping line 140, which is relatively thin, in the device isolation region DTA. Accordingly, when the multi-gate contact hole RCBH is formed to form the multi-gate contact RCB, an etch target thickness of the insulating capping line 140 may be reduced.

As a comparative example, in the case where the etch target thickness of the insulating capping line 140 is too great, while the insulating capping line 140 is being etched to form the multi-gate contact hole RCBH, other adjacent insulating films, e.g., the isolation insulating film 114, exposed to an etching atmosphere together with the insulating capping line 140 may be excessively etched such that the multi-gate contact hole RCBH may extend too far inside the isolation insulating film 114. In this case, an excessively etched portion of the isolation insulating film 114 may need to be filled with another insulating film, and so on, thereby complicating a process of forming the multi-gate contact RCB According to embodiments, because the multi-gate contact RCB is formed by passing through a portion of the insulating capping line 140, which is relatively thin, in the device isolation region DTA, the etch target thickness of the insulating capping line 140 is reduced during the formation of the multi-gate contact hole RCBH, thereby preventing the isolation insulating film 114 from being excessively etched and preventing the multi-gate contact hole RCBH from being formed to a level too deep. Accordingly, problems, such as a complicated process for forming the multi-gate contact RCB, failure occurring during the formation of the multi-gate contact RCB, and a resultant structure in which electrical characteristics are degraded, may be prevented.

Figure 7:
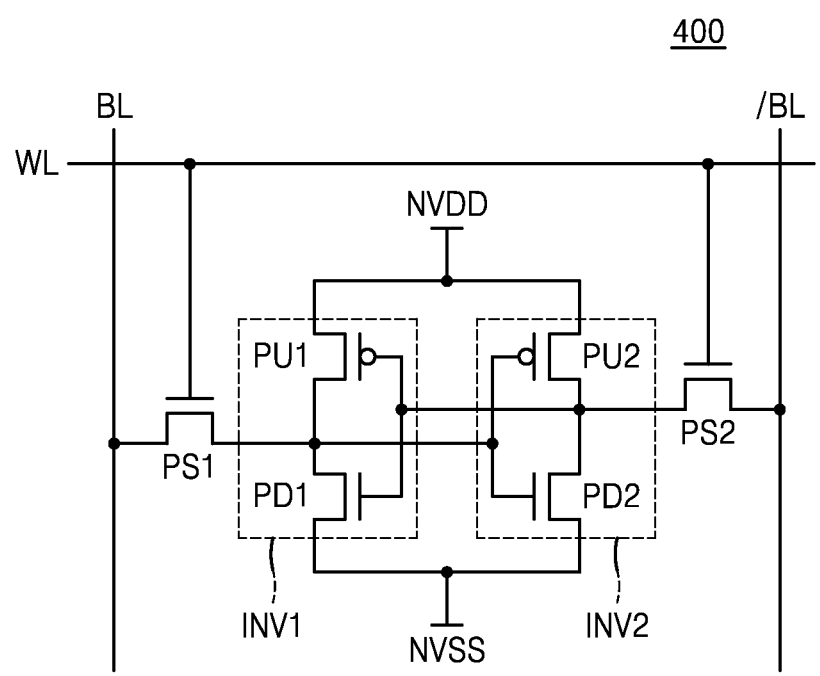
FIG. 7 is a circuit diagram of an integrated circuit device according to some embodiments.

FIG. 7 is a circuit diagram of an integrated circuit device 400 according to embodiments. FIG. 7 illustrates a 6-transistor static random access memory (6T SRAM) cell including six transistors.

Referring to FIG. 7, the integrated circuit device 400 may include a pair of inverters, e.g., a first inverter INV1 and a second inverter INV2, which are connected in parallel between a power supply node NVDD and a ground node NVSS; a first pass transistor PS1 connected to an output node of the first inverter INV1; and a second pass transistor PS2 connected to an output node of the second inverter INV2. The first pass transistor PS1 and the second pass transistor PS2 may be respectively connected to a bit line BL and a complementary bit line/BL. A gate of the first pass transistor PS1 and a gate of the second pass transistor PS2 may be connected to a word line WL.

The first inverter INV1 includes a first pull-up transistor PU1 and a first pull-down transistor PD1, which are connected in series to each other, and the second inverter INV2 includes a second pull-up transistor PU2 and a second pull-down transistor PD2, which are connected in series to each other. The first pull-up transistor PU1 and the second pull-up transistor PU2 may include a PMOS transistor, and the first pull-down transistor PD1 and the second pull-down transistor PD2 may include an NMOS transistor.

To form a single latch circuit with the first inverter INV1 and the second inverter INV2, an input node of the first inverter INV1 is connected to the output node of the second inverter INV2 and an input node of the second inverter INV2 is connected to the output node of the first inverter INV1.

Figure 8:
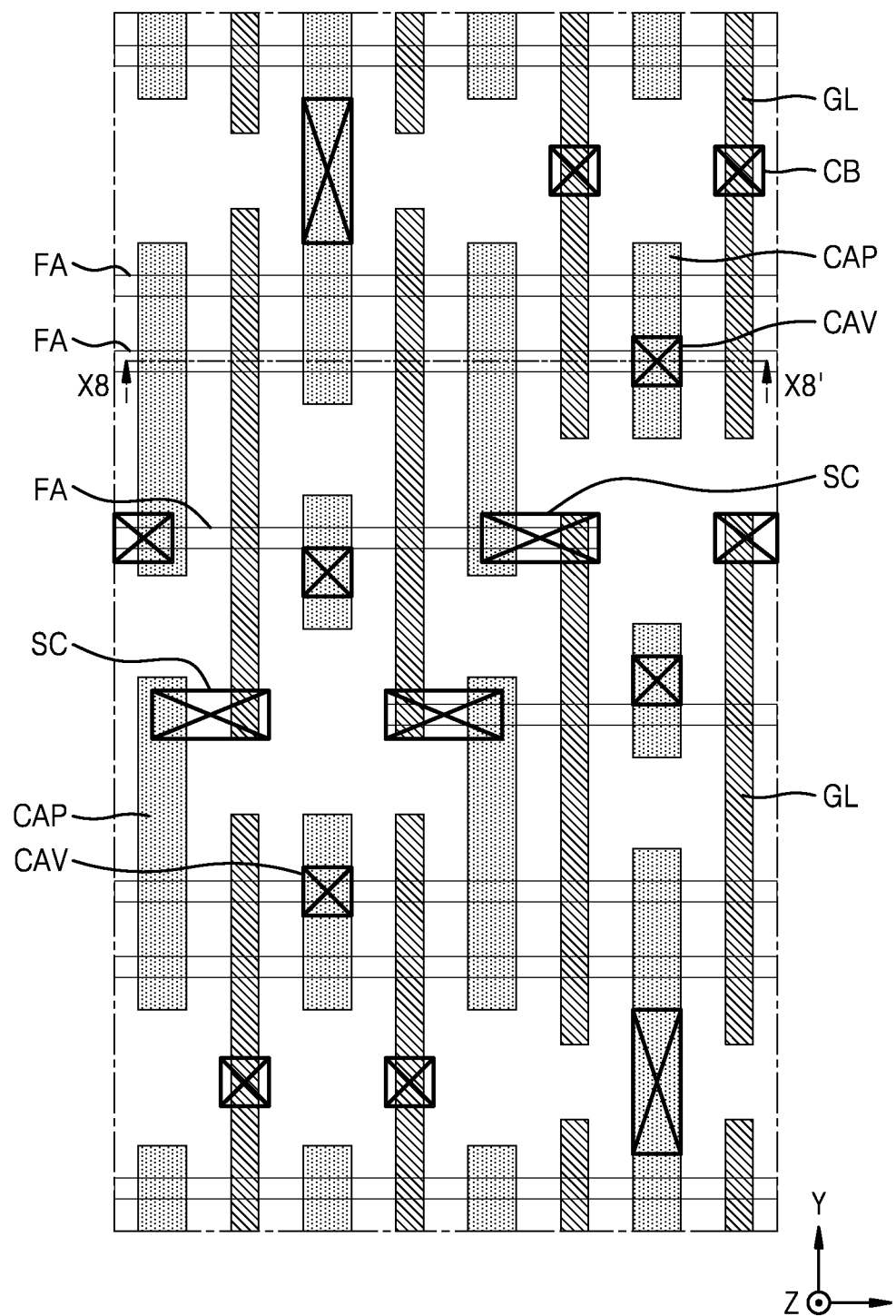
FIG. 8 is a plane layout diagram of the integrated circuit device of FIG. 7.
Figure 9:
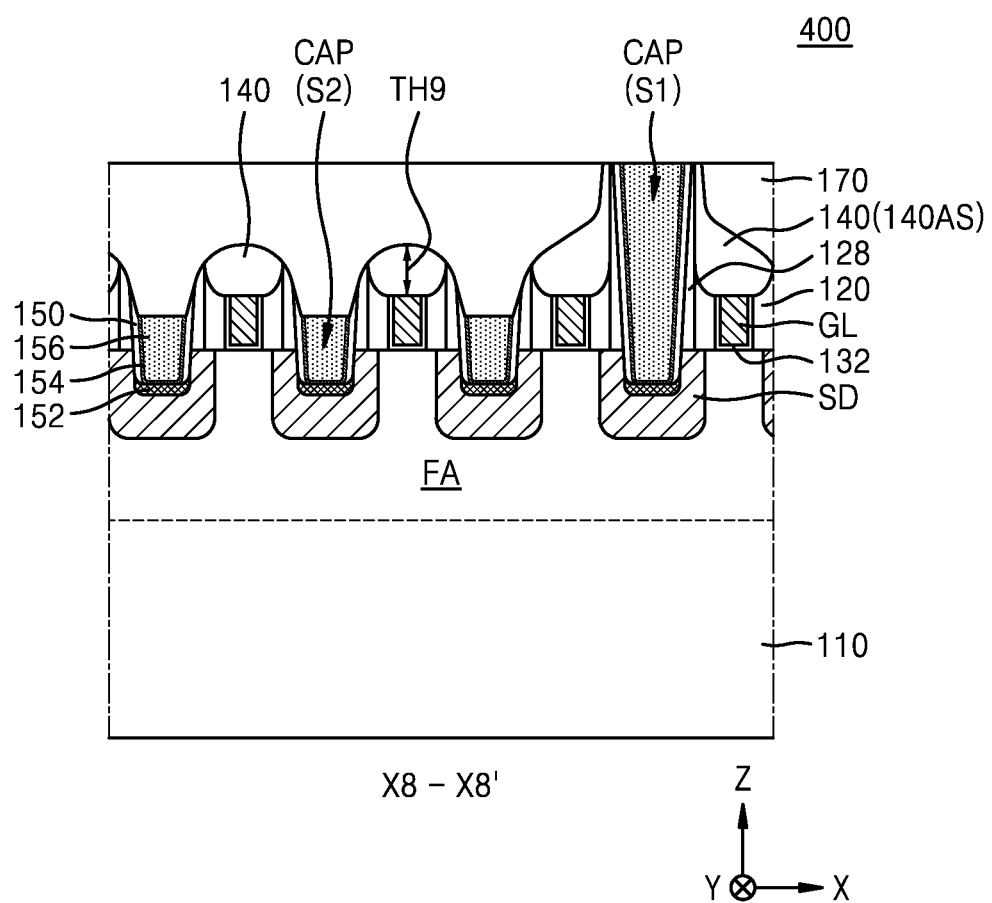
FIG. 9 is a cross-sectional view taken along line X8-X8' in FIG. 8.

FIG. 8 is a plane layout diagram for describing the integrated circuit device 400 of FIG. 7 in detail. FIG. 9 is a cross-sectional view taken along line X8-X8' in FIG. 8. In FIGS. 1 through 2C and FIGS. 8 and 9, reference characters denote like elements, and redundant descriptions thereof will be omitted. The integrated circuit device 400 illustrated in FIGS. 7 and 8 may include an SRAM array including a plurality of SRAM cells arranged in a matrix on the substrate 110. The SRAM cells may have the circuit configuration illustrated in FIG. 7.

Referring to FIGS. 8 and 9, the integrated circuit device 400 includes a plurality of fin-type active regions FA, which extend in the first horizontal direction (e.g., the X direction) to be parallel with each other, and a plurality of gate lines GL, which extend on the fin-type active regions FA in the second horizontal direction (e.g., the Y direction) to be parallel with each other.

Transistors may be respectively formed at intersections between the fin-type active regions FA and the gate lines GL.

Each of a plurality of SRAM cells included in the integrated circuit device 400 may include the first pull-up transistor PU1, the first pull-down transistor PD1, the first pass transistor PS1, the second pull-up transistor PU2, the second pull-down transistor PD2, and the second pass transistor PS2, which are illustrated in FIG. 7. The first pull-up transistor PU1 and the second pull-up transistor PU2 may include a PMOS transistor, and the first pull-down transistor PD1, the second pull-down transistor PD2, the first pass transistor PS1, and the second pass transistor PS2 may include an NMOS transistor. The integrated circuit device 400 may include a plurality of shared contacts SC each being connected to a gate line GL and a source/drain region SD.

As shown in FIG. 9, in the integrated circuit device 400, at least some of a plurality of insulating capping lines 140 may include the asymmetric capping portion 140AS between the first segment S1 of one source/drain contact pattern CAP and the second segment S2 of another source/drain contact pattern CAP in the first horizontal direction (e.g., the X direction). The asymmetric capping portion 140AS may have a variable thickness in the first horizontal direction (e.g., the X direction). Two adjacent source/drain contact patterns CAP with the asymmetric capping portion 140AS of an insulating capping line 140 therebetween may be arranged to have different heights in the vertical direction (e.g., the Z direction) at positions facing each other with the asymmetric capping portion 140AS therebetween. The asymmetric capping portion 140AS of a plurality of insulating capping lines 140 may be thicker toward the first segment Si closest thereto in the first horizontal direction (e.g., the X direction). The asymmetric capping portion 140AS of the insulating capping lines 140 may be thinner toward the second segment S2 closest thereto in the first horizontal direction (e.g., the X direction). A portion of the insulating capping lines 140, which is between two adjacent second segments S2, may cover a gate line GL to a thickness TH9, which is relatively thin in the vertical direction (e.g., the Z direction).

The integrated circuit device 400 illustrated in FIGS. 8 and 9 includes the insulating capping lines 140 having different thicknesses at different positions, thereby providing the same effects as described above with reference to FIGS. 1 through 2C.

Figure 10A:
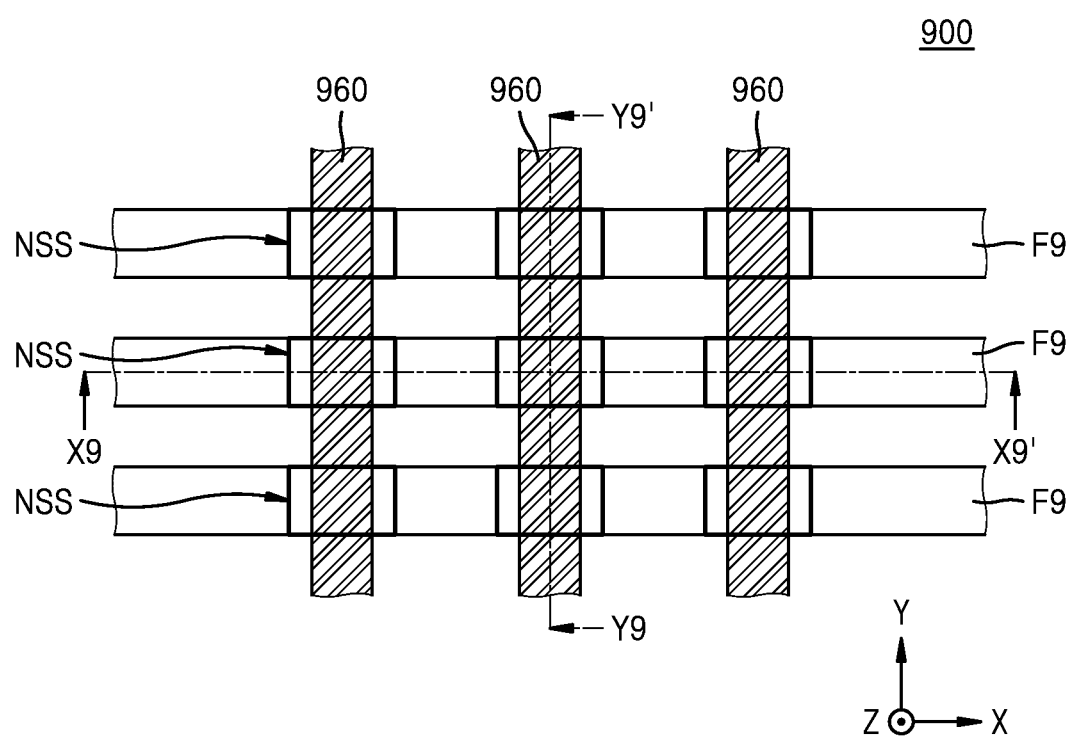
FIG. 10A is a plane layout diagram of a partial configuration of an integrated circuit device according to some embodiments.
Figure 10B:
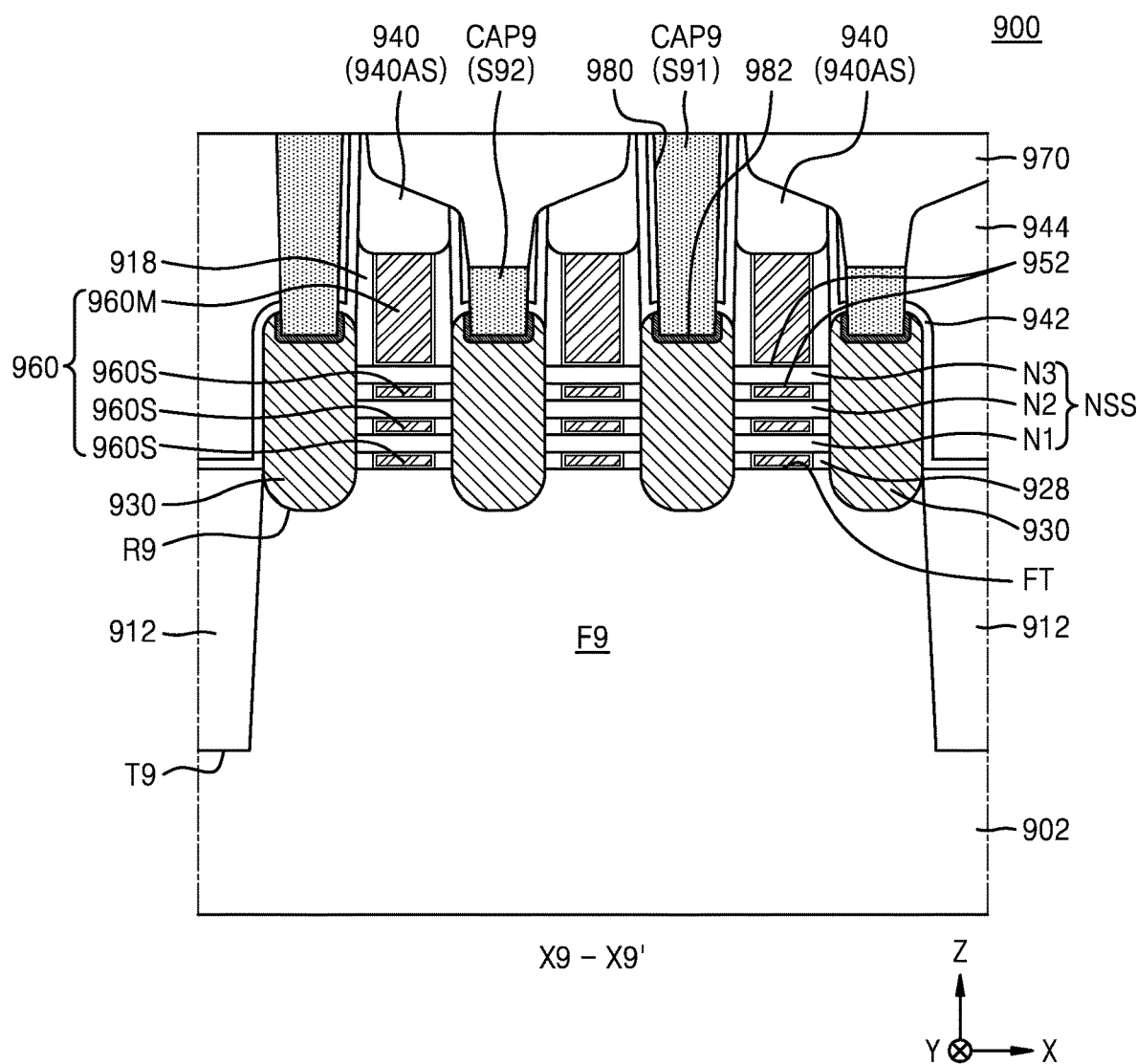
FIG. 10B is a cross-sectional view taken along line X9-X9' in FIG. 10A.
Figure 10C:
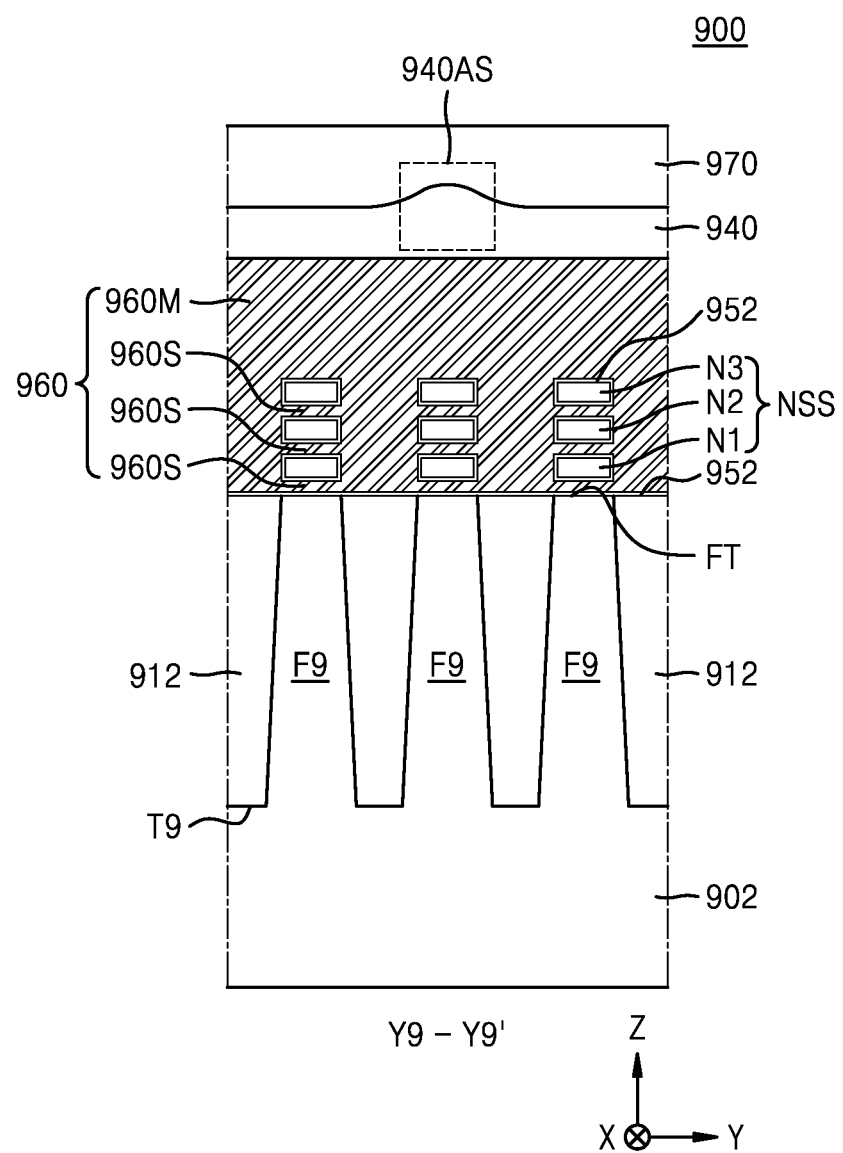
FIG. 10C is a cross-sectional view taken along line Y9-Y9' in FIG. 10A.

FIG. 10A is a plane layout diagram of a partial configuration of an integrated circuit device 900 according to embodiments, FIG. 10B is a cross-sectional view taken along line X9-X9' in FIG. 10A, and FIG. 10C is a cross-sectional view taken along line Y9-Y9' in FIG. 10A.

Referring to FIGS. 10A through 10C, the integrated circuit device 900 includes a plurality of fin-type active regions F9, which protrude from a substrate 902 and extend long in the first horizontal direction (e.g., the X direction), and a plurality of nanosheet stacks NSS, each of which is separated from a fin-type active region F9 upward in the vertical direction (e.g., the Z direction) and faces a top surface FT of the fin-type active region F9. In this specification, the term "nanosheet" refers to a conductive structure having a cross-section substantially perpendicular to a direction in which current flows. It will be understood that the nanosheet includes a nanowire.

A trench T9 defining a plurality of fin-type active regions F9 may be formed in the substrate 902 and filled with an isolation film 912. The substrate 902, the fin-type active regions F9, and the isolation film 912 may have the same configurations as the substrate 110, the fin-type active regions FA, and the isolation film 112, which are illustrated in FIGS. 2A through 2C.

A plurality of gate lines 960 extend on the fin-type active regions F9 in the second horizontal direction (e.g., the Y direction). Each of the nanosheet stacks NSS may be above the top surface FT of one of the fin-type active regions F9 at an intersection between one of the fin-type active regions F9 and one of the gate lines 960 and may face the top surface FT of one of the fin-type active regions F9 at a position separated from one of the fin-type active regions F9. A plurality of nanosheet transistors may be formed at intersections between the fin-type active regions F9 and the gate lines 960.

Each of the nanosheet stacks NSS may include a plurality of nanosheets, which overlap each other in the vertical direction (e.g., the Z direction) above the top surface FT of one of the fin-type active regions F9. The nanosheets may include a first nanosheet N1, a second nanosheet N2, and a third nanosheet N3, which respectively have different vertical distances from the top surface FT of each of the fin-type active regions F9.

Although the nanosheet stacks NSS substantially have a rectangular plan shape in FIG. 10A, embodiments are not limited thereto. The nanosheet stacks NSS may have various plan shapes according to plan shapes of the fin-type active regions F9 and the gate lines 960. The present embodiment illustrates the configuration, in which a plurality of nanosheet stacks NSS and a plurality of gate lines 960 are formed on one fin-type active region F9 and the nanosheet stacks NSS are arranged on the fin-type active region F9 in a line in the first horizontal direction (e.g., the X direction). However, according to some embodiments, the number of nanosheet stacks NSS on one fin-type active region F9 is not particularly limited. For example, one nanosheet stack NSS may be formed on one fin-type active region F9. Although the present embodiment illustrates the case where each of the nanosheet stacks NSS includes three nanosheets, embodiments are not limited thereto. For example, each of the nanosheet stacks NSS may include at least two nanosheets, and the number of nanosheets included in each nanosheet stack NSS is not particularly limited.

Each of the first through third nanosheets N1 through N3 may have a channel region. In example embodiments, each of the first through third nanosheets N1 through N3 may include a Si layer, a SiGe layer, or a combination thereof.

A plurality of recess regions R9 may be formed in an upper portion of the fin-type active region F9, and a plurality of source/drain regions 930 may be formed in the recess regions R9. The source/drain regions 930 may include an epitaxially grown semiconductor layer. The detailed configuration of the source/drain regions 930 is substantially the same as that of the source/drain regions SD described above with reference to FIGS. 2A and 2C.

The gate lines 960 may be on the fin-type active regions F9 to cover the nanosheet stacks NSS and surround each of the first through third nanosheets N1 through N3. Each of the gate lines 960 may include a main gate portion 960M, which extends in the second horizontal direction (e.g., the Y direction) to cover or overlap the top surface of a nanosheet stack NSS, and a plurality of sub gate portions 960S, which are integrally or monolithically connected to the main gate portion 960M and respectively arranged between the third nano sheet N3 and the second nanosheet N2, between the second nanosheet N2 and the first nanosheet N1, and between the first nanosheet N1 and a fin-type active region F9. The first through third nanosheets N1 through N3 may have a gate-all-around (GAA) structure surrounded by a gate line 960. The gate line 960 may include a metal, a metal nitride, a metal carbide, or a combination thereof. The metal may be selected from Ti, W, Ru, Nb, Mo, Hf, Ni, Co, Pt, Yb, Tb, Dy, Er, or Pd. The metal nitride may be selected from TiN or TaN. The metal carbide may include TiAlC. A gate insulating film 952 may be between the nanosheet stack NSS and the gate line 960. The gate insulating film 952 may have substantially the same configuration as the gate insulating film 132 described with reference to FIGS. 2A and 2B.

A metal silicide film 982 may be formed on the top surface of each of the source/drain regions 930. The metal silicide film 982 may have substantially the same configuration as the metal silicide film 152 described with reference to FIGS. 2A and 2C. The metal silicide film 982 may be omitted.

Both side walls of each of the gate lines 960 may be covered with a plurality of outer insulating spacers 918. The outer insulating spacers 918 may be on a plurality of nanosheet stacks NSS to cover both side walls of the main gate portion 960M. The outer insulating spacers 918 and the source/drain regions 930 may be covered with an insulating liner 942. The outer insulating spacers 918 and the insulating liner 942 may include SiN, SiCN, SiBN, SiON, SiOCN, SiBCN, SiOC, SiO$_2$, or a combination thereof. The insulating liner 942 may be omitted.

A plurality of inner insulating spacers 928 are between the third nanosheet N3 and the second nanosheet N2, between the second nanosheet N2 and the first nanosheet N1, and between the first nanosheet N1 and the fin-type active region F9. Each of both side walls of each of the sub gate portions 960S may be covered with an inner insulating spacer 928 with the gate insulating film 952 between the side wall and the inner insulating spacer 928. A plurality of inner insulating spacers 928 may be between the sub gate portions 960S and a source/drain region 930. In example embodiments, the outer insulating spacers 918 and the inner insulating spacers 928 may include the same insulating material as each other. In example embodiments, the outer insulating spacers 918 and the inner insulating spacers 928 may include different insulating materials from each other. The inner insulating spacer 928 may include SiN, SiCN, SiBN, SiON, SiOCN, SiBCN, SiOC, SiO$_2$, or a combination thereof. The inner insulating spacer 928 may further include an air gap.

The insulating liner 942 may be covered with or overlapped by an intergate insulating film 944. The intergate insulating film 944 may include a silicon oxide film. A plurality of source/drain contact patterns CAP9 may be in a plurality of contact holes 980, which pass through the intergate insulating film 944 and the insulating liner 942. Each of the source/drain contact patterns CAP9 may be connected to the source/drain region 930 through the metal silicide film 982. The source/drain contact patterns CAP9 may include a metal, a conductive metal nitride, or a combination thereof. The source/drain contact patterns CAP9 may include a first segment S91 and a second segment S92, which have different heights in the vertical direction (e.g., the Z direction) and are integrally connected to each other. The source/drain contact patterns CAP9 may have substantially the same configuration as the source/drain contact patterns CAP described with reference to FIGS. 2A and 2C.

Each of the gate lines 960 may be covered with an insulating capping line 940. The insulating capping line 940 may include an asymmetric capping portion 940AS having a variable thickness in the first horizontal direction (e.g., the X direction). The insulating capping line 940 may have substantially the same configuration as the insulating capping line 140 described with reference to FIGS. 2A and 2B.

A buried insulating film 970 may cover or overlap the top surface of the second segment S92 of each of the source/drain contact patterns CAP9 and the top surface of the insulating capping line 940. The buried insulating film 970 may be in contact with the top surface of the second segment S92 and the top surface of the insulating capping line 940. The buried insulating film 970 may have a planarized top surface. The detailed configuration of the buried insulating film 970 is the same as that of the buried insulating film 170 described with reference to FIGS. 2A through 2C.

The integrated circuit device 900 described with reference to FIGS. 10A through 10C includes a plurality of insulating capping lines 940 each having different thicknesses at different positions, thereby providing the same effects as described above with reference to FIGS. 1 through 2C.

Hereinafter, a method of manufacturing integrated circuit devices, according to embodiments, will be described with specific examples.

Figure 11A:
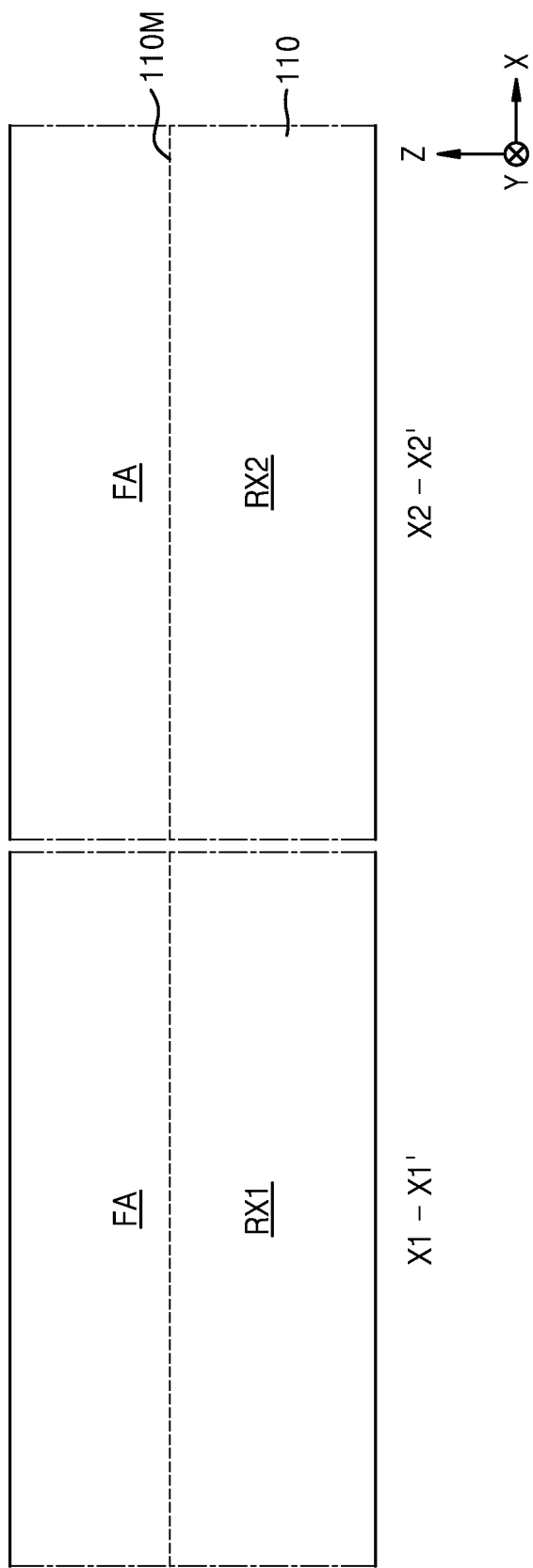
FIGS. 11A through 21C are cross-sectional views of sequential stages in a method of manufacturing an integrated circuit device, according to some embodiments, wherein FIGS. 11A, 12A, . . . , and 21A show portions respectively corresponding to the cross-sections respectively taken along the lines X1-X1' and X2-X2' in FIG. 1, FIGS. 11B, 12B, . . . , and 21B show a portion corresponding to the cross-section taken along the line Y1-Y1' in FIG. 1, and FIGS. 11C, 12C, . . . , and 21C show a portion corresponding to the cross-section taken along the line Y2-Y2' in FIG. 1.
Figure 11B:
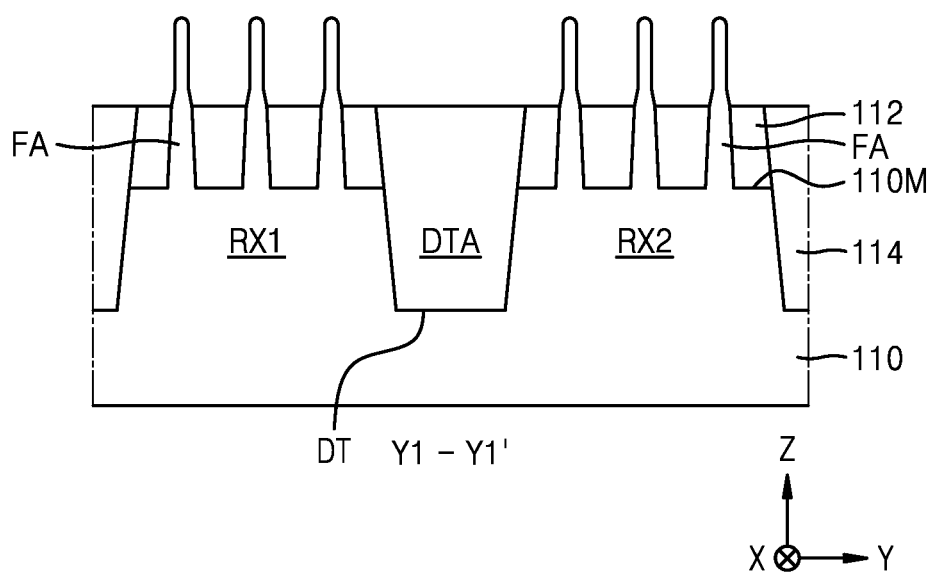
Figure 11C:
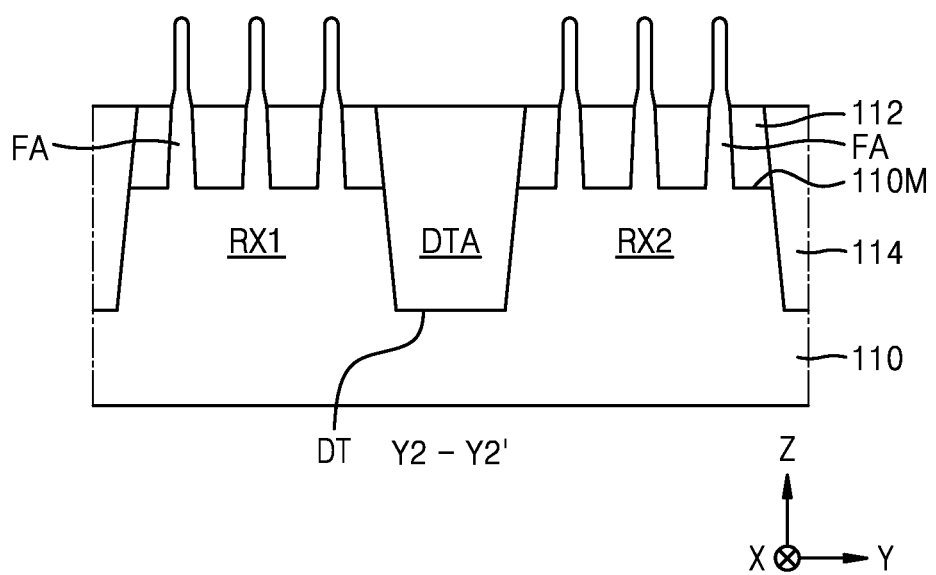
Figure 12A:
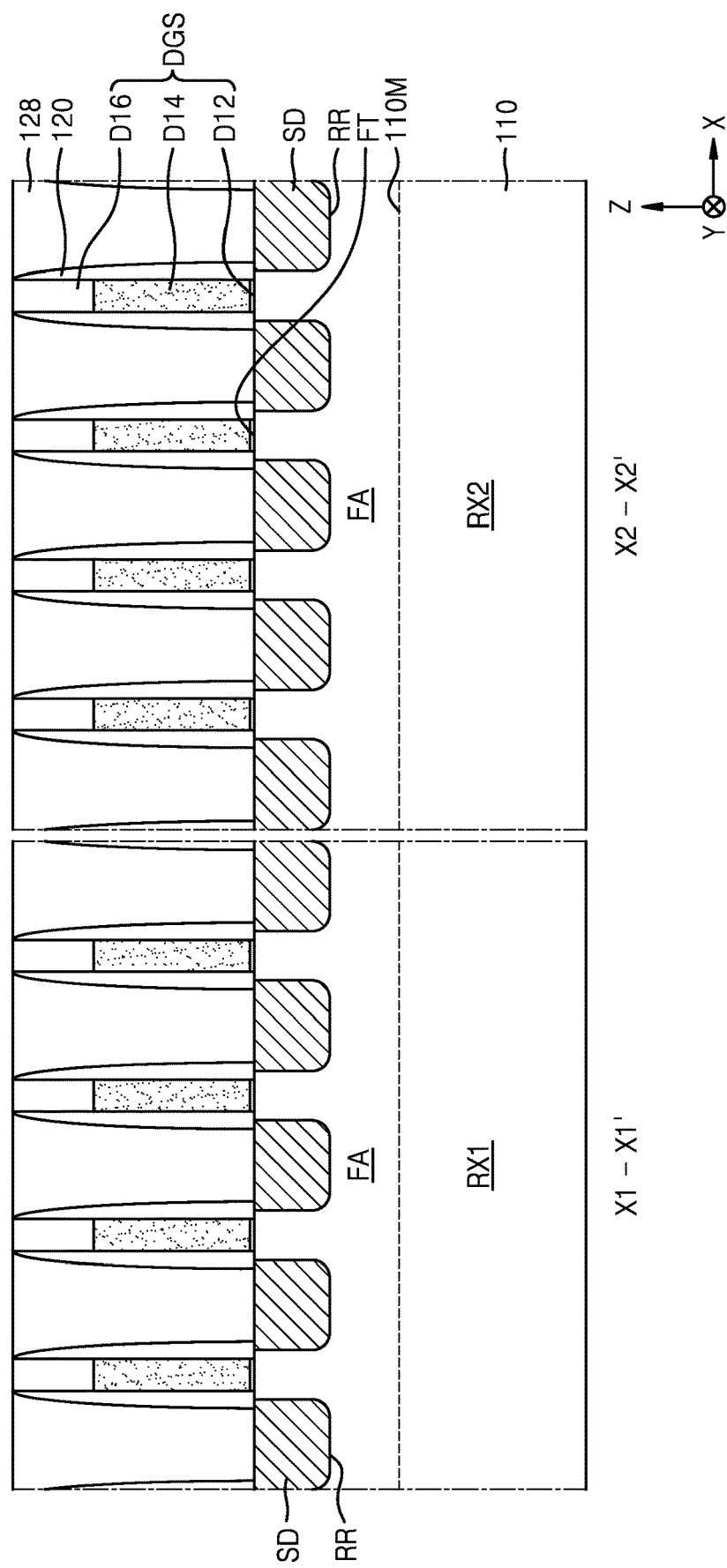
Figure 12B:
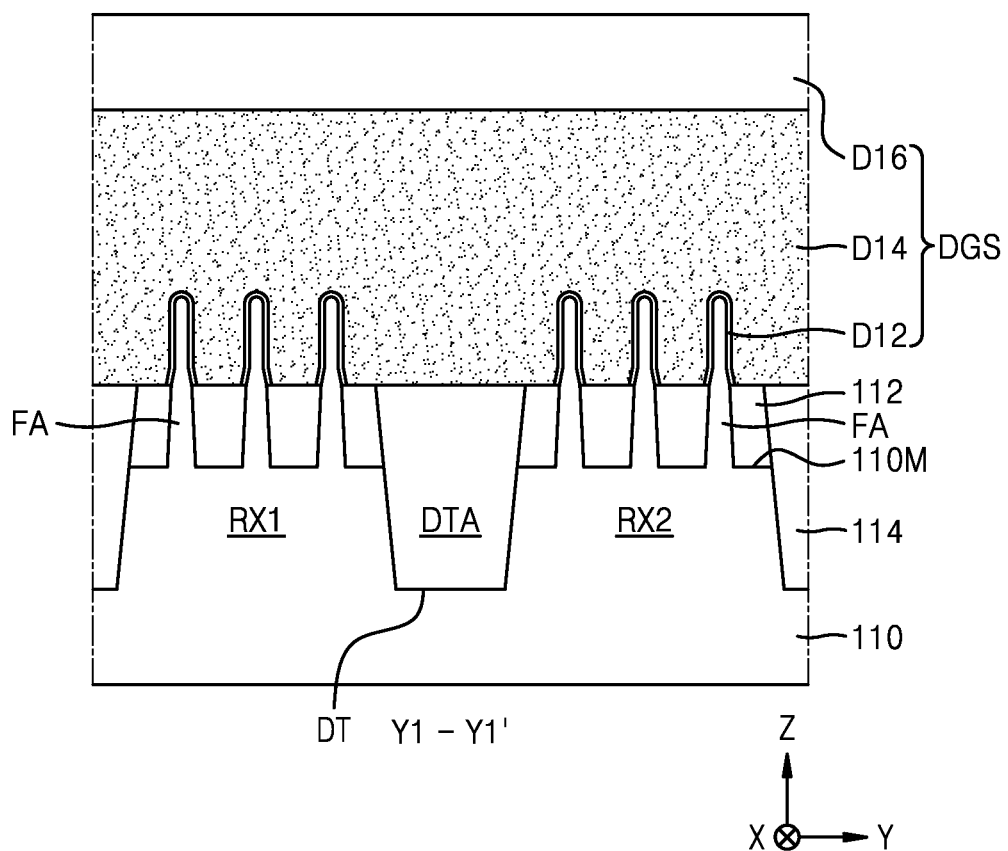
Figure 12C:
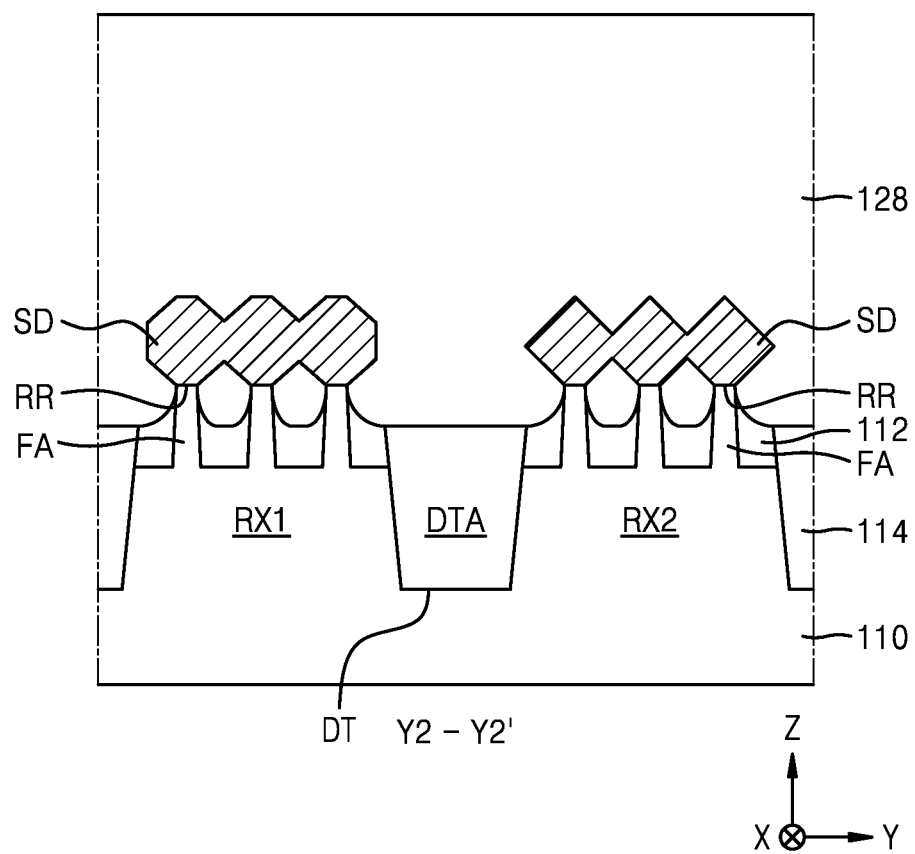

FIGS. 11A through 21C are cross-sectional views of sequential stages in a method of manufacturing an integrated circuit device, according to embodiments, wherein FIGS. 11A, 12A, . . . , and 21A show portions respectively corresponding to the cross-sections respectively taken along the lines X1-X1' and X2-X2' in FIG. 1, FIGS. 11B, 12B, . . . , and 21B show a portion corresponding to the cross-section taken along the line Y1-Y1' in FIG. 1, and FIGS. 11C, 12C, . . . , and 21C show a portion corresponding to the cross-section taken along the line Y2-Y2' in FIG. 1.

Referring to FIGS. 11A through 11C, a plurality of fin-type active regions FA, which protrude upward (e.g., in the Z direction) from the main surface 110M of the substrate 110 and extend in the X direction to be parallel with each other, and an isolation film 112, which covers or is on both side walls of a lower portion of each of the fin-type active regions FA, may be formed by partially etching the substrate 110 in the first device region RX1 and the second device region RX2. A deep trench DT, which defines the first device region RX1 and the second device region RX2, may be formed by etching a portion of the isolation film 112 and a portion of the substrate 110 and may be filled with an isolation insulating film 114. Accordingly, the deep trench in the device isolation region DTA may be filled with the isolation insulating film 114. In the first device region RX1 and the second device region RX2, the fin-type active regions FA may protrude upward from the top surface of the isolation film 112.

Referring to FIGS. 12A through 12C, a plurality of dummy gate structures DGS extending to cross the fin-type active regions FA are formed on the isolation film 112 and the isolation insulating film 114. Each of the dummy gate structures DGS may include a dummy gate insulating film D12, a dummy gate line D14, and a dummy insulating capping layer D16, which are sequentially stacked on the fin-type active regions FA. The dummy gate insulating film D12 may include silicon oxide. The dummy gate line D14 may include polysilicon. The dummy insulating capping layer D16 may include silicon nitride.

An insulating spacer 120 may be formed on each of both side walls of each of the dummy gate structures DGS, and a plurality of recess regions RR may be formed in an upper portion of each of a plurality of fin-type active regions FA by partially etching the fin-type active regions FA exposed at both sides of each dummy gate structure DGS. Thereafter, a plurality of source/drain regions SD filling the recess regions RR may be formed.

An intergate insulating film 128 covering the isolation film 112, the isolation insulating film 114, and the source/ drain regions SD may be formed among the dummy gate structures DGS. In example embodiments, before the intergate insulating film 128 is formed, an insulating liner (not shown) covering the source/drain regions SD may also be formed. The insulating liner may include SiN, SiCN, SiBN, SiON, SiOCN, SiBCN, SiOC, SiO$_2$, or a combination thereof.

Figure 13A:
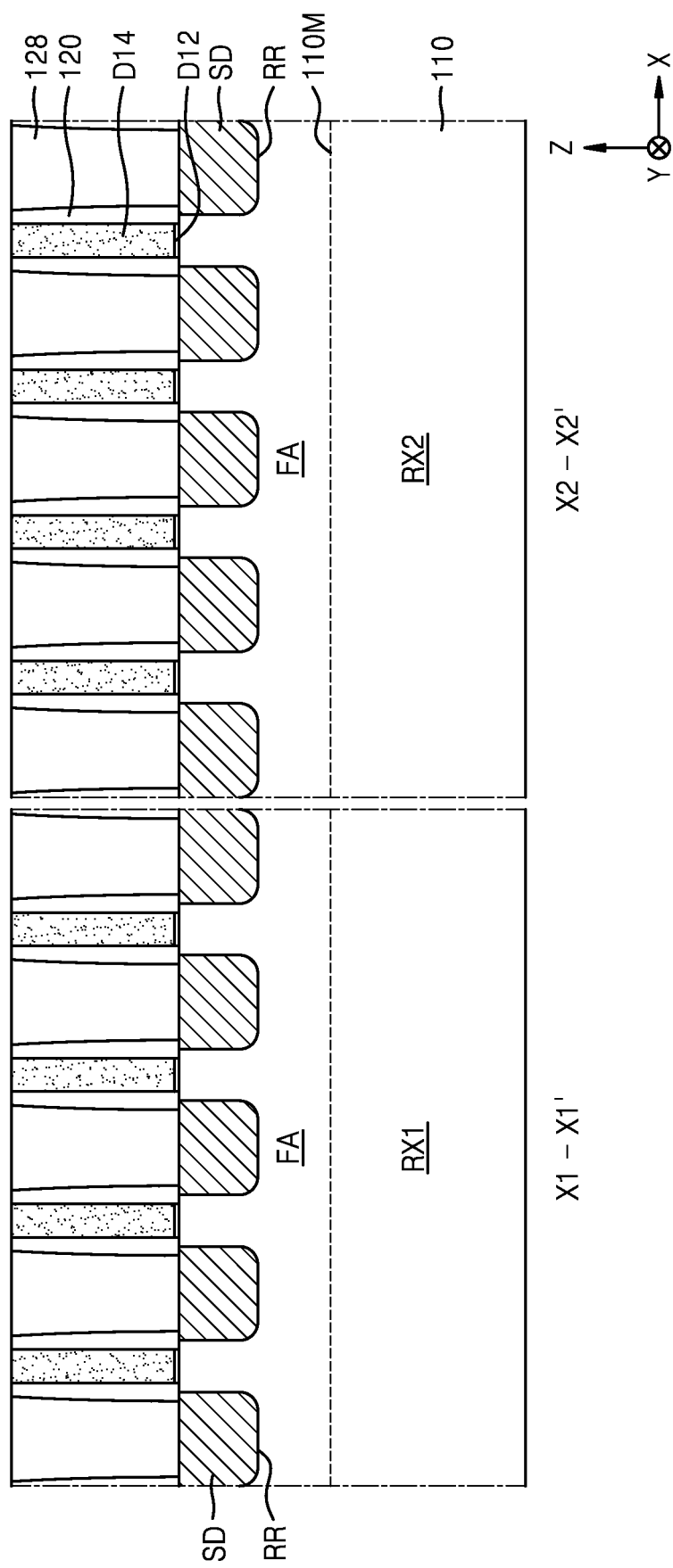
Figure 13B:
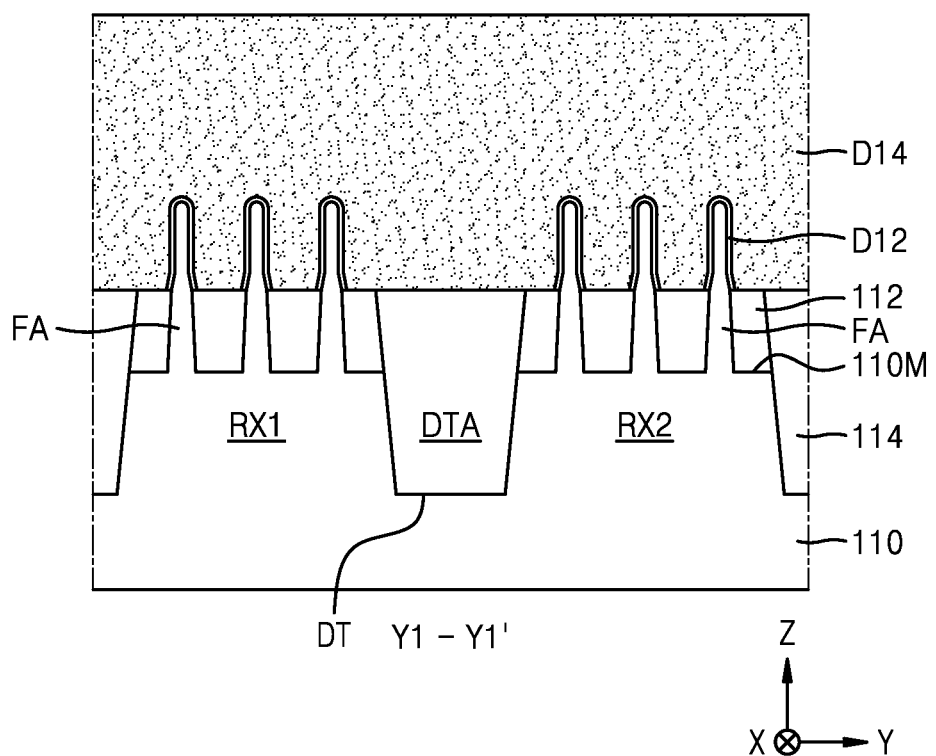
Figure 13C:
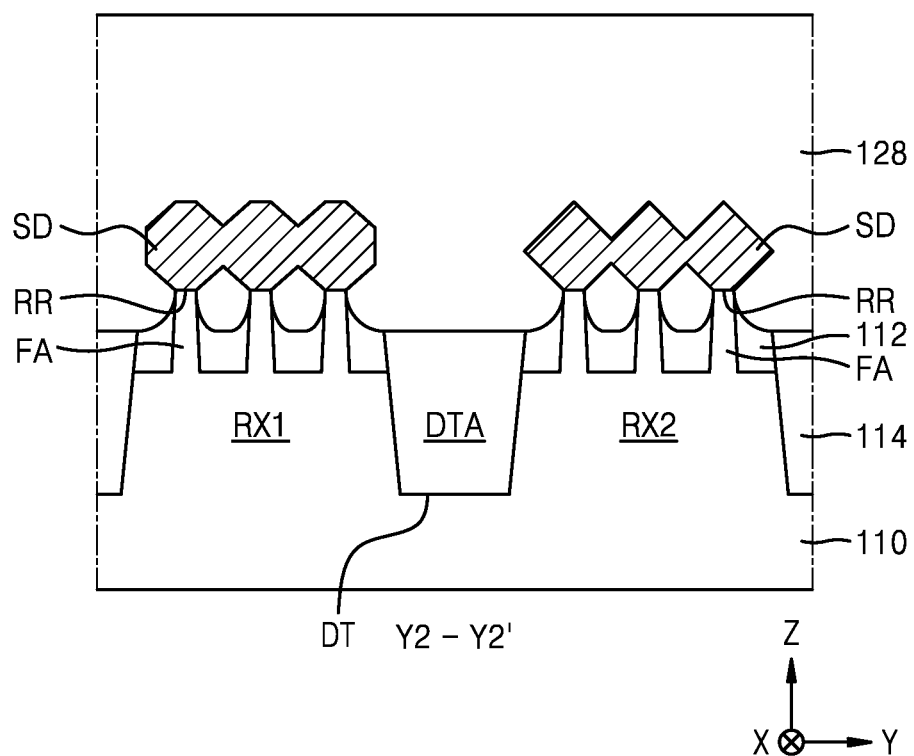

Referring to FIGS. 13A through 13C, the dummy gate line D14 is exposed by removing the dummy insulating capping layer D16 and insulating films around the dummy insulating capping layer D16 from the resultant structure of FIGS. 12A through 12C by using chemical mechanical polishing (CMP) process. At this time, the heights of the intergate insulating film 128 and the insulating spacer 120 may be lowered.

Figure 14A:
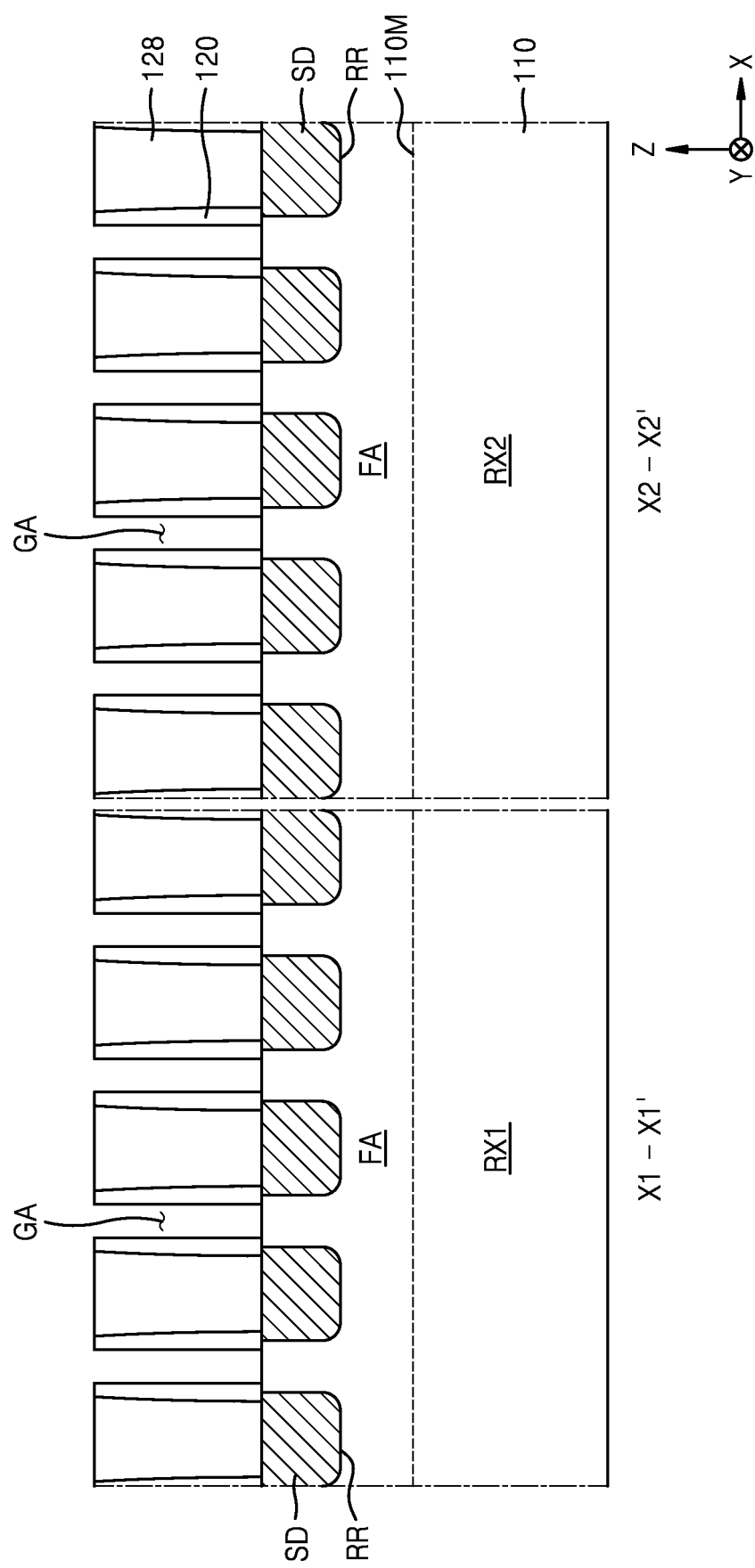
Figure 14B:
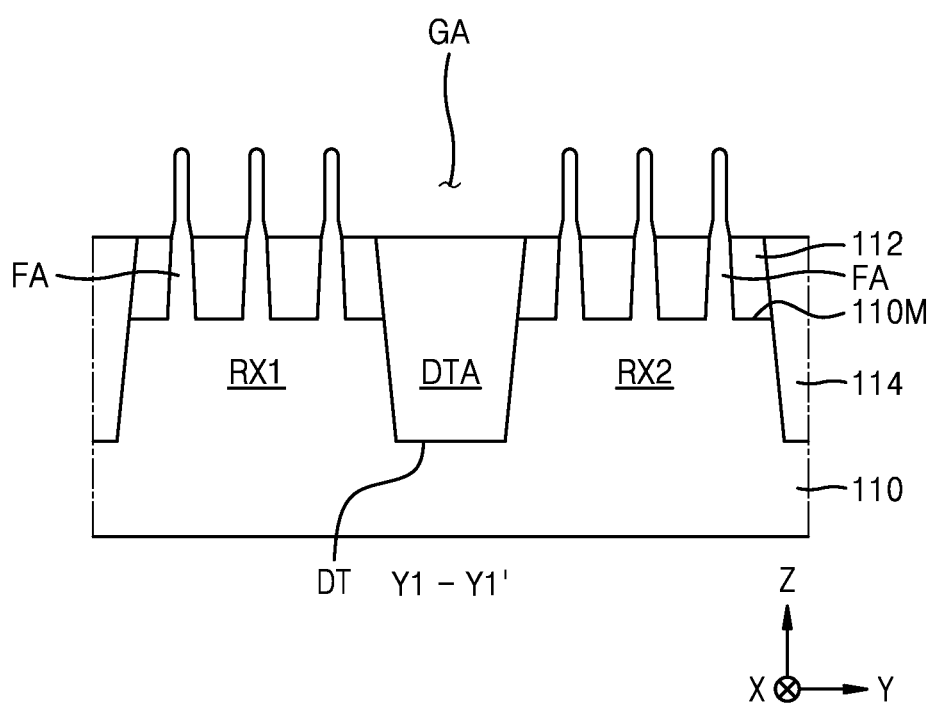
Figure 14C:
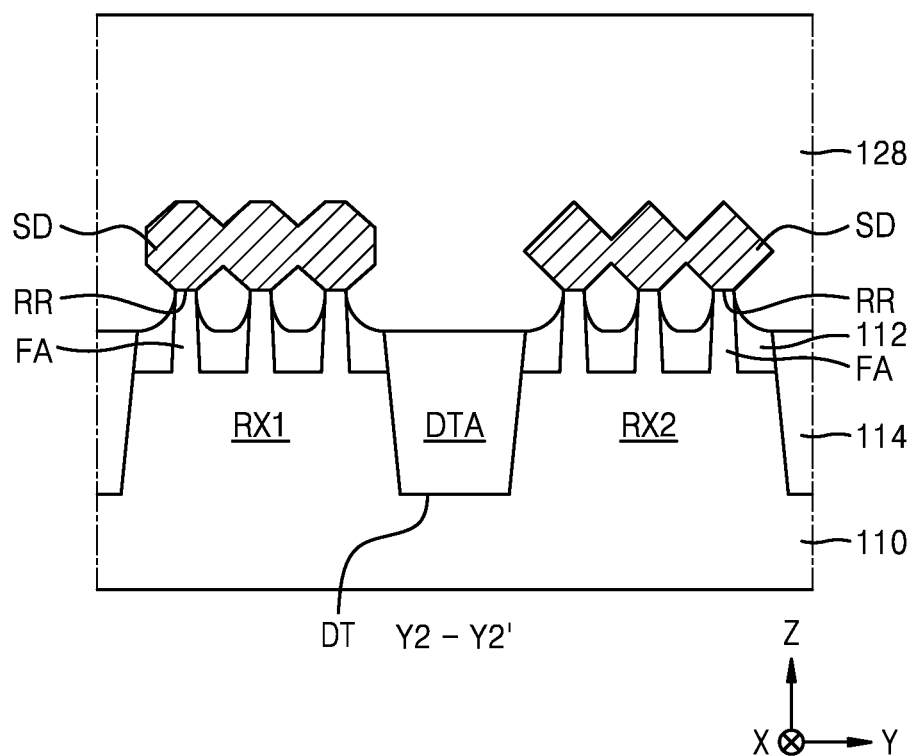

Referring to FIGS. 14A through 14C, a plurality of gate spaces GA are provided by removing a plurality of dummy gate lines D14 and a plurality of dummy gate insulating films D12 from the resultant structure of FIGS. 13A through 13C. The insulating spacer 120, the fin-type active regions FA, the isolation film 112, and the isolation insulating film 114 may be exposed by the gate spaces GA.

Figure 15A:
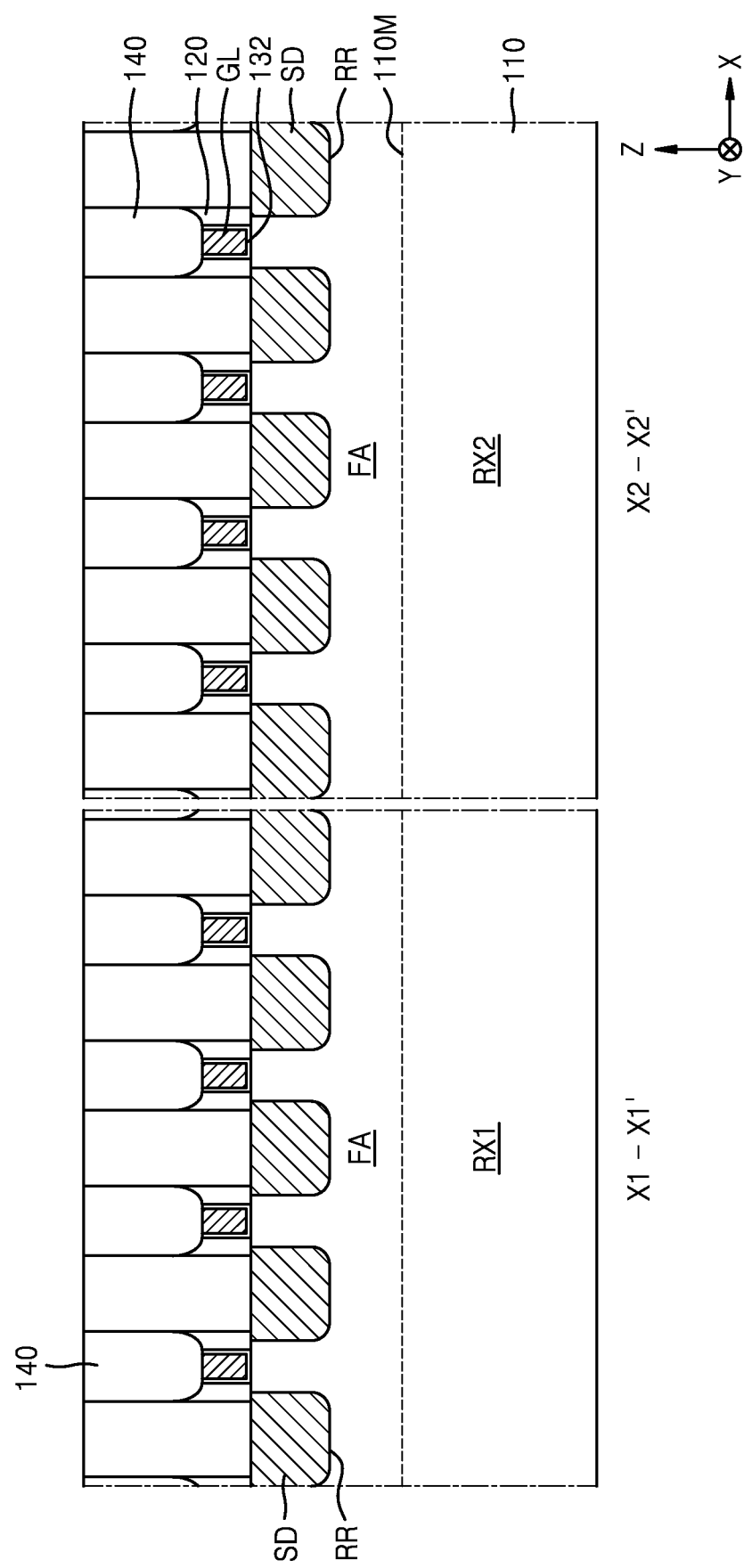
Figure 15B:
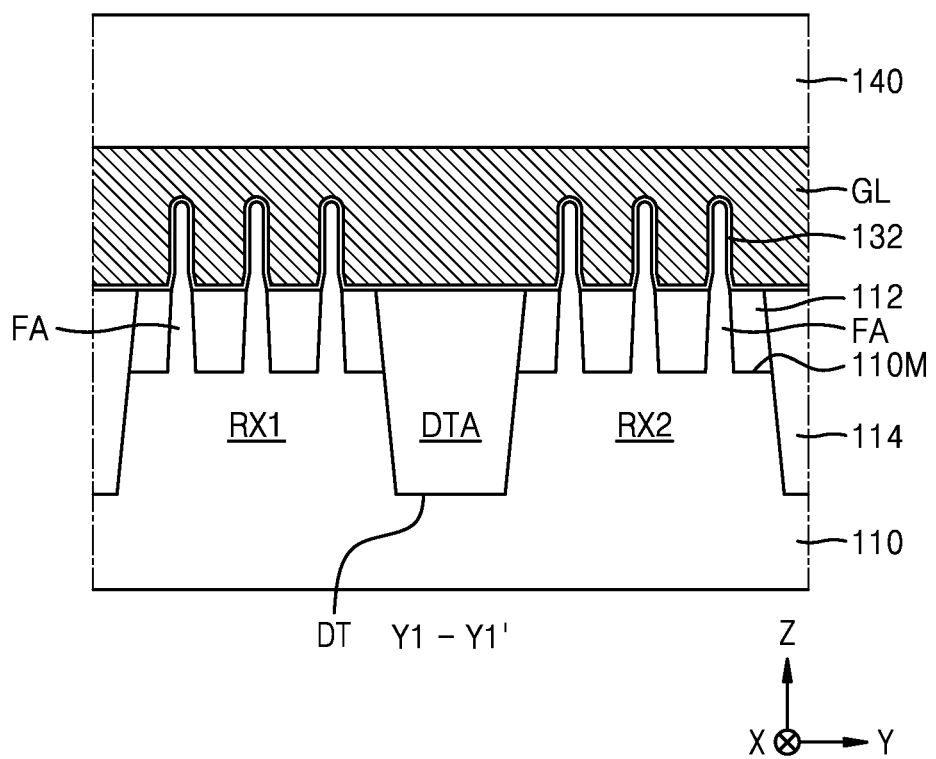
Figure 15C:
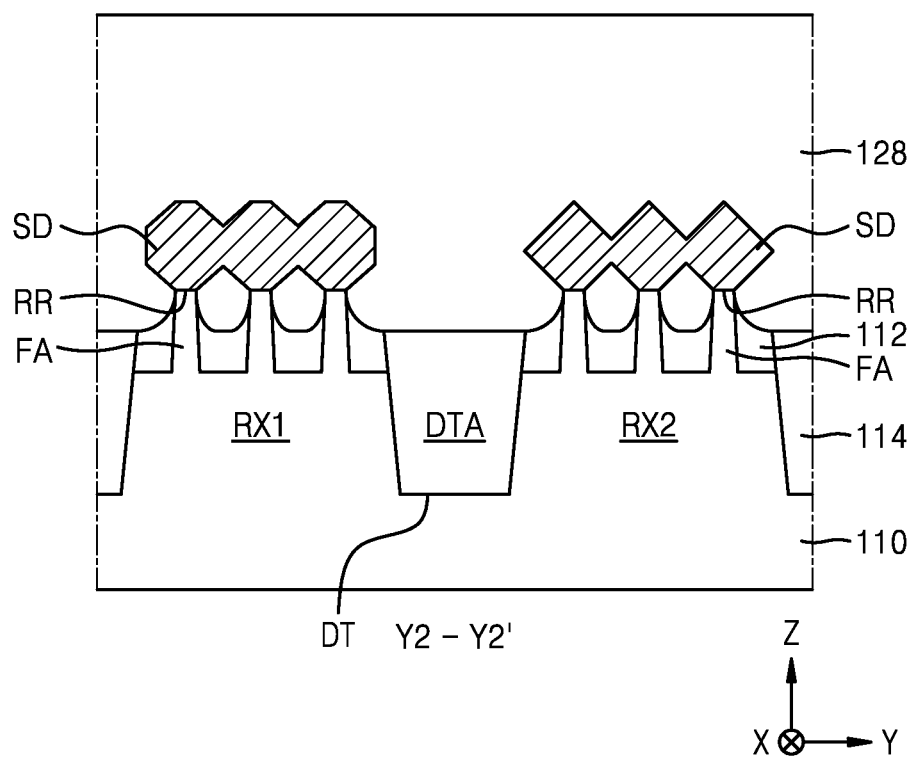

Referring to FIGS. 15A through 15C, a gate insulating film 132, a gate line GL, and an insulating capping line 140 are formed in the gate spaces GA of the resultant structure of FIGS. 14A through 14C.

To form the gate insulating film 132, the gate line GL, and the insulating capping line 140, a plurality of gate insulating films 132 and a plurality of gate lines GL may be formed to fill the gate spaces GA and then etched back to be lowered so as to fill only lower portions of the gate spaces GA. During the etch-back of the gate insulating films 132 and the gate lines GL, an upper portion of the insulating spacer 120 defining the gate spaces GA may also be removed such that the height of the insulating spacer 120 may be lowered. Thereafter, the insulating capping line 140 may be formed to cover the top surface of each of the gate lines GL, the gate insulating films 132, and the insulating spacer 120 in the gate spaces GA and to fill the upper portions of the gate spaces GA.

In example embodiments, before the gate insulating films 132 are formed, an interface film (not shown) may be formed to cover the surface of each of the fin-type active regions FA exposed by the gate spaces GA. To form the interface film, the fin-type active regions FA exposed in the gate spaces GA may be partially oxidized.

Figure 16A:
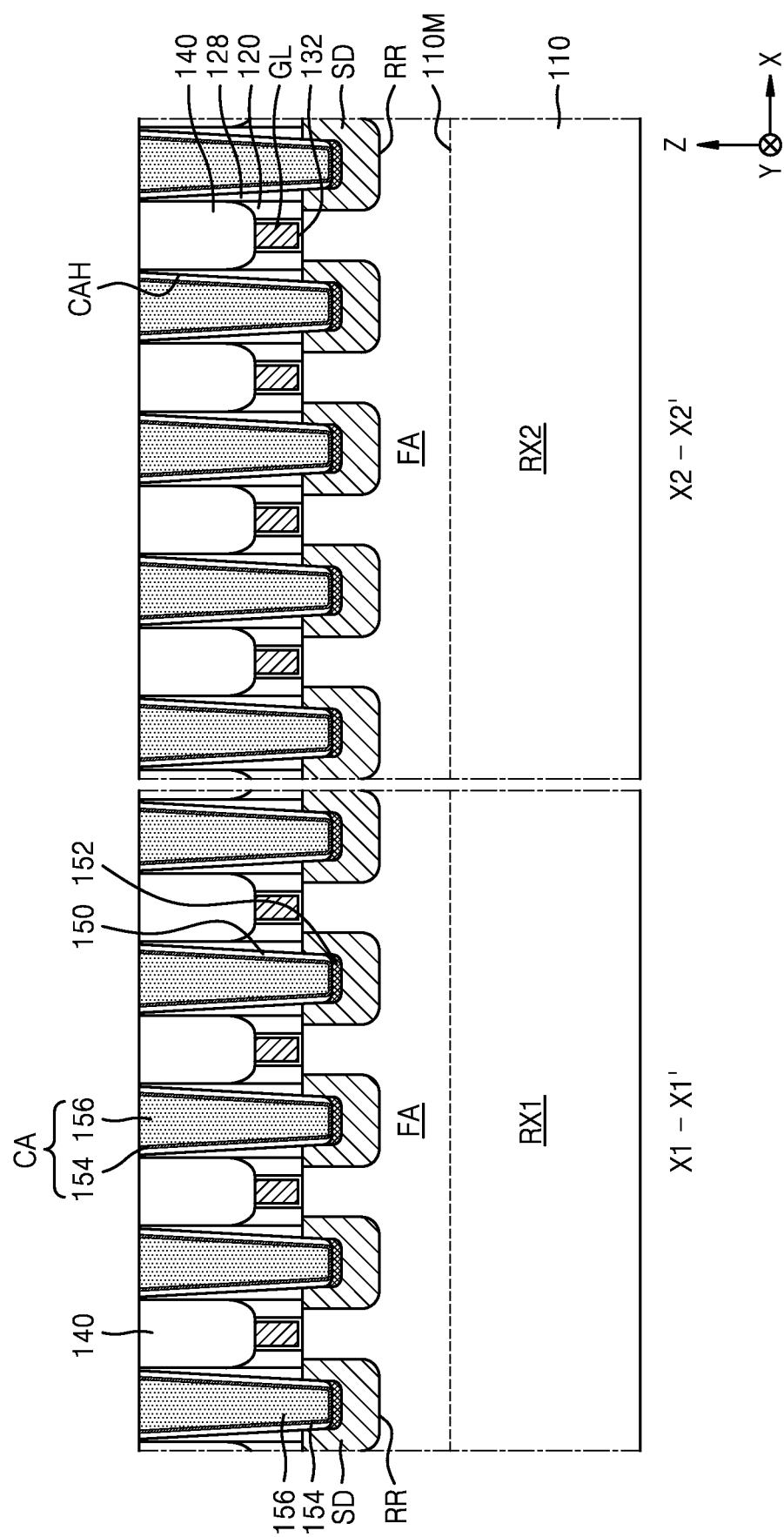
Figure 16B:
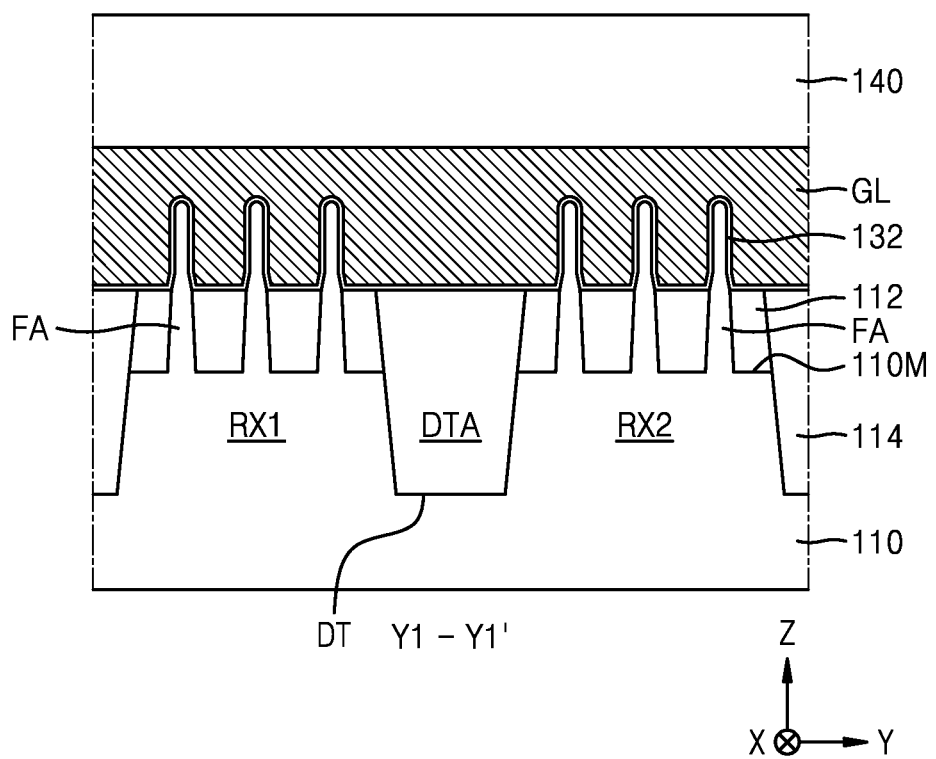
Figure 16C:
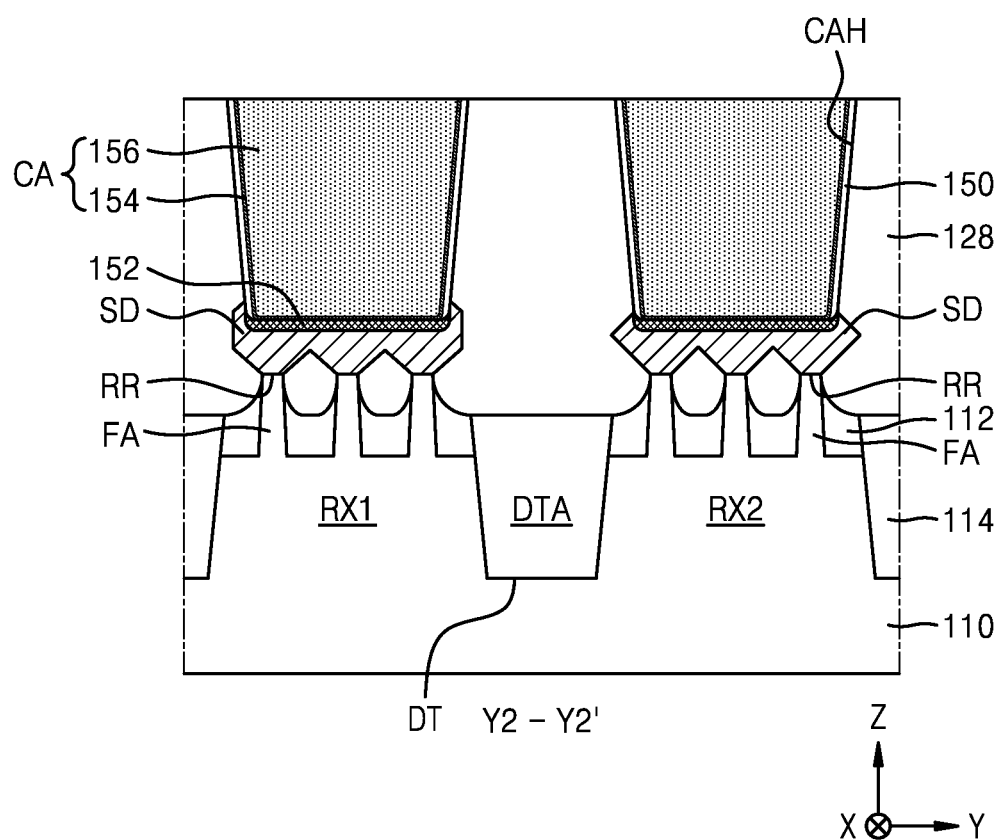

Referring to FIGS. 16A through 16C, a plurality of source/drain contact holes CAH are formed to expose the source/drain regions SD through the intergate insulating film 128, and a contact insulating spacer 150 is formed to cover or overlap the inner side walls of each of the source/drain contact holes CAH. To form the contact insulating spacer 150, an insulating spacer film may be formed to conformally cover the inner wall of each of the source/drain contact holes CAH and then anisotropically etched to expose a source/drain region SD through each source/drain contact hole CAH. Consequently, a plurality of contact insulating spacers 150 each including a portion of the insulating spacer film remaining on the side wall of the source/drain contact hole CAH may be obtained.

A plurality of metal silicide films 152, which respectively cover the source/drain regions SD in the lower portions of the source/drain contact holes CAH, and a plurality of source/drain contacts CA, which respectively fill the source/drain contact holes CAH, are formed. The source/drain contacts CA may include the conductive barrier film 154 and the metal plug 156.

In example embodiments, the metal silicide films 152 and the source/drain contacts CA may be formed by perform the processes described below. Firstly, a metal liner conformally covering the source/drain regions SD may be formed in the source/drain contact holes CAH. The metal liner may include Ti, W, Ru, Nb, Mo, Hf, Ni, Co, Pt, Yb, Tb, Dy, Er, Pd, or a combination thereof. Thereafter, the conductive barrier film 154 may be formed to cover an exposed surface of the metal liner and the inner walls of the source/drain contact holes CAH. The metal liner and the conductive barrier film 154 may be formed using physical vapor deposition (PVD), CVD, or atomic layer deposition (ALD). Thereafter, a heat treatment may be performed on a resultant structure including the metal liner and the conductive barrier film 154 to induce a reaction on a semiconductor material of the source/drain regions SD and a metal of the metal liner, thereby forming the metal silicide films 152 covering the source/drain regions SD. In example embodiments, after the metal silicide films 152 are formed, the metal liner may partially remain between each of the metal silicide films 152 and the conductive barrier film 154. In example embodiments, all of the metal liner may be used to form the metal silicide films 152 and thus not remain between each of the metal silicide films 152 and the conductive barrier film 154.

Thereafter, a metal film may be formed on a resultant structure including the metal silicide films 152 and the conductive barrier film 154 to be thick enough to fill the inside of each of the source/drain contact holes CAH. The metal film may be formed using CVD, PVD, or electroplating. Thereafter, the metal plug 156 including the metal film remaining on the conductive barrier film 154 in each of the source/drain contact holes CAH may be formed by removing the conductive barrier film 154 and an unnecessary portion of the metal film using CMP to expose the top surface of the intergate insulating film 128.

Figure 17A:
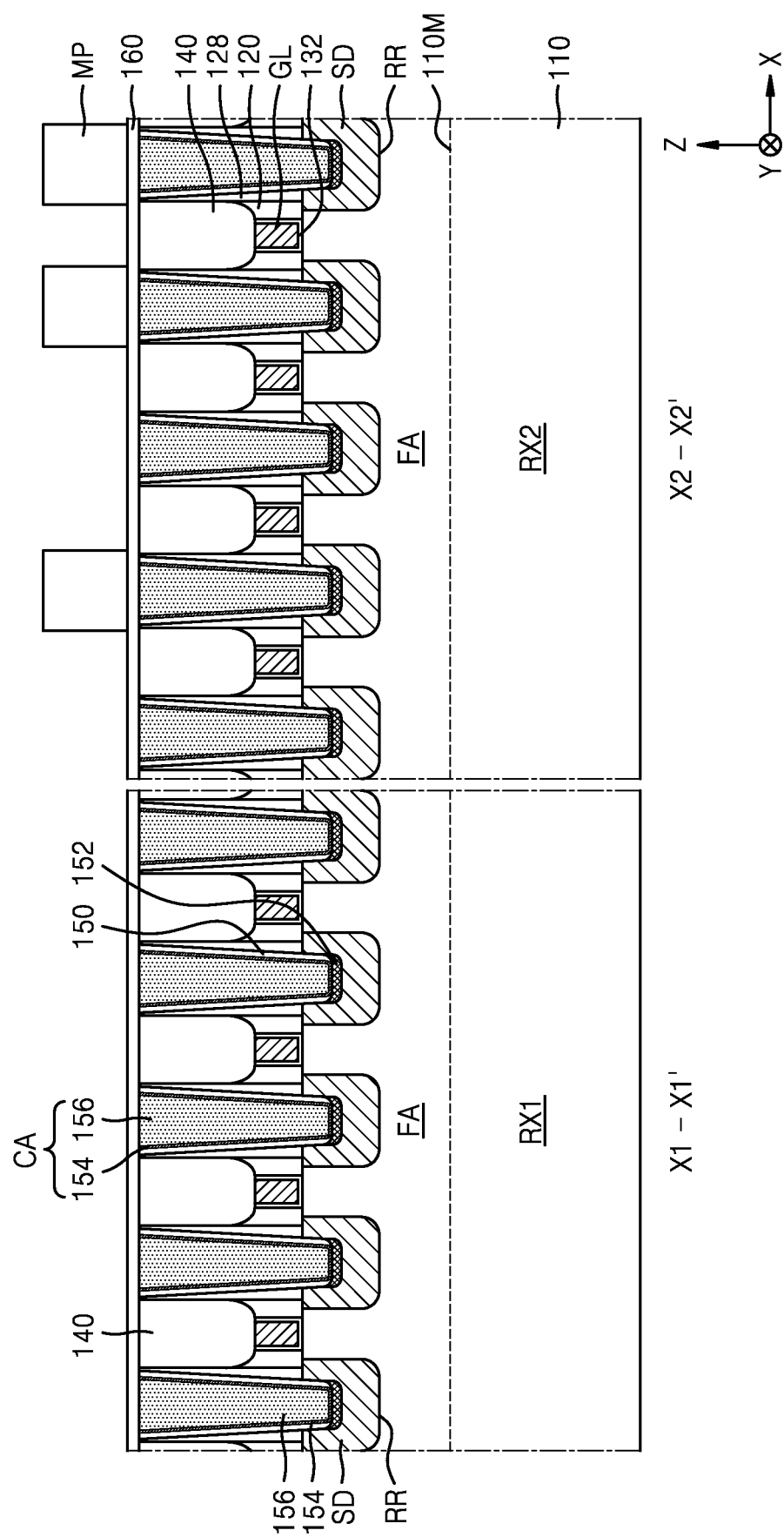
Figure 17B:
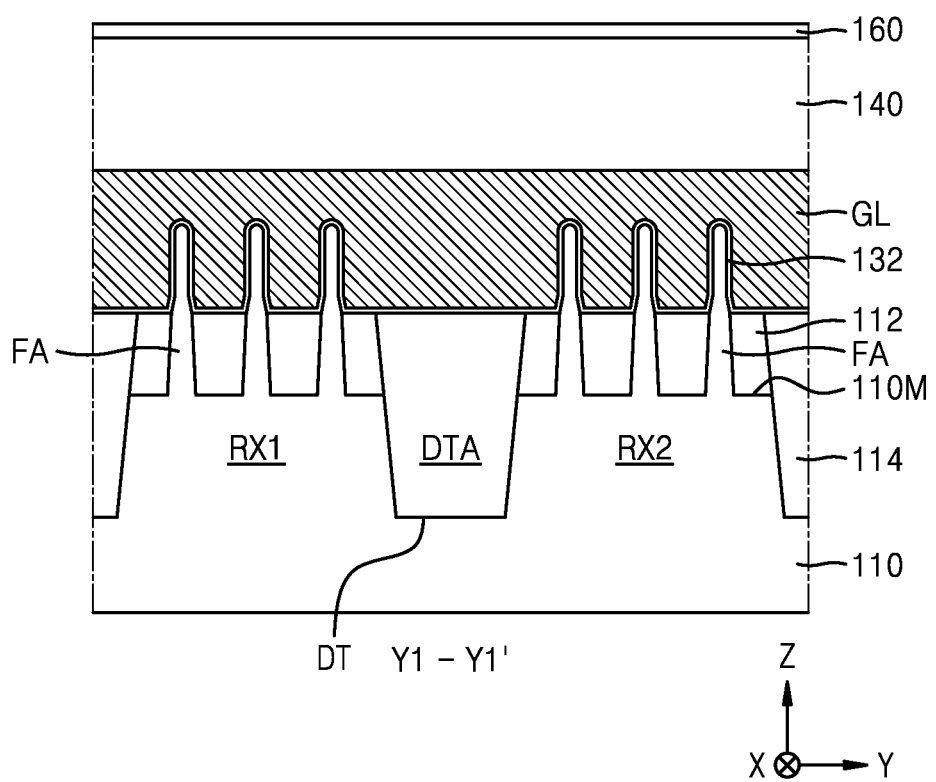
Figure 17C:
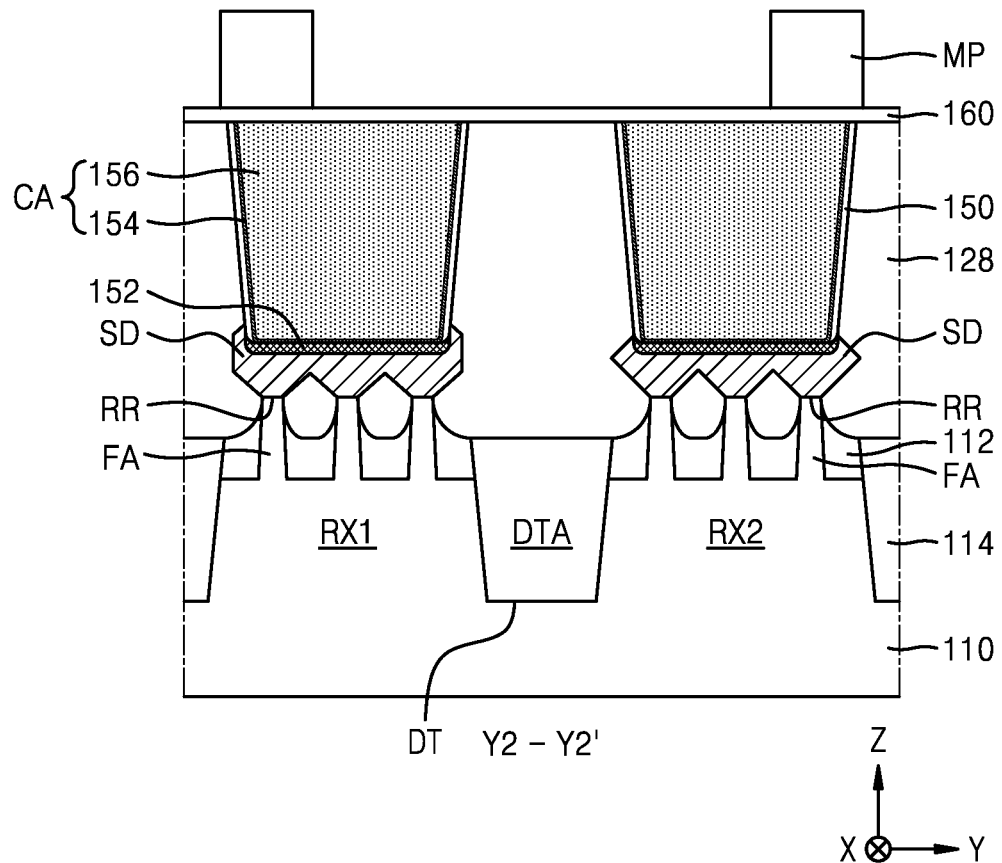

Referring to FIGS. 17A through 17C, an etch stop film 160 is formed to cover the top surface of the resultant structure of FIGS. 16A through 16C, and a plurality of mask patterns MP may be formed on the etch stop film 160 to partially cover the source/drain contacts CA. The mask patterns MP may be positioned to correspond to the source/drain via contacts CAV in FIG. 1.

The etch stop film 160 may include a different material than the mask patterns MP. In example embodiments, the etch stop film 160 may include SiOC, SiN, or a combination thereof, and the mask patterns MP may include a silicon oxide film, a spin-on-hardmask (SOH) film, a photoresist film, or a combination thereof, but embodiments are not limited thereto.

Figure 18A:
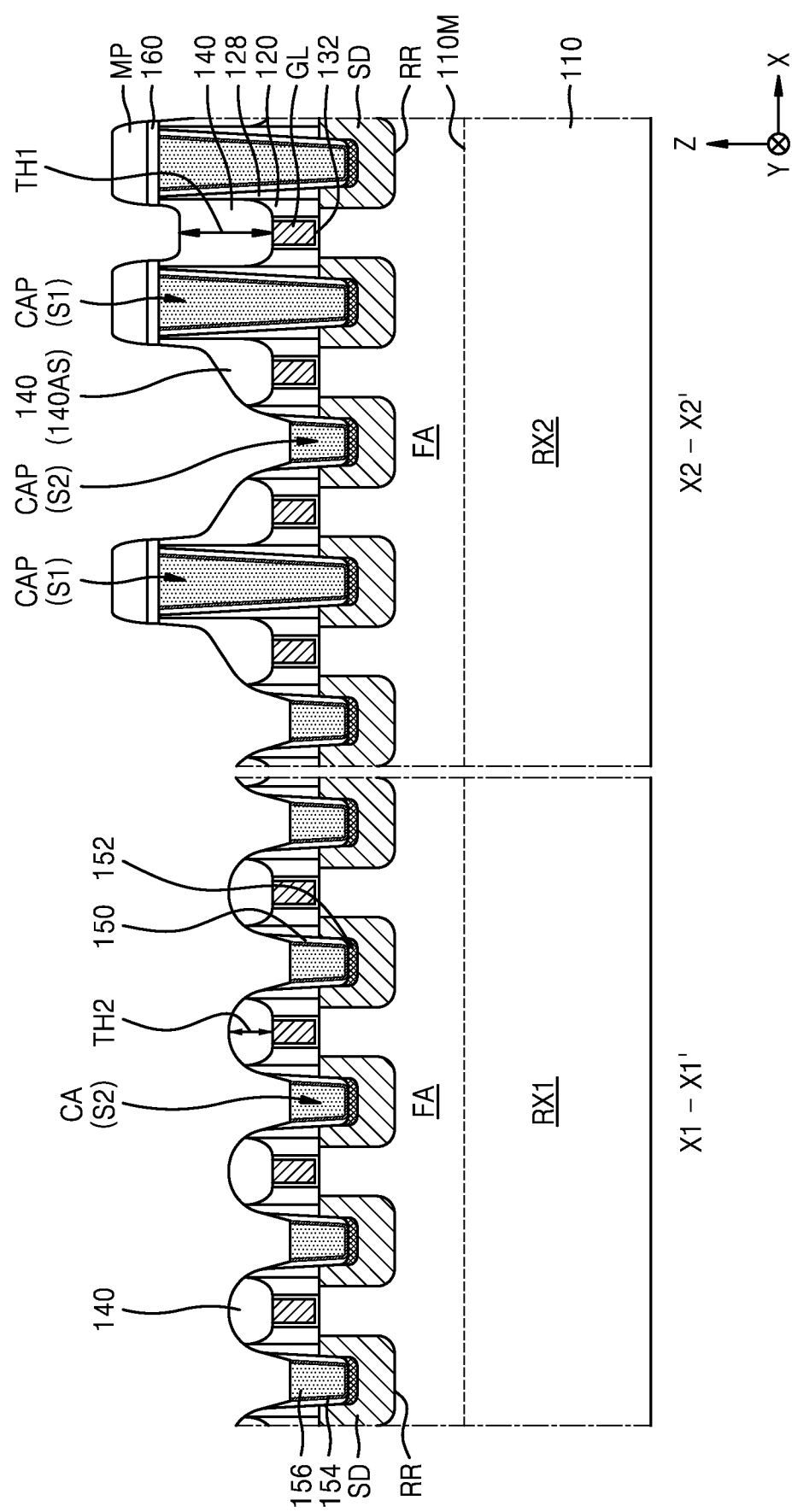
Figure 18B:
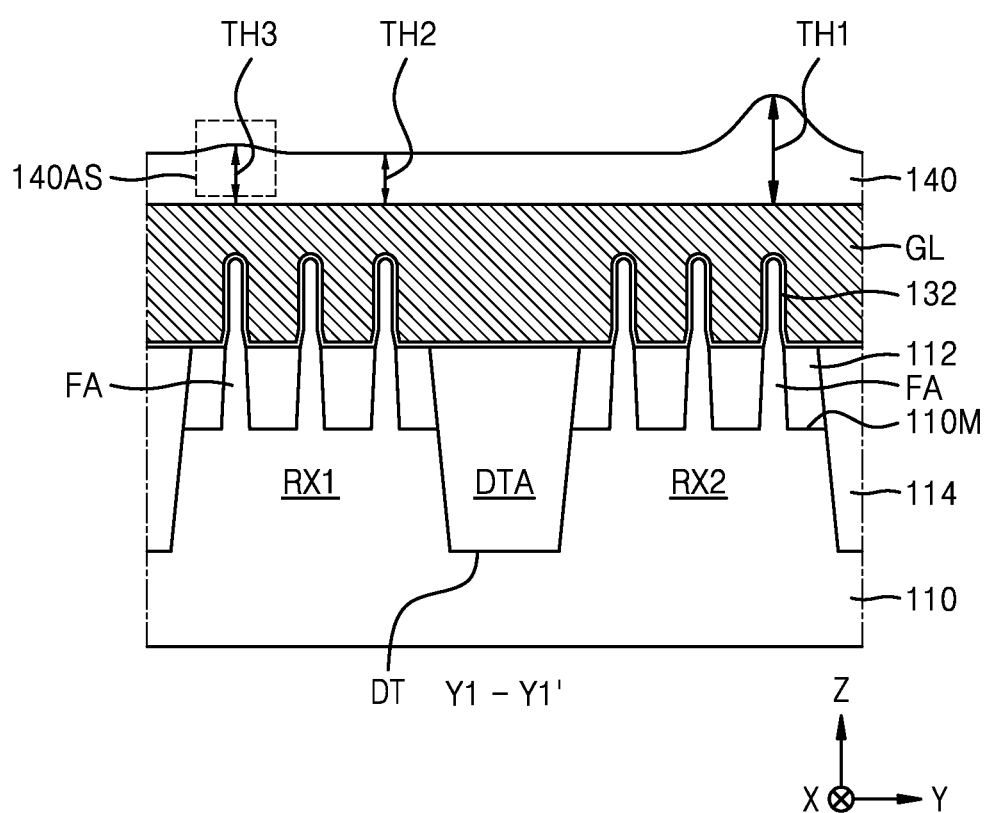
Figure 18C:
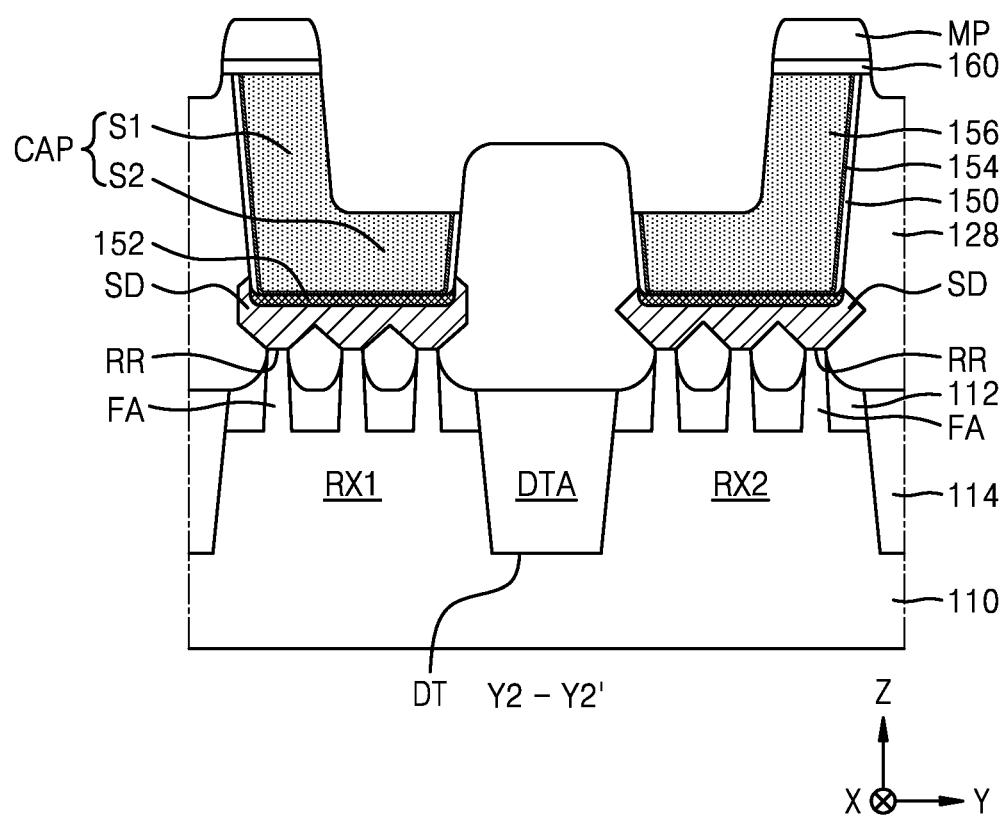

Referring to FIGS. 18A through 18C, the etch stop film 16 is etched using the mask patterns MP as etch masks, and the source/drain contacts CA that are exposed are etched in a first etching atmosphere to be lowered. As a result, a plurality of source/drain contact patterns CAP having different heights at different positions may be formed. Each of the source/drain contact patterns CAP may include a first segment S1 and a second segment S2, which have different heights in the vertical direction (e.g., the Z direction) and are integrally or monolithically connected to each other.

The first etching atmosphere may be provided to etch a metal containing film forming the source/drain contacts CA. In the first etching atmosphere, the etching amount of the metal containing film forming the source/drain contacts CA may be greater than the etching amount of an insulating film forming a plurality of insulating capping lines 140, and the etching amount of the insulating film forming the insulating capping lines 140 may be greater than 0. In example embodiments, when the exposed portions of the source/drain contacts CA are etched, the first etching atmosphere may be controlled such that the etching amount of the metal containing film, e.g., a tungsten film, forming the source/drain contacts CA is greater than the etching amount of the insulating film, e.g., a silicon nitride film, forming the insulating capping lines 140 and a ratio of the etching amount of the insulating capping lines 140 to the etching amount of the source/drain contacts CA is greater than 0 and less than about 0.5, for example, is selected from a range from about 0.05 to about 0.2. As a result, the heights of portions of the insulating capping lines 140, which are exposed to the first etching atmosphere while the exposed portions of the source/drain contacts CA are being etched using the mask patterns MP as etch masks, may be lowered. At this time, portions of the insulating capping lines 140 adjacent to the mask patterns MP may be etched less than portions of the insulating capping lines 140 far from the mask patterns MP. As a result, the first segment Si of one of two adjacent source/drain contact patterns CAP may be aligned with the second segment S2 of the other of the two adjacent source/drain contact patterns CAP in the first horizontal direction (e.g., the X direction). At this time, a portion of the insulating capping lines 140 between the first segment Si of one of two adjacent source/drain contact patterns CAP and the second segment S2 of the other of the two adjacent source/drain contact patterns CAP may include an asymmetric capping portion 140AS, which has a variable thickness in the first horizontal direction (e.g., the X direction).

As shown in FIG. 18B, at least one insulating capping line 140 may have a variable thickness in the second horizontal direction (e.g., the Y direction). A portion of the insulating capping line 140 between two adjacent first segments Si closest to each other in the first horizontal direction (e.g., the X direction) may cover a gate line GL to the first thickness TH1. In addition, a portion of the insulating capping line 140 between two adjacent second segments S2 closest to each other in the first horizontal direction (e.g., the X direction) may cover or overlap the gate line GL to the second thickness TH2 that is less than the first thickness TH1 in the vertical direction (e.g., the Z direction).

While the source/drain contact patterns CAP including the first segment Si and the second segment S2 are being formed, the heights of the mask patterns MP, a plurality of insulating spacers 120, and the intergate insulating film 128 may be lowered in the first etching atmosphere.

Figure 19A:
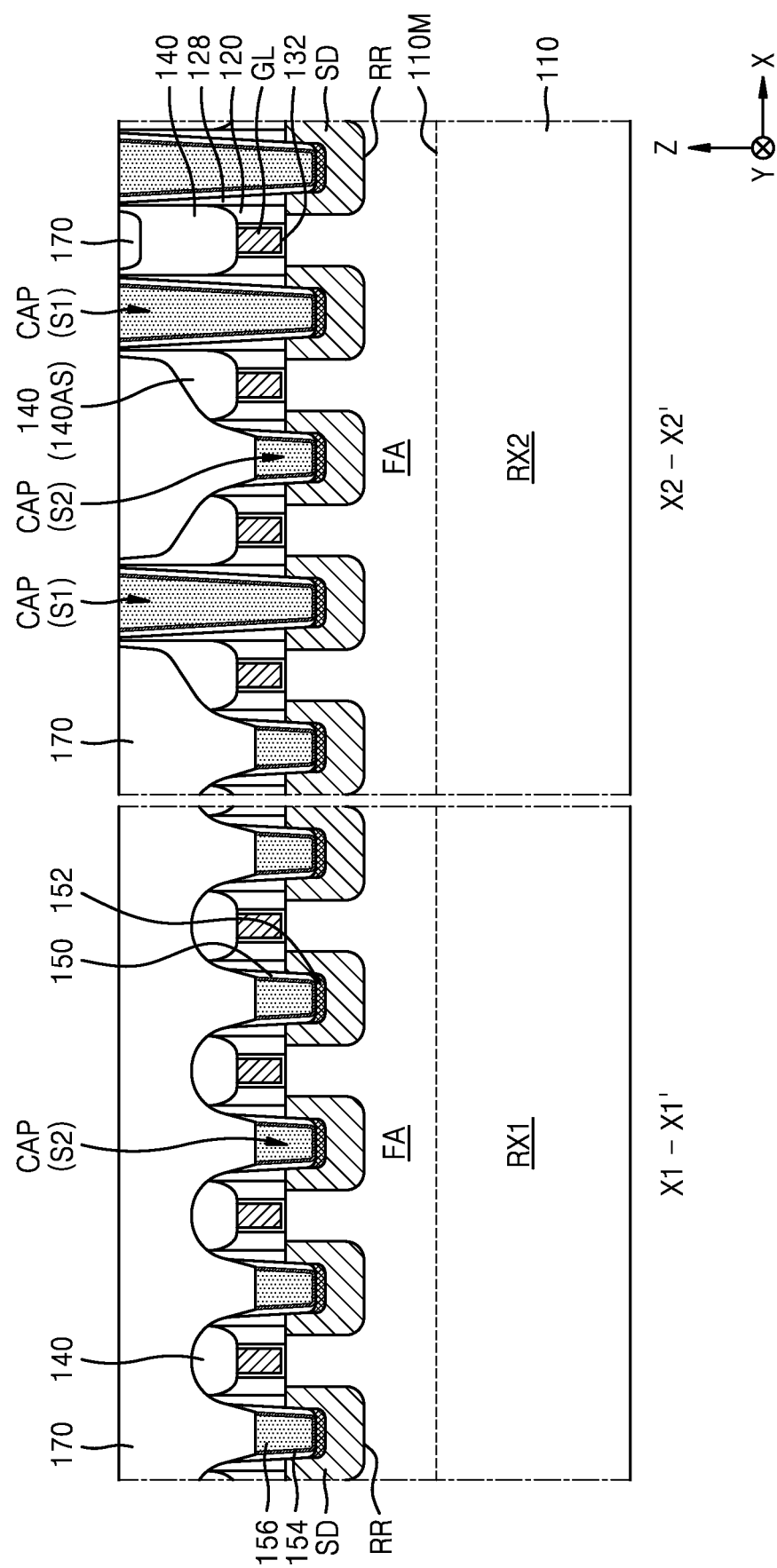
Figure 19B:
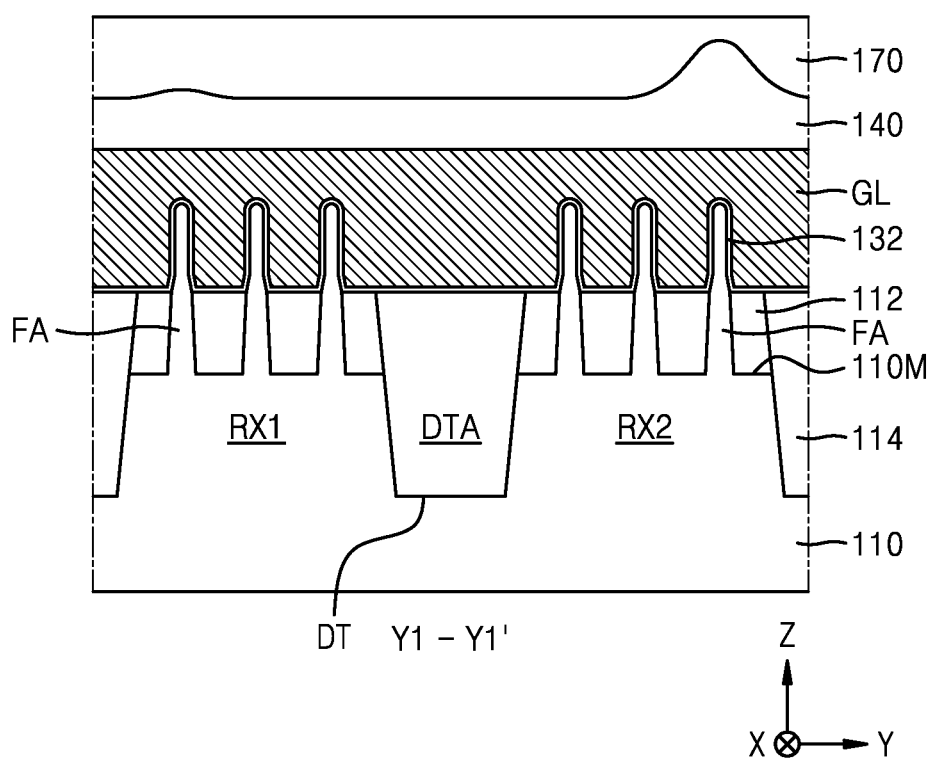
Figure 19C:
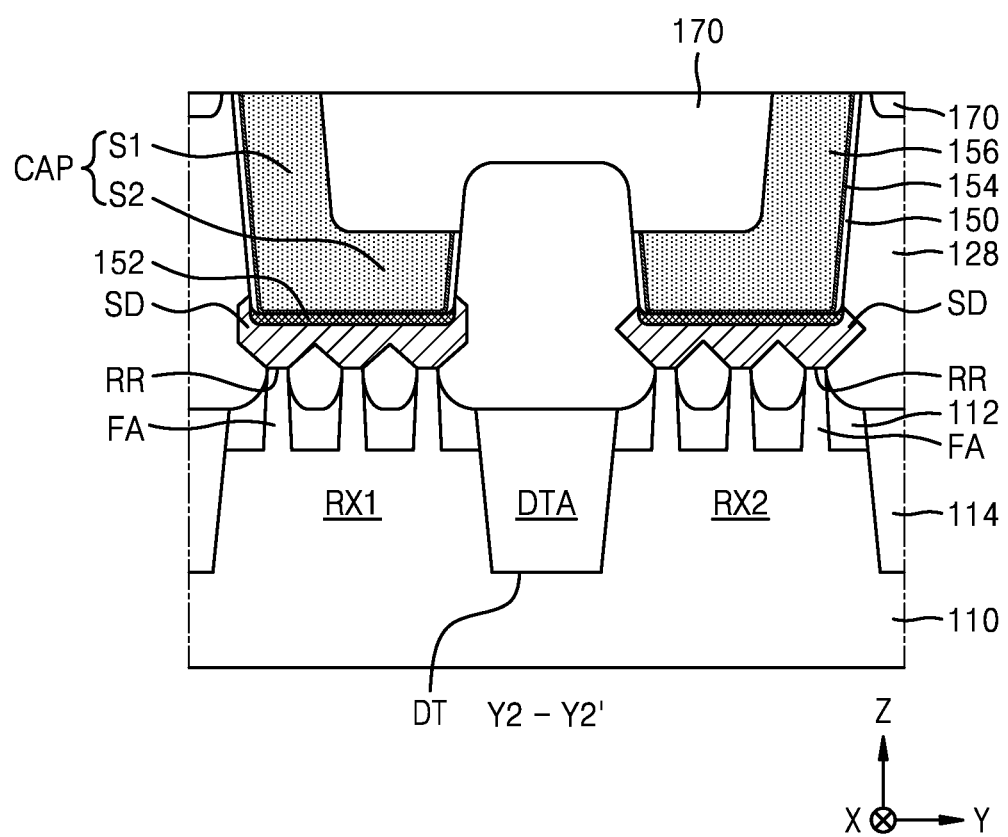

Referring to FIGS. 19A through 19C, an insulating film is formed on the resultant structure of FIGS. 18A through 18C to a thickness enough to fill spaces among the mask patterns MP and then planarized to expose the top surface of the first segment Si of each of the source/drain contact patterns CAP. Thereafter, the mask patterns MP and the etch stop film 160 are removed to form the buried insulating film 170 including the planarized insulating film.

The second segment S2 of each of the source/drain contact patterns CAP and a plurality of insulating capping lines 140 may be covered with the buried insulating film 170. The buried insulating film 170 may have a planarized top surface. The top surface of the first segment Si of each of the source/drain contact patterns CAP may extend on the same plane as the top surface of the buried insulating film 170.

The buried insulating film 170 may be formed to fill a space above the second segment S2 of each of the source/drain contact patterns CAP, which is between two adjacent gate lines GL. Because the height of the second segment S2 of each of the source/drain contact patterns CAP is lower than the height of the first segment S1, when the first segment Si is at each of both sides of the second segment S2 in the first horizontal direction (e.g., the X direction), an insulating material may need to be deposited in a relatively deep space without a void, to fill the space above the second segment S2. In a method of manufacturing an integrated circuit device according to embodiments, the insulating capping lines 140 include the asymmetric capping portion 140AS, which is between the first segment Si and the second segment S2 and has a variable thickness in the first horizontal direction (e.g., the X direction) to decrease toward the second segment S2, and accordingly, the space above the second segment S2 close to the first segment Si of each of the source/drain contact patterns CAP may be easily filled with the buried insulating film 170.

Figure 20A:
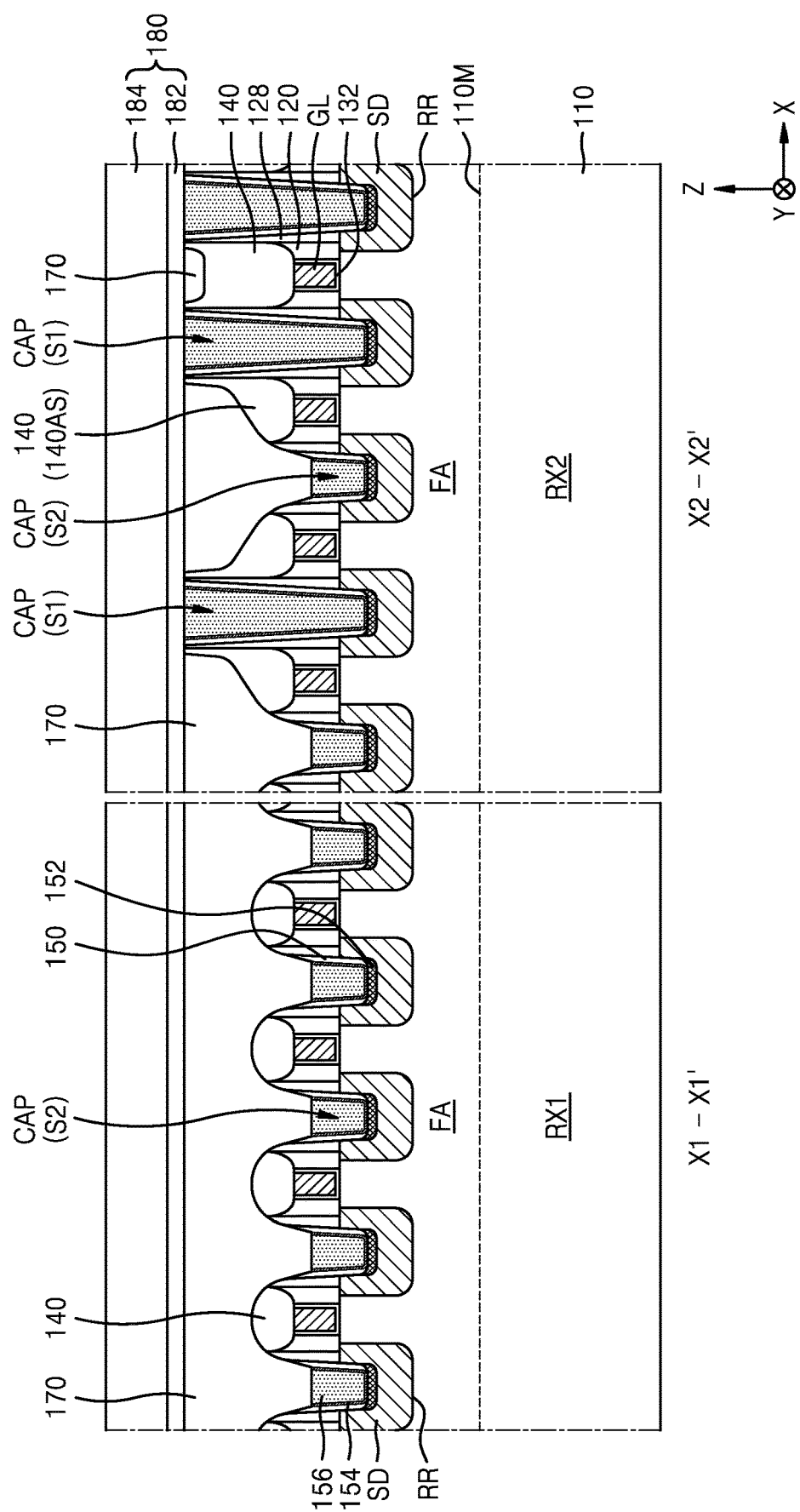
Figure 20B:
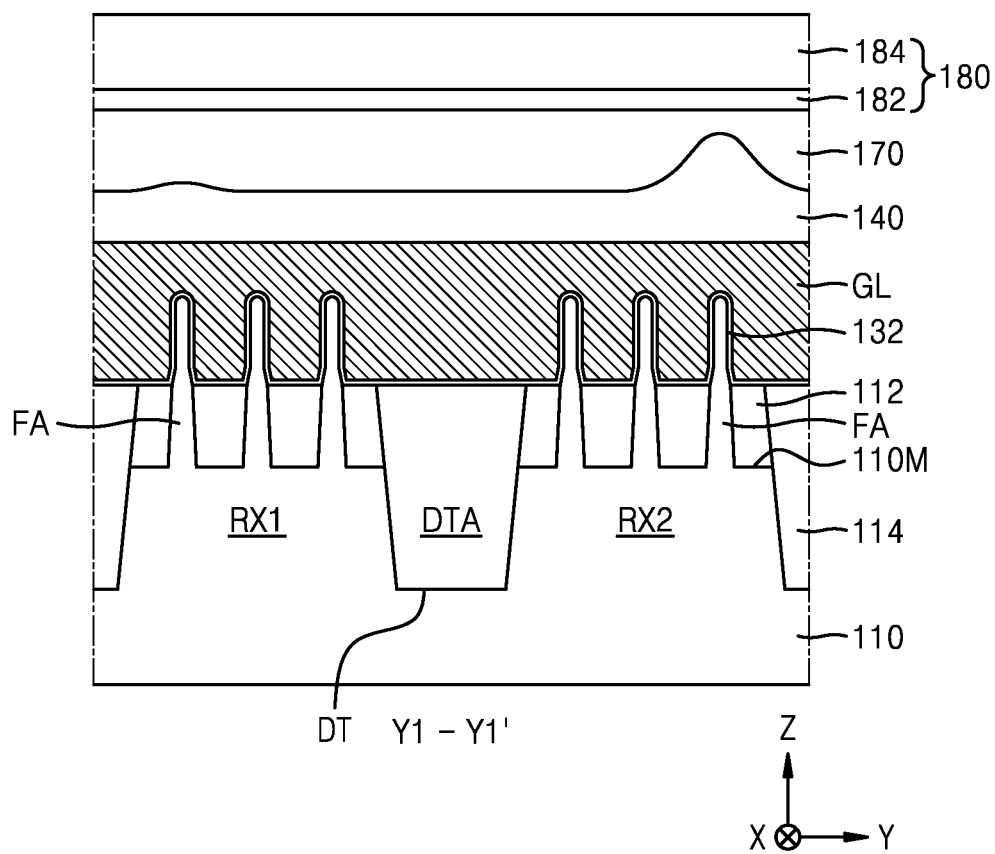
Figure 20C:
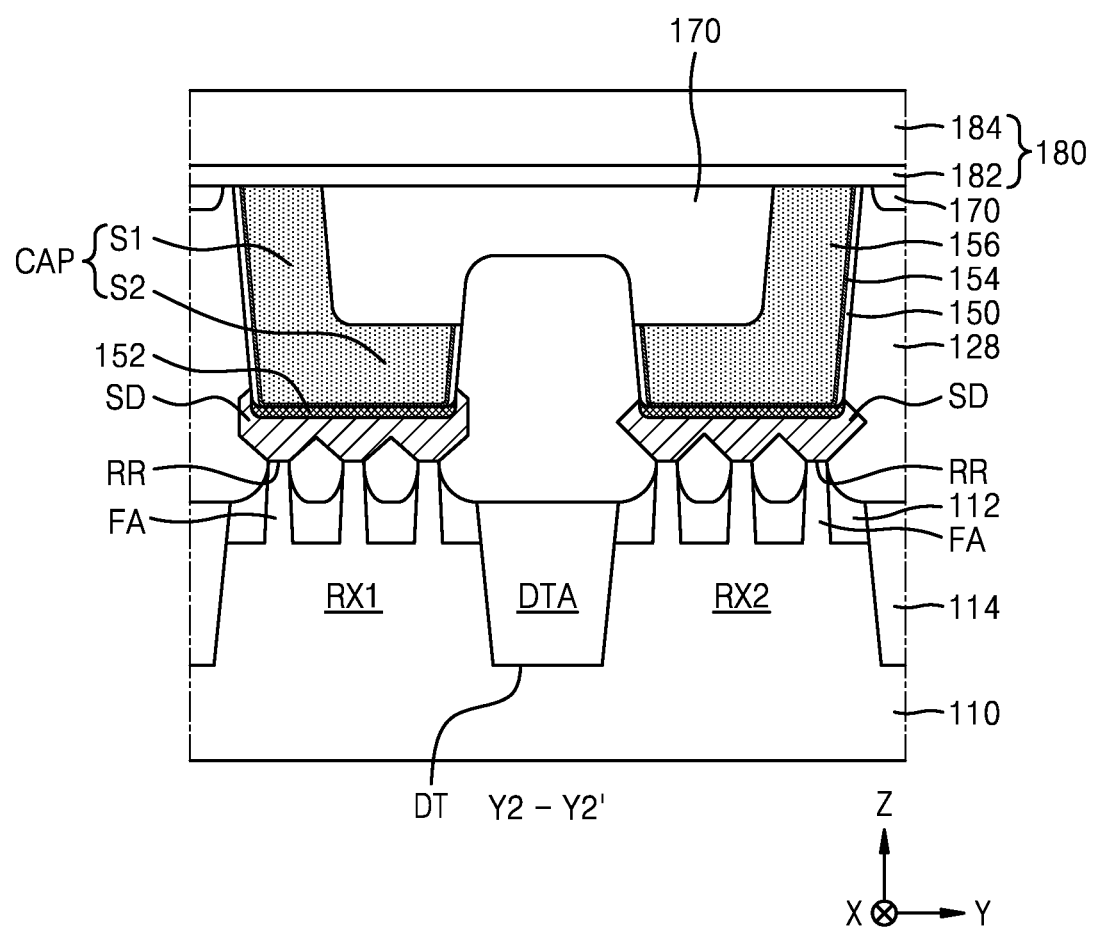

Referring to FIGS. 20A through 20C, the insulating structure 180 is formed on the resultant structure of FIGS. 19A through 19C. The insulating structure 180 may include the etch stop film 182 and the interlayer insulating film 184, which are sequentially formed on the buried insulating film 170 and the source/drain contact patterns CAP.

Figure 21A:
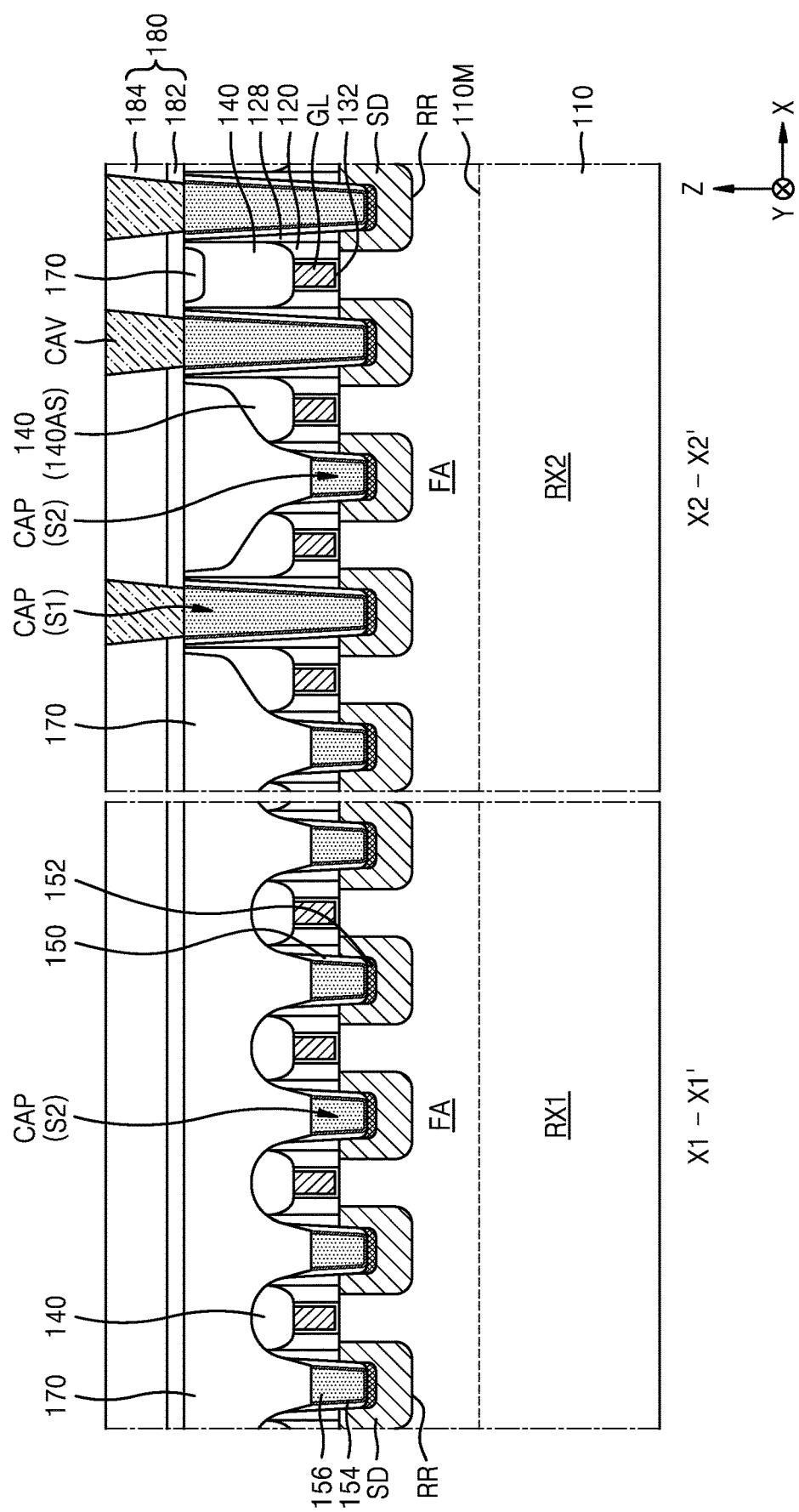
Figure 21B:
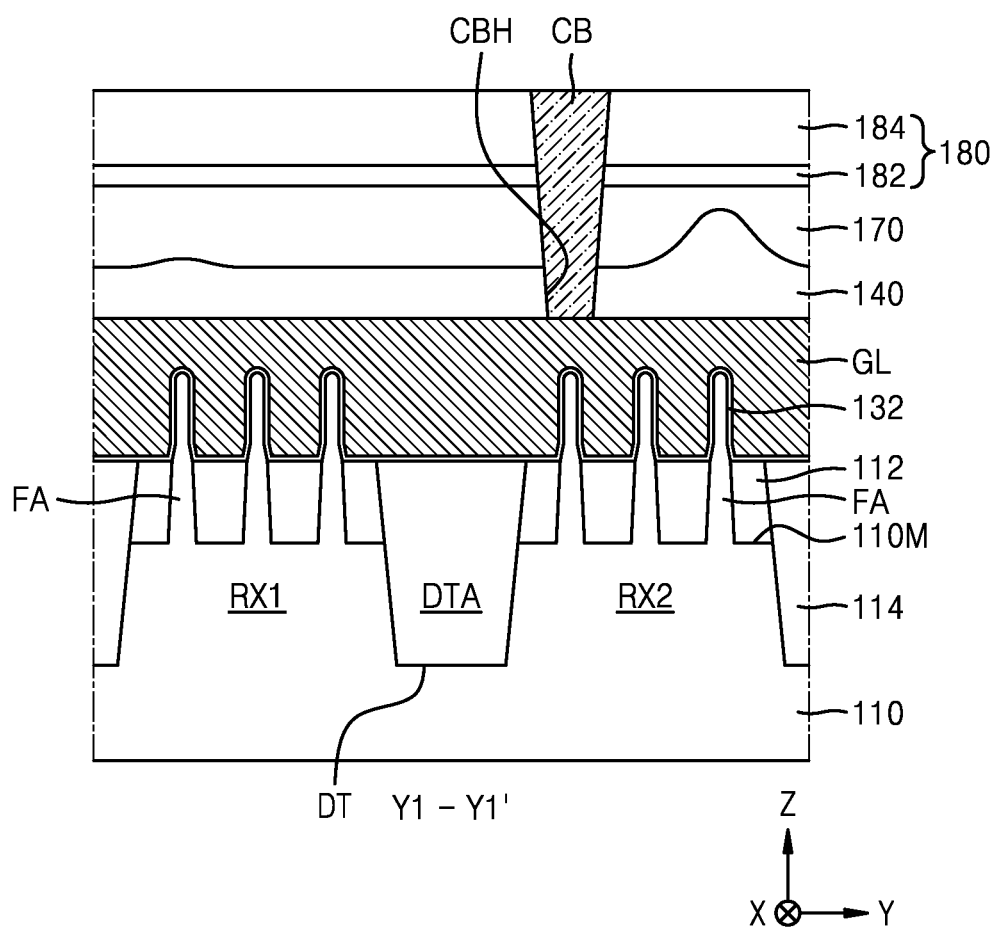
Figure 21C:
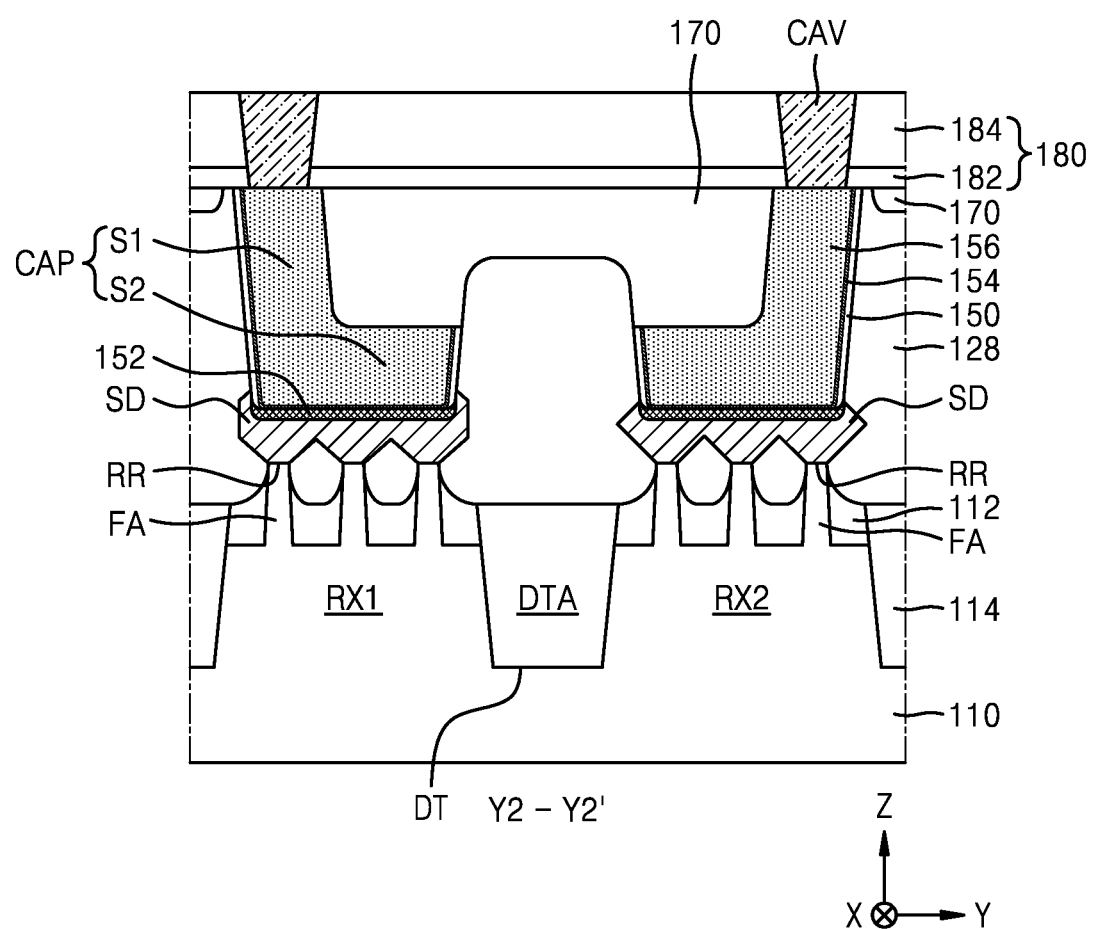

Referring to FIGS. 21A through 21C, a plurality of source/drain via contacts CAV connected to the first segment Si of each of the source/drain contact patterns CAP and a plurality of gate contacts CB connected to a plurality of gate lines GL are formed.

In example embodiments, the source/drain via contacts CAV and the gate contacts CB may be simultaneously formed. In example embodiments, the source/drain via contacts CAV and the gate contacts CB may be sequentially formed using separate processes. In this case, the gate contacts CB may be formed after the source/drain via contacts CAV are formed, or the source/drain via contacts CAV may be formed after the gate contacts CB are formed.

Each of the source/drain via contacts CAV may pass through the interlayer insulating film 184 and the etch stop film 182 and be in contact with the top surface of the first segment S1 of one of the source/drain contact patterns CAP. Each of the gate contacts CB may pass through or penetrate the interlayer insulating film 184, the etch stop film 182, the buried insulating film 170, and one of the insulating capping lines 140, and be in contact with the top surface of one of the gate lines GL.

To form the gate contacts CB, a plurality of gate contact holes CBH passing through or penetrating the interlayer insulating film 184, the etch stop film 182, the buried insulating film 170, and the insulating capping lines 140 may be formed. At this time, because portions of the insulating capping lines 140, which are relatively thin, are etched, the etch target thickness of the insulating capping lines 140 may be reduced during an etching process for the formation of the gate contact holes CBH. Accordingly, a process margin may be increased and the manufacturing processes of the integrated circuit device 100 may be simplified. In addition, because the thinner portions of the insulating capping lines 140 are etched during the formation of the gate contact holes CBH, time during which other elements around the gate contact holes CBH are exposed to an etching atmosphere used during the etching of the insulating capping lines 140 may be reduced. Accordingly, the gate lines GL may be prevented from being undesirably damaged by the etching atmosphere, and therefore, a threshold voltage variation in a plurality of transistors including the gate lines GL may be minimized. As a result, the performance of the integrated circuit device 100 may be increased.

Although the method of manufacturing the integrated circuit device 100 illustrated in FIGS. 1 through 3 has been described with reference to FIGS. 11A through 21C, it will be understood by those skilled in the art that the integrated circuit device 200 illustrated in FIGS. 4A through 4C, the integrated circuit device 300 illustrated in FIGS. 5 and 6, the integrated circuit device 400 illustrated in FIGS. 7 through 9, the integrated circuit device 900 illustrated in FIGS. 10A through 10C, and other various integrated circuit devices having similar structures thereto may be manufactured by making various modifications and changes in the descriptions given with FIGS. 11A through 21C, without departing from the scope of the inventive concept.

For example, the processes of manufacturing the integrated circuit device 100, which are described with reference to FIGS. 11A through 21C, may be used to manufacture the integrated circuit device 200 illustrated in FIGS. 4A through 4C. However, in the stage described with reference to FIGS. 21A through 21C, a process of forming a plurality of conductive lines ML connected to the source/drain via contacts CAV and the gate contacts CB may be further performed after the source/drain via contacts CAV and the gate contacts CB are formed. To manufacture the integrated circuit device 300 illustrated in FIGS. 5 and 6, a process of forming the multi-gate contact RCB connected in common to the gate lines GL in the device isolation region DTA may be performed while gate contacts CB are being formed in the stage described with reference to FIGS. 21A through 21C.

Figure 22A:
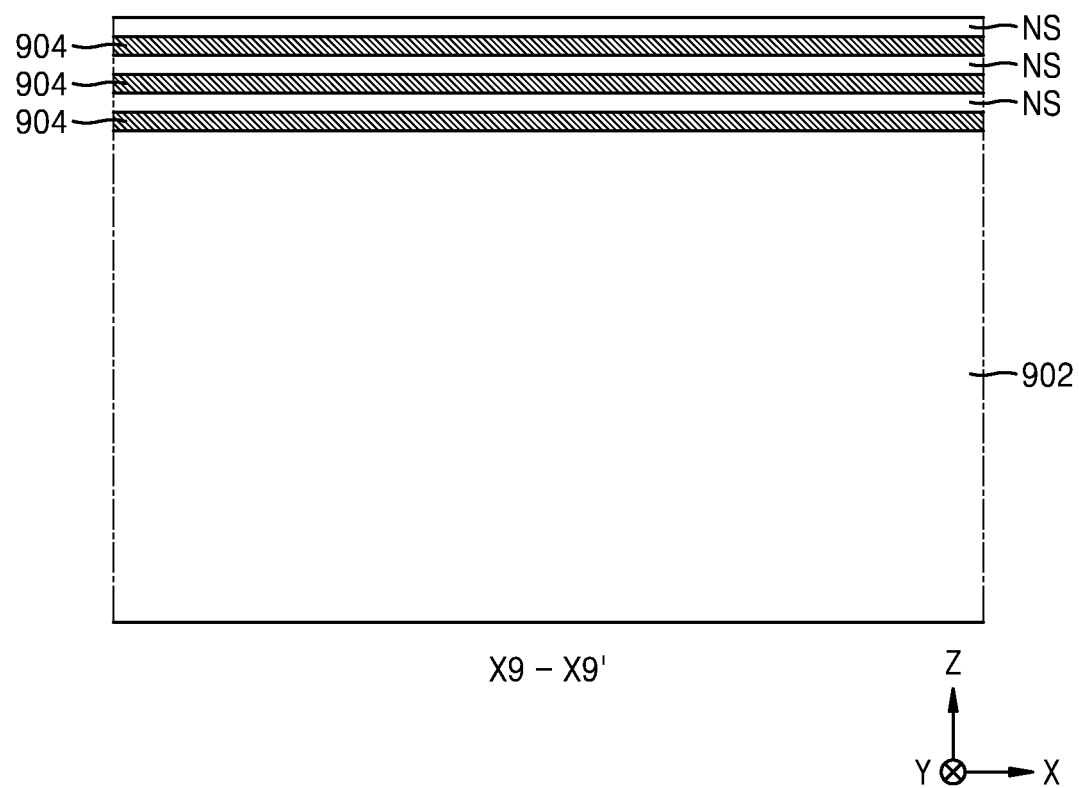
FIGS. 22A through 28 are cross-sectional views of sequential stages in a method of manufacturing an integrated circuit device, according to some embodiments, wherein FIGS. 22A, 23A, . . . , and 28 show a portion corresponding to the cross-section taken along the line X9-X9' in FIG. 10A, and FIGS. 22B, 23B, . . . , and 27B show a portion corresponding to the cross-section taken along the line Y9-Y9' in FIG. 10A.
Figure 22B:
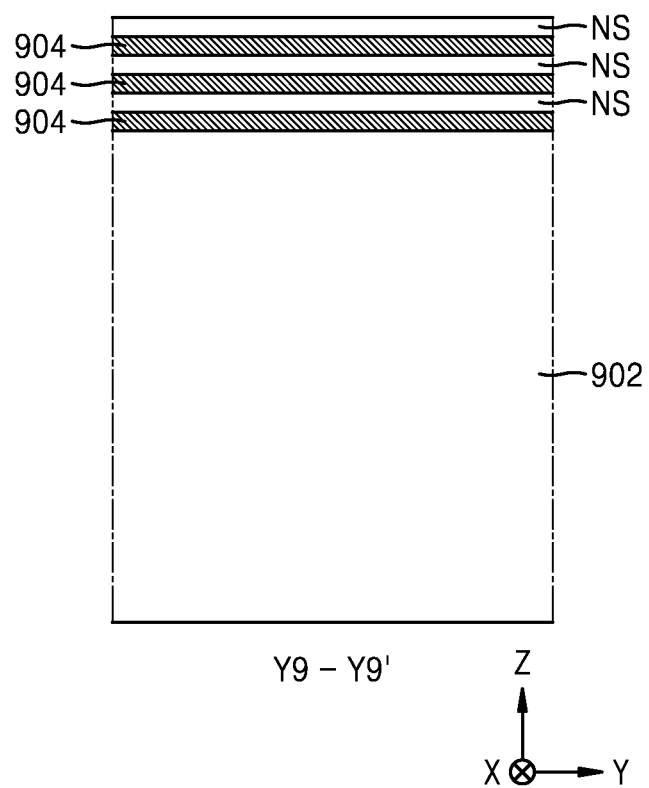
Figure 23A:
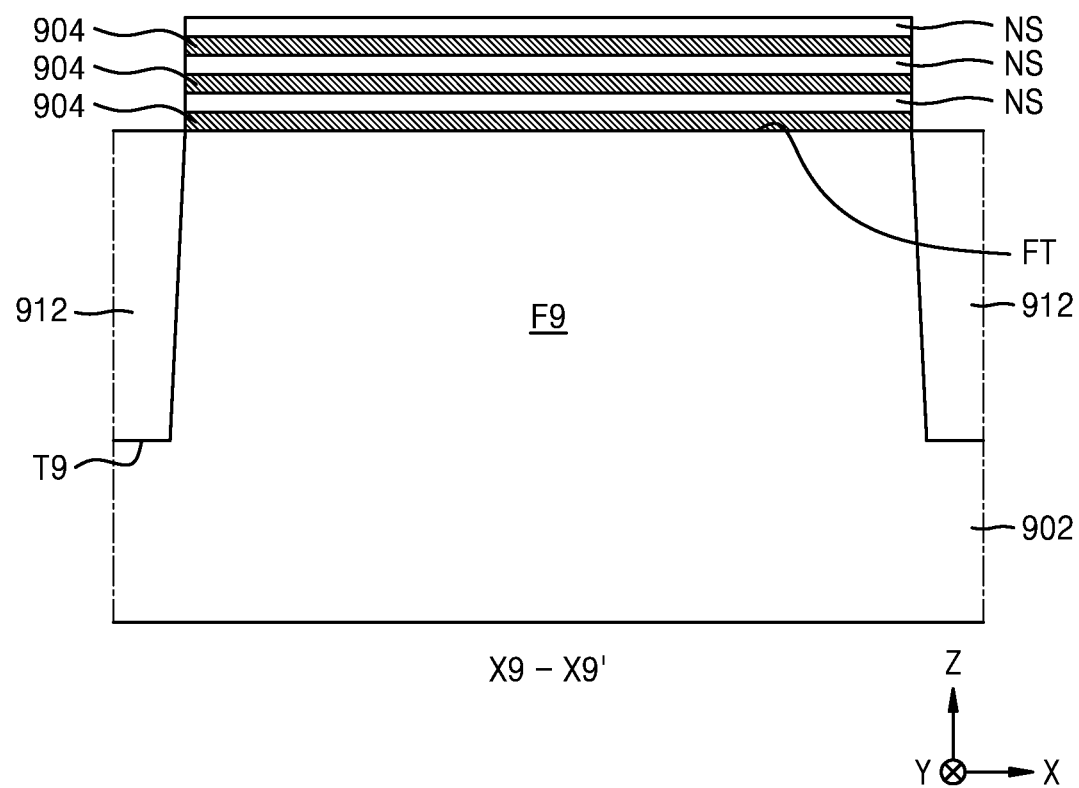
Figure 23B:
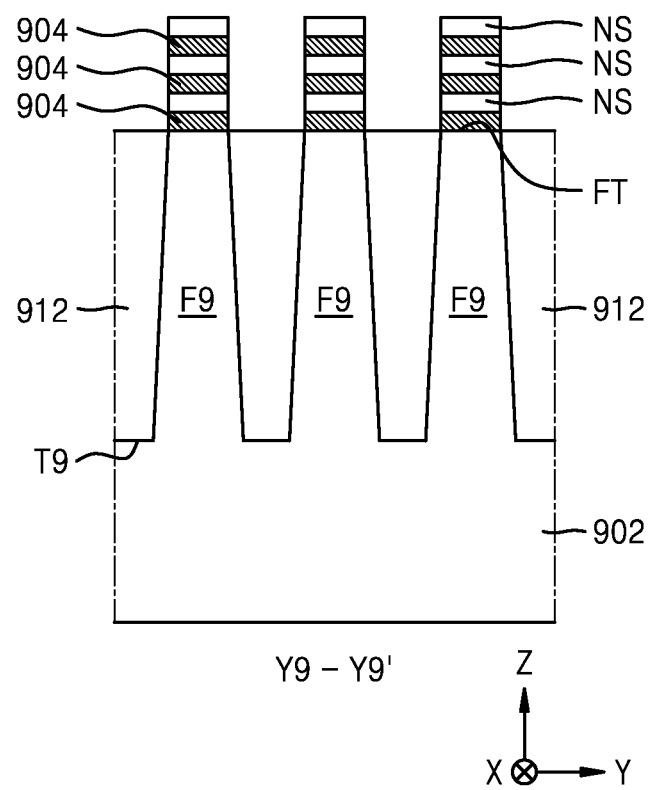

FIGS. 22A through 28 are cross-sectional views of sequential stages in a method of manufacturing an integrated circuit device, according to embodiments, wherein FIGS. 22A, 23A, . . . , and 28 show a portion corresponding to the cross-section taken along the line X9-X9' in FIG. 10A, and FIGS. 22B, 23B, . . . , and 27B show a portion corresponding to the cross-section taken along the line Y9-Y9' in FIG. 10A. A method of manufacturing the integrated circuit device 900 illustrated in FIGS. 10A through 10C will be described with reference to FIGS. 22A through 28. In FIGS. 10A through 10C and FIGS. 22A through 28, reference characters denote like elements, and redundant descriptions thereof will be omitted.

Referring to FIGS. 22A and 22B, a plurality of sacrificial semiconductor layers 904 and a plurality of nanosheet semiconductor layers NS are alternately stacked on the substrate 902. The sacrificial semiconductor layers 904 may include a different material than the nanosheet semiconductor layers NS. In example embodiments, the sacrificial semiconductor layers 904 may include SiGe, and the nanosheet semiconductor layers NS may include Si.

Referring to FIGS. 23A and 23B, a trench T9 is formed by partially etching the sacrificial semiconductor layers 904, the nanosheet semiconductor layers NS, and the substrate 902; and the isolation film 912 is formed in the trench T9. As a result, a fin-type active region F9 defined by the trench T9 may be formed. A stack structure of the sacrificial semiconductor layers 904 and the nanosheet semiconductor layers NS remains on the top surface FT of the fin-type active region F9.

Figure 24A:
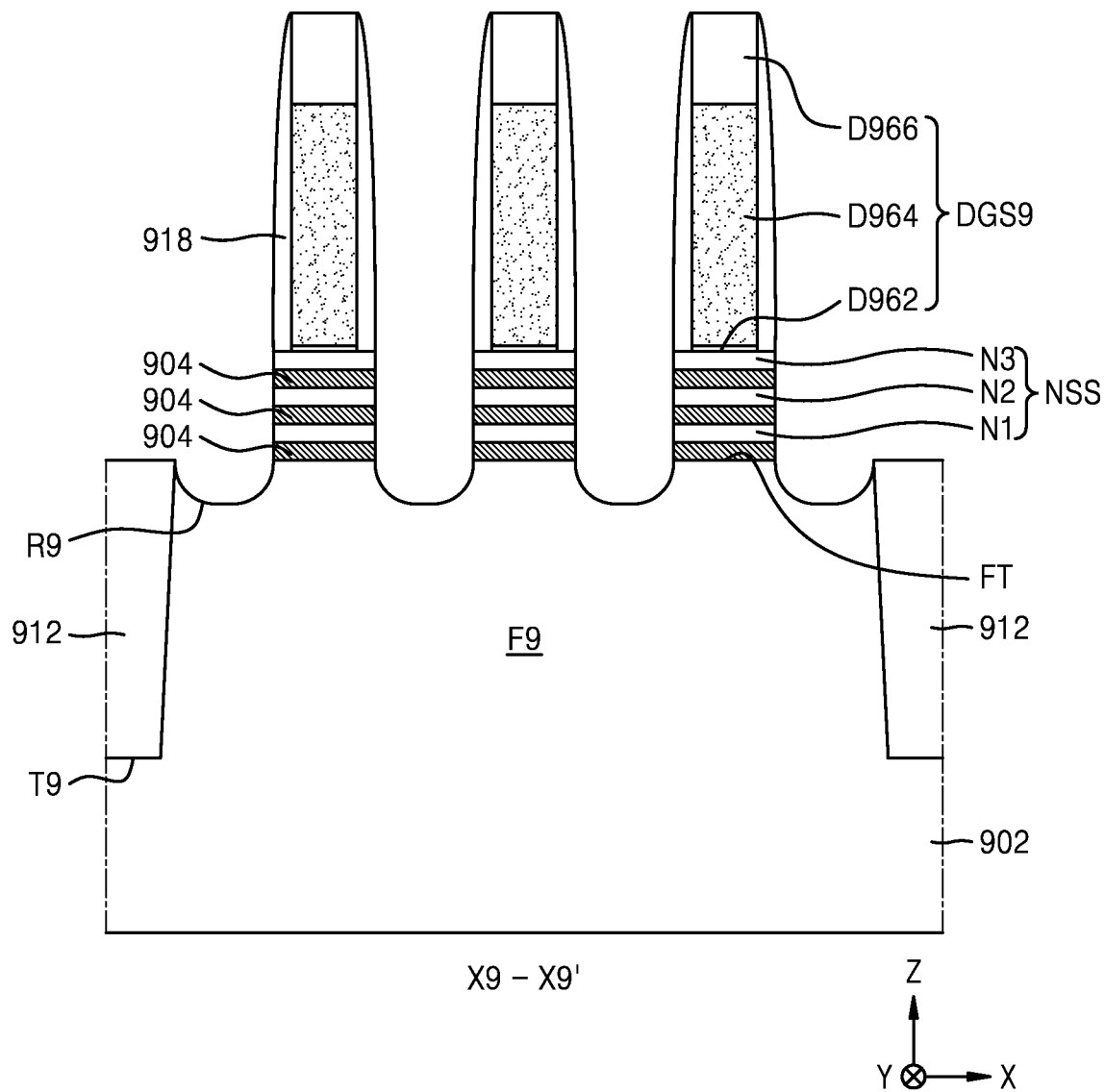
Figure 24B:
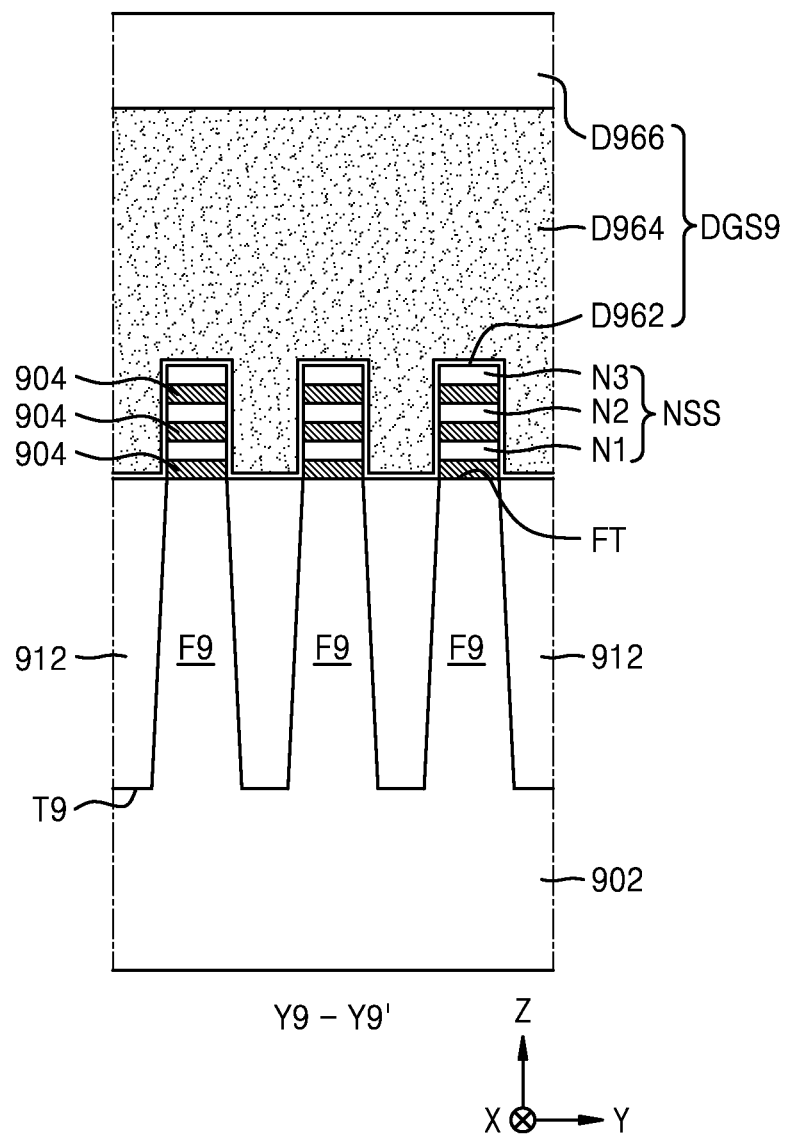

Referring to FIGS. 24A and 24B, a plurality of dummy gate structures DGS9 are formed on the stack structure of the sacrificial semiconductor layers 904 and the nanosheet semiconductor layers NS of the resultant structure of FIGS. 23A and 23B, and a plurality of outer insulating spacers 918 respectively covering both side walls of each of the dummy gate structures DGS9 are formed. Thereafter, the sacrificial semiconductor layers 904 and the nanosheet semiconductor layers NS are partially etched using the dummy gate structures DGS9 and the outer insulating spacers 918 as etch masks such that the nanosheet semiconductor layers NS are separated into a plurality of nanosheet stacks NSS including the first through third nanosheets N1, N2, and N3. Thereafter, the fin-type active region F9 exposed among the nanosheet stacks NSS is etched, thereby forming a plurality of recess regions R9 in the upper portion of the fin-type active region F9.

Each of the dummy gate structures DGS9 may extend long in the second horizontal direction (e.g., the Y direction). Each of the dummy gate structures DGS9 may have a structure, in which an insulating layer D962, a dummy gate layer D964, and a capping layer D966 are sequentially stacked. In example embodiments, the insulating layer D962 may include silicon oxide, the dummy gate layer D964 may include polysilicon, and the capping layer D966 may include silicon nitride.

Figure 25A:
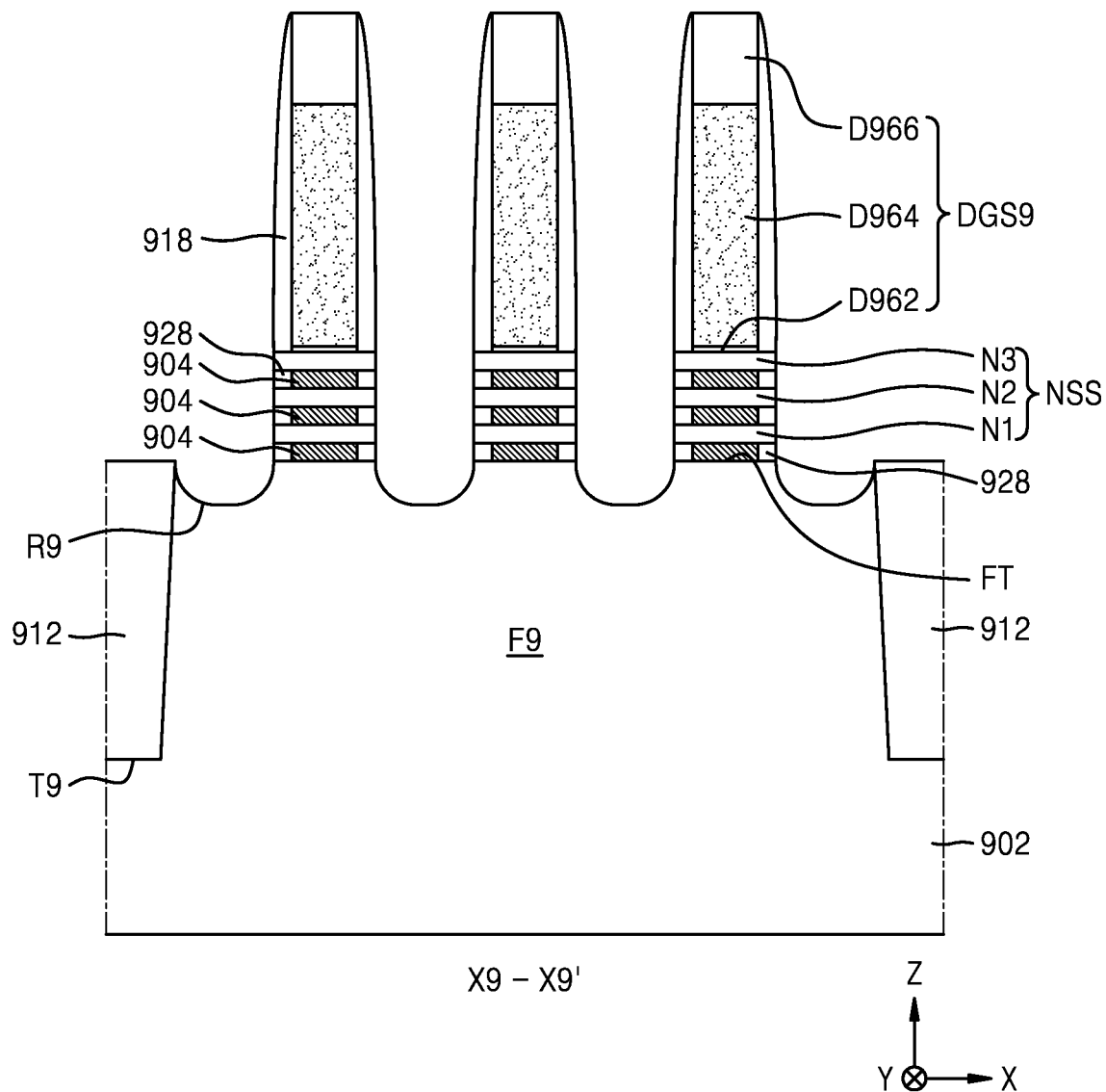
Figure 25B:
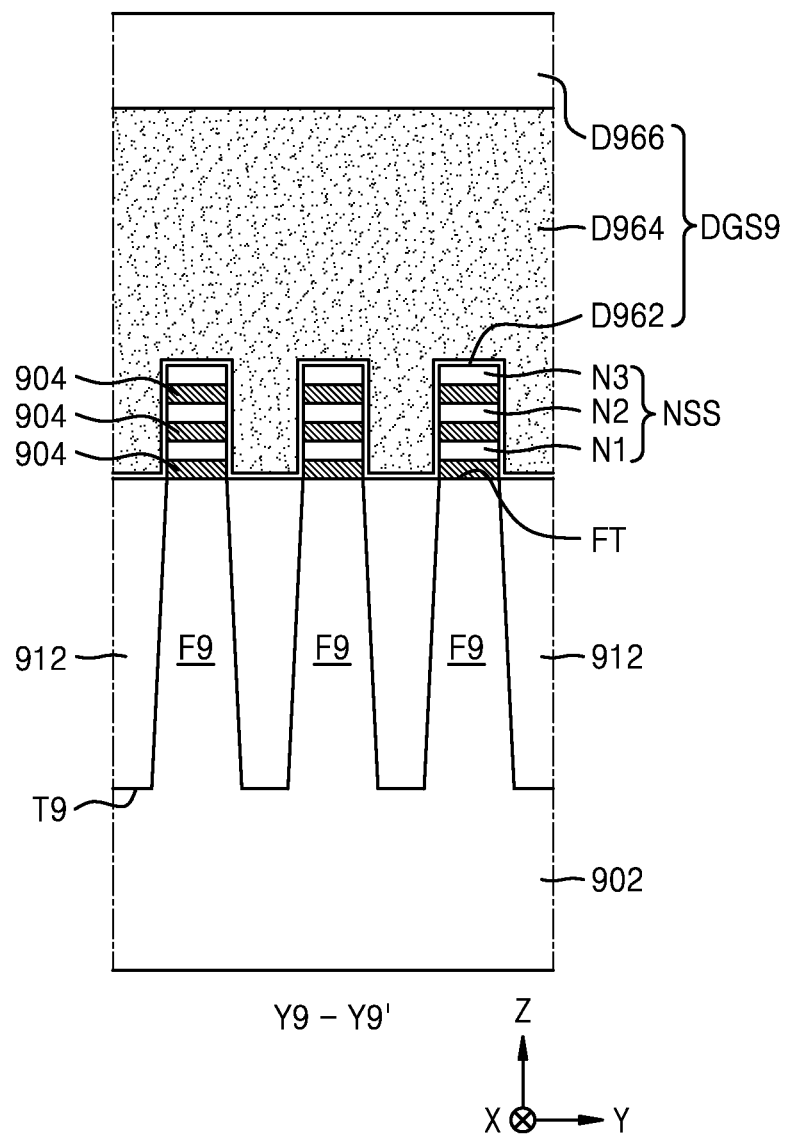

Referring to FIGS. 25A and 25B, a plurality of indents are formed among the first through third nanosheets N1 through N3 and the top surface FT by partially removing the sacrificial semiconductor layers 904 exposed around the recess regions R9 of the resultant structure of FIGS. 24A and 24B, and a plurality of inner insulating spacers 928 filling the indents are formed.

Figure 26A:
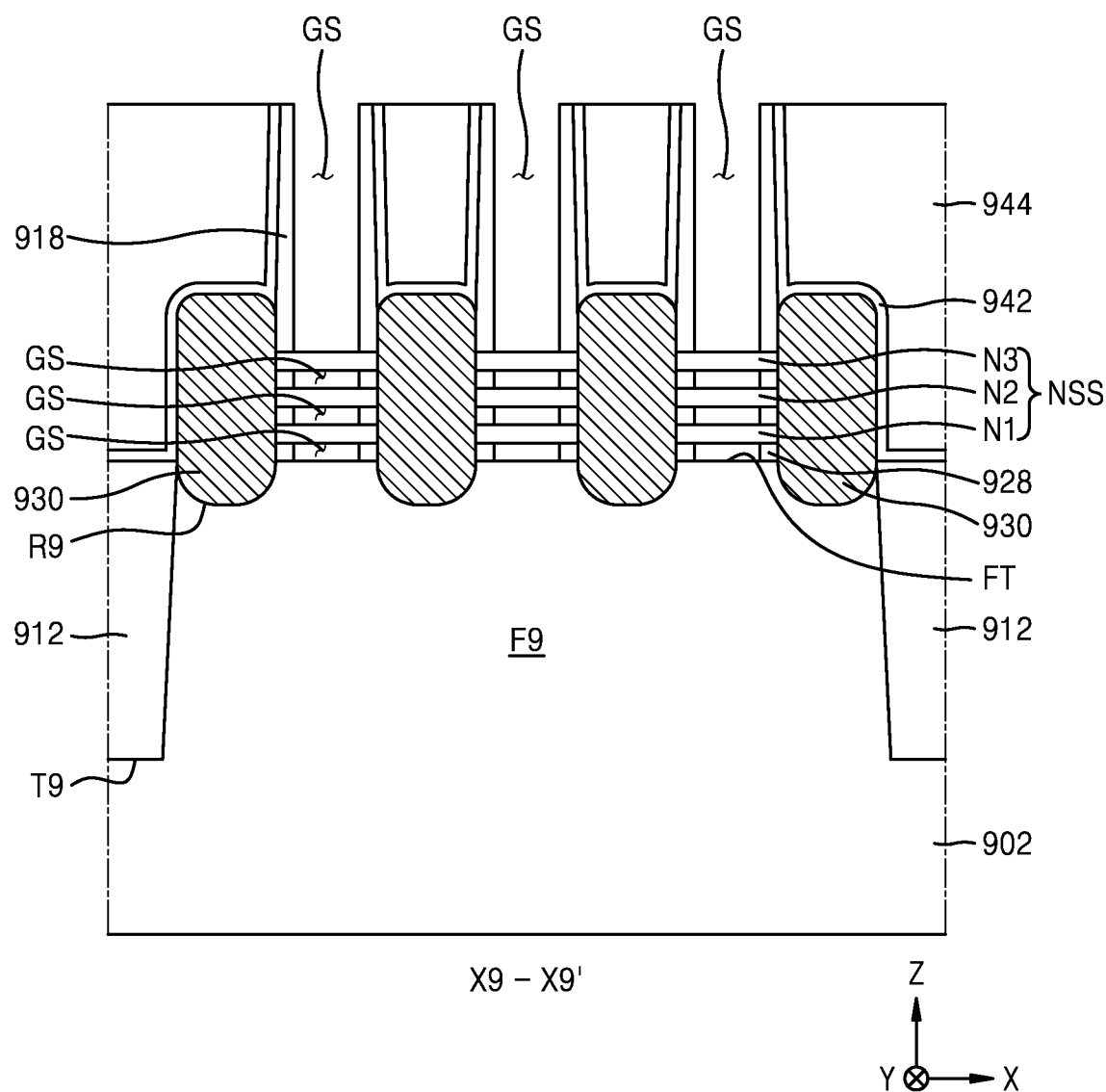
Figure 26B:
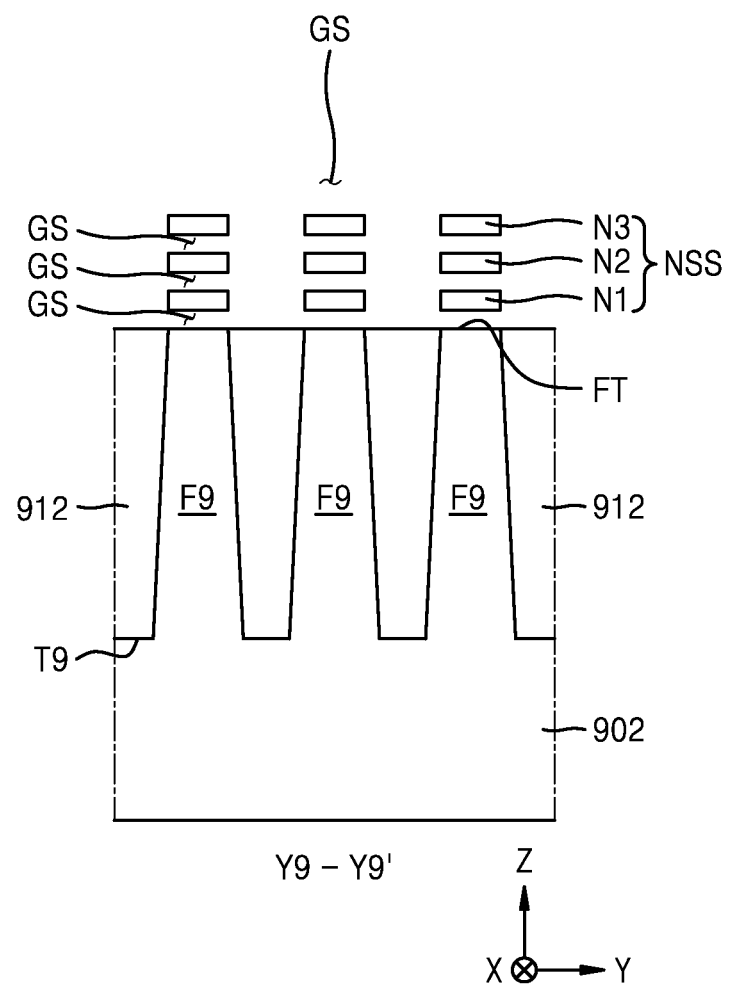

Referring to FIGS. 26A and 26B, a plurality of source/drain regions 930 are formed by epitaxially growing a semiconductor material from exposed surfaces of the recess regions R9 of the resultant structure of FIGS. 25A and 25B, an insulating liner 942 is formed to cover a resultant structure including the source/drain regions 930, an intergate insulating film 944 is formed on the insulating liner 942, and the top surface of the capping layer D966 is exposed by planarizing the top surface of each of the insulating liner 942 and the intergate insulating film 944. Thereafter, a gate space GS is provided by removing the dummy gate structures DGS9, and the sacrificial semiconductor layers 904 are removed through the gate space GS such that the gate space GS extends to spaces among the first through third nanosheets N1 through N3 and the top surface FT.

Figure 27A:
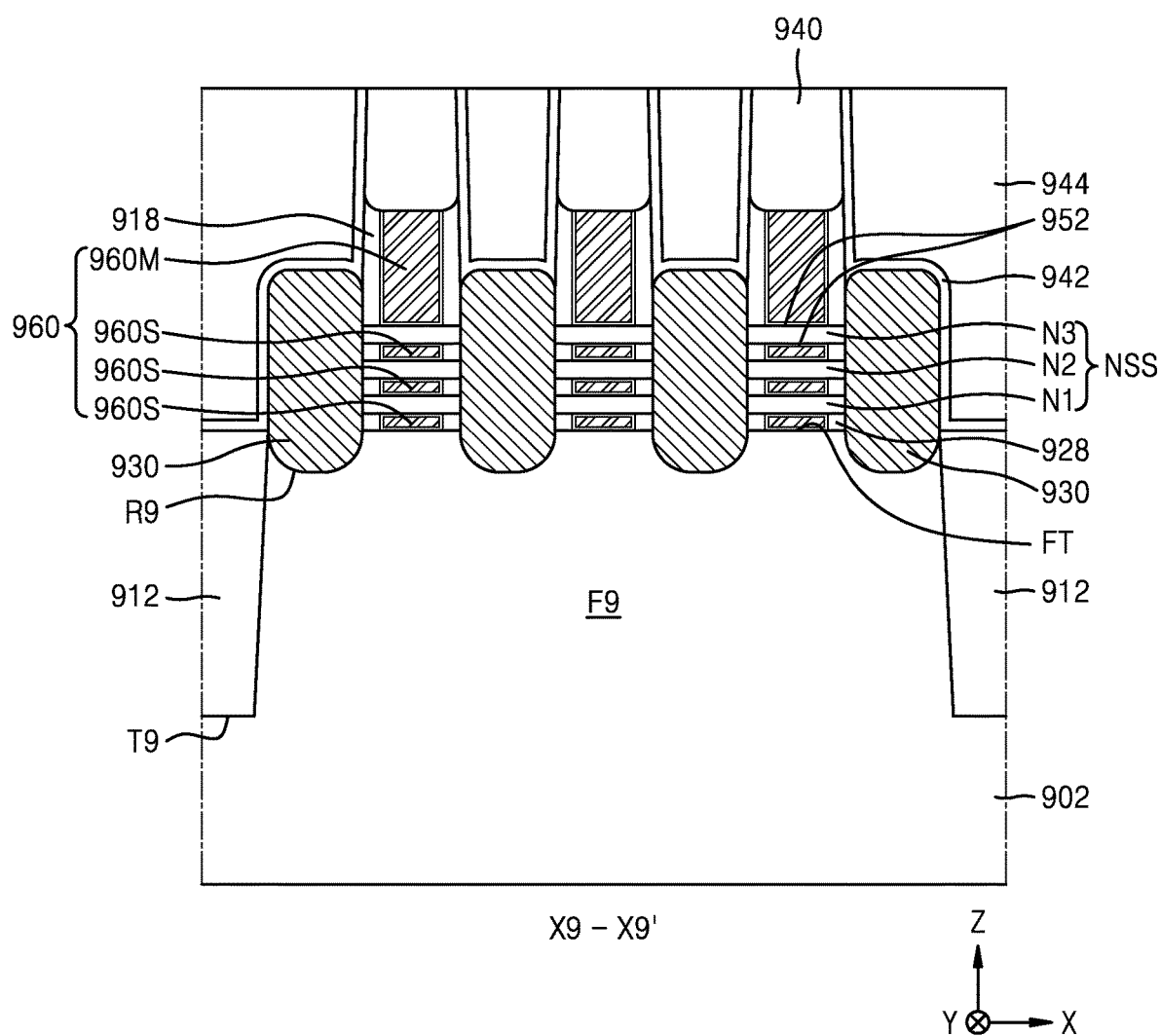
Figure 27B:
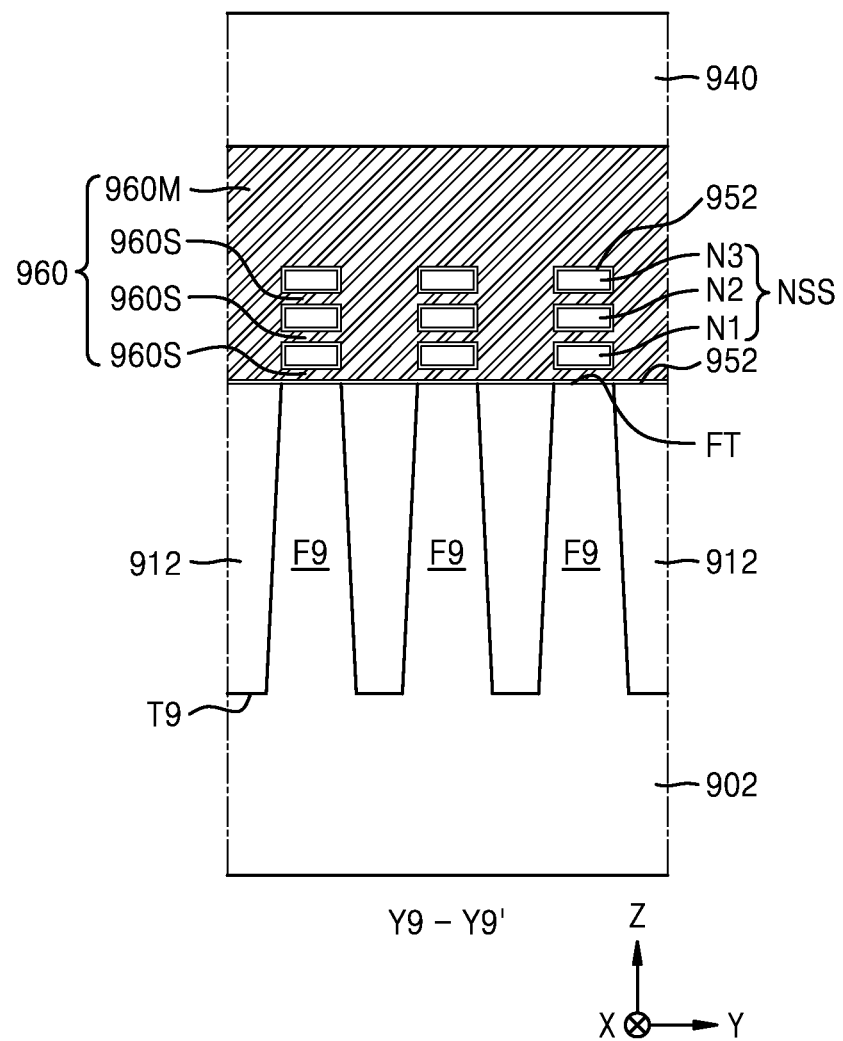

Referring to FIGS. 27A and 27B, a gate insulating film 952 is formed to cover an exposed surface of each of the first through third nanosheets N1 through N3 and the fin-type active region F9, a plurality of gate lines 960 are formed on the gate insulating film 952 to fill a plurality of gate spaces GS, and an upper portion of each of the gate lines 960 and an upper portion of each of the gate insulating film 952 and the outer insulating spacers 918, which are around the gate lines 960, are removed to empty the upper portion of each of the gate spaces GS. Thereafter, the upper portion of each of the gate spaces GS is filled with an insulating capping line 940. Because planarization is performed during the formation of the gate lines 960 and the insulating capping line 940, the height of each of the insulating liner 942 and the intergate insulating film 944 may be lowered.

Figure 28:
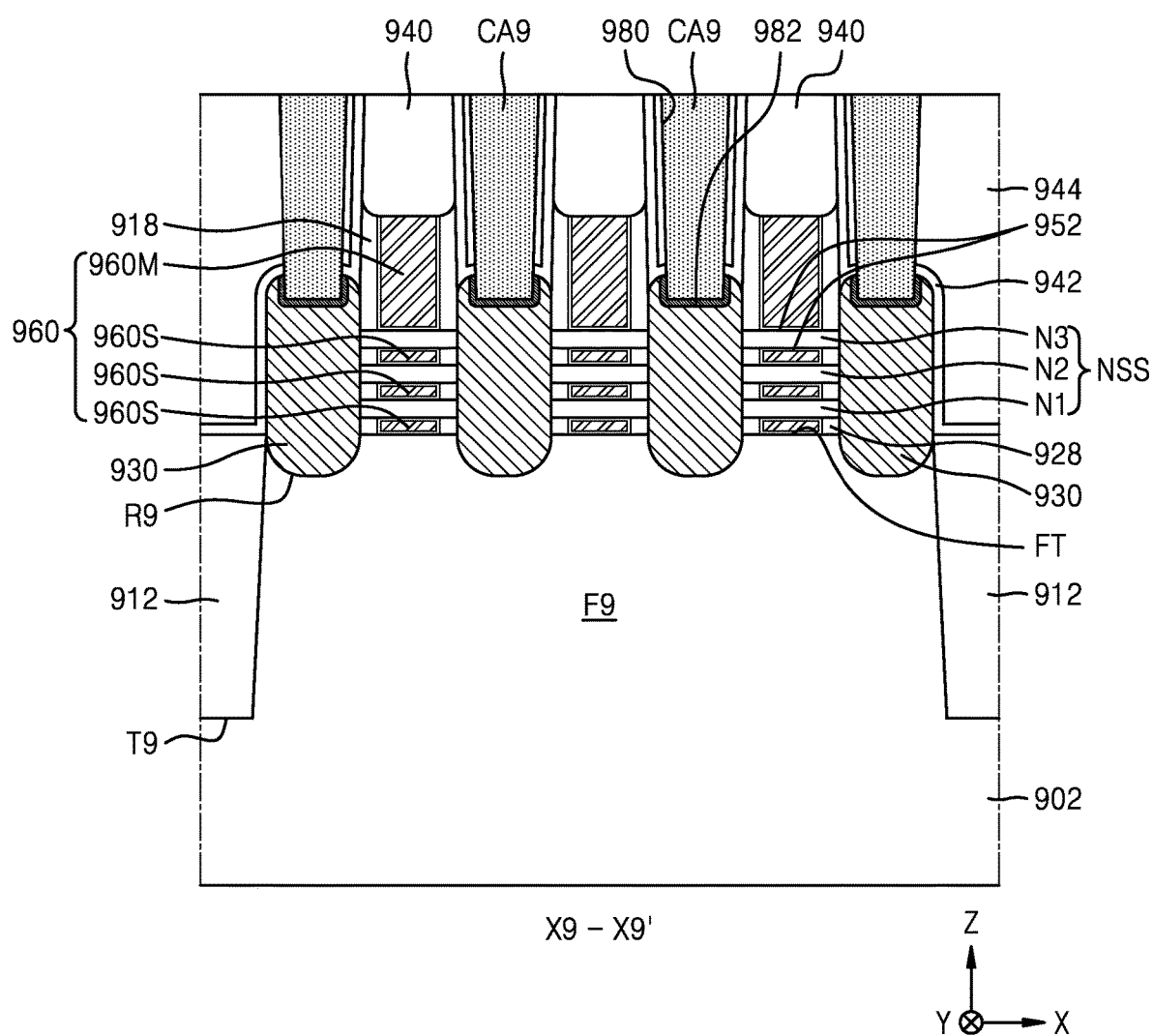

Referring to FIG. 28, a plurality of contact holes 980 exposing the source/drain regions 930 are formed by partially etching the intergate insulating film 944 and the insulating liner 942. A metal silicide film 982 and a source/drain contact CA9 are formed in each of the contact holes 980.

In example embodiments, the method of forming the metal silicide film 152 and the source/drain contact CA, which has been described with reference to FIGS. 16A through 16C, may be used to form the metal silicide film 982 and the source/drain contact CA9.

Thereafter, processes similar to those described with reference to FIGS. 17A through 18C may be performed on the resultant structure of FIG. 28, thereby forming a plurality of source/drain contact patterns CAP9 from a plurality of source/drain contacts CA9. The height of a portion of the insulating capping line 940 is lowered, thereby forming an asymmetric capping portion 940AS having a variable thickness in the first horizontal direction (e.g., the X direction) in the insulating capping line 940. After the asymmetric capping portion 940AS is formed in the insulating capping line 940, the insulating capping line 940 may have a variable thickness in the second horizontal direction (e.g., the Y direction). Thereafter, the integrated circuit device 900 illustrated in FIGS. 10A through 10C may be manufactured by forming the buried insulating film 970 using the method of forming the buried insulating film 170, which has been described with reference to FIGS. 19A through 19C.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a fin-type active region extending on a substrate in a first horizontal direction;
   a gate line extending on the fin-type active region in a second horizontal direction perpendicular to the first horizontal direction;
   a first source/drain region on the fin-type active region and adjacent to a first side wall of the gate line;
   a second source/drain region arranged on the fin-type active region and adjacent to a second side wall opposite the first side wall of the gate line;
   a first source/drain contact pattern electrically connected to the first source/drain region and comprising a first segment having a first height in a vertical direction that is perpendicular to the first horizontal direction and the second horizontal direction;
   a second source/drain contact pattern electrically connected to the second source/drain region and comprising a second segment having a second height less than the first height in the vertical direction; and
   an insulating capping line on the gate line and that extends in the second horizontal direction and comprises an asymmetric capping portion between the first segment of the first source/drain contact pattern and the second segment of the second source/drain contact pattern,
   wherein the asymmetric capping portion has a variable thickness in the first horizontal direction, and
   wherein the variable thickness of the asymmetric capping portion decreases toward the second segment of the second source/drain contact pattern in the first horizontal direction.

2. The integrated circuit device of claim 1,
   wherein the asymmetric capping portion overlaps the fin-type active region in the vertical direction, and
   wherein the gate line is between the asymmetric capping portion and the fin-type active region in the vertical direction.

3. The integrated circuit device of claim 1,
   wherein a first portion of the asymmetric capping portion adjacent to the first segment of the first source/drain contact pattern in the first horizontal direction is thicker than a second portion of the asymmetric capping portion adjacent to the second segment in the first horizontal direction.

4. The integrated circuit device of claim 1,
   wherein the first segment of the first source/drain contact pattern overlaps the fin-type active region in the vertical direction,
   wherein the first source/drain region is between the first segment of the first source/drain contact pattern and the fin-type active region in the vertical direction, and
   wherein the second segment of the second source/drain contact pattern overlaps the fin-type active region in the vertical direction,
   wherein the second source/drain region is between the second segment of the second source/drain contact pattern and the fin-type active region in the vertical direction.

5. The integrated circuit device of claim 1,
   wherein a height of a first top surface of the first segment of the first source/drain contact pattern is greater than a height of a top surface of the gate line in the vertical direction, and
   wherein a height of a second top surface of the second segment is less than the height of the top surface of the gate line in the vertical direction.

6. The integrated circuit device of claim 1, further comprising:
   a gate contact that penetrates a first portion of the insulating capping line and is in contact with the gate line,
   wherein a thickness of the first portion of the insulating capping line is less than a maximum thickness of the insulating capping line.

7. The integrated circuit device of claim 1, further comprising:
   a buried insulating film on a top surface of the second segment of the second source/drain contact pattern and on a portion of the asymmetric capping portion;
   an insulating structure on a top surface of the buried insulating film;
   a via contact separated from the buried insulating film, wherein the via contact penetrates the insulating structure, and is in contact with a top surface of the first segment of the first source/drain contact pattern;
   a gate contact that penetrates the insulating structure, the buried insulating film, and the insulating capping line and is in contact with the gate line; and
   a gate contact that penetrates a first portion of the insulating capping line and is in contact with the gate line,
   wherein a thickness of a portion of the insulating capping line that is penetrated by the gate contact is less than a maximum thickness of the insulating capping line.

8. An integrated circuit device comprising:
   a plurality of fin-type active regions extending on a substrate in a first horizontal direction, and parallel with each other;
   a plurality of gate lines on the plurality of fin-type active regions that extend in a second horizontal direction perpendicular to the first horizontal direction;
   a plurality of insulating capping lines on the plurality of gate lines and extending in the second horizontal direction;
   a plurality of source/drain regions arranged on the plurality of fin-type active regions, wherein each of the plurality of source/drain regions are between respective adjacent gate lines among the plurality of gate lines; and
   a plurality of source/drain contact patterns electrically connected to respective ones of the plurality of source/drain regions,
   wherein at least one insulating capping line among the plurality of insulating capping lines comprises an asymmetric capping portion between adjacent source/drain contact patterns among the plurality of source/drain contact patterns, wherein the asymmetric capping portion has a variable thickness in the first horizontal direction, wherein each of the plurality of source/drain contact patterns comprises a first segment and a second segment integrally connected to the first segment, the first segment having a first height in a vertical direction that is perpendicular to the first horizontal direction and the second horizontal direction, and the second segment having a second height less than the first height, and wherein the variable thickness of the asymmetric capping portion decreases toward the second segment in the first horizontal direction.

9. The integrated circuit device of claim 8, wherein the adjacent source/drain contact patterns have different heights in a vertical direction that is perpendicular to the first horizontal direction and the second horizontal direction, with the asymmetric capping portion therebetween.

10. The integrated circuit device of claim 8, wherein the plurality of insulating capping lines comprises a first insulating capping line and a second insulating capping line that is adjacent to the first insulating capping line, wherein a first asymmetric capping portion comprises the asymmetric capping portion, wherein the first insulating capping line comprises the first asymmetric capping portion and the second insulating capping line comprises a second asymmetric capping portion, and wherein respective thicknesses of the first asymmetric capping portion and the second asymmetric capping portion decrease in the first horizontal direction in a region between the first insulating capping line and the second insulating capping line.

11. The integrated circuit device of claim 8, wherein the plurality of insulating capping lines comprise a first insulating capping line and a second insulating capping line that is adjacent to the first insulating capping line, wherein a first asymmetric capping portion comprises the asymmetric capping portion, wherein the first insulating capping line comprises the first asymmetric capping portion and the second insulating capping line comprises a second asymmetric capping portion, and wherein respective thicknesses of the first asymmetric capping portion and the second asymmetric capping portion increase in the first horizontal direction in a region between the first insulating capping line and the second insulating capping line.

12. The integrated circuit device of claim 8, wherein ones of the plurality of insulating capping lines comprise a first portion and a second portion, wherein the first portion is between respective first segments of a first pair of adjacent source/drain contact patterns among the plurality of source/drain contact patterns, and the second portion is between respective second segments of a second pair of adjacent source/drain contact patterns among the plurality of source/drain contact patterns, and wherein the first portion has a first thickness in the vertical direction, and the second portion has a second thickness less than the first thickness in the vertical direction.

13. The integrated circuit device of claim 8, wherein at least some of the plurality of insulating capping lines have a variable thickness in the second horizontal direction.

14. The integrated circuit device of claim 8, wherein the substrate comprises a device region with the plurality of fin-type active regions and a device isolation region without the plurality of fin-type active regions, wherein the device isolation region is adjacent to the device region, wherein the plurality of gate lines and the plurality of insulating capping lines extend in the second horizontal direction in the device region and the device isolation region, and wherein a first maximum thickness of a first portion of the plurality of insulating capping lines in the device isolation region is less than a second maximum thickness of a second portion of the plurality of insulating capping lines in the device region.

15. An integrated circuit device comprising:

a substrate comprising a first device region, a second device region, and a device isolation region between the first device region and the second device region;

a plurality of fin-type active regions extending in a first horizontal direction and parallel with each other in the first device region and the second device region;

a gate line extending in a second horizontal direction perpendicular to the first horizontal direction in the first device region, the second device region, and the device isolation region and on the plurality of fin-type active regions;

an insulating capping line extending in the second horizontal direction in the first device region, the second device region, and the device isolation region and on the gate line;

a first pair of source/drain regions in the first device region and respectively at both sides of the gate line; and a first pair of source/drain contact patterns in the first device region and electrically connected to the first pair of source/drain regions, wherein the insulating capping line comprises an asymmetric capping portion between the first pair of source/drain contact patterns, wherein the asymmetric capping portion has a variable thickness in the first horizontal direction, and wherein a first maximum thickness of a first portion of the insulating capping line on the device isolation region is less than a second maximum thickness of a second portion of the insulating capping line on one of the first device region or the second device region.

16. The integrated circuit device of claim 15, wherein the first pair of source/drain contact patterns respectively have different heights in a vertical direction that is perpendicular to the first horizontal direction and the second horizontal direction on a first fin-type active region among the plurality of fin-type active regions, and wherein the asymmetric capping portion vertically overlaps the first fin-type active region.

17. The integrated circuit device of claim 15, further comprising:

a second pair of source/drain regions in the second device region and respectively at both sides of the gate line; and a second pair of source/drain contact patterns in the second device region and respectively electrically connected to the second pair of source/drain regions, wherein each of the second pair of source/drain contact patterns comprises a first segment and a second segment integrally connected to the first segment, wherein the first segment has a first height in a vertical direction perpendicular to the first horizontal direction and the second horizontal direction, and the second segment has a second height less than the first height, and wherein the insulating capping line comprises a first portion and a second portion, wherein the first portion is between respective first segments of the first pair of source/drain contact patterns, and the second portion is between respective second segments of the second pair of source/drain contact patterns.

18. The integrated circuit device of claim 15, wherein each of the first pair of source/drain contact patterns comprises a first segment and a second segment integrally connected to the first segment, wherein the first segment has a first height in a vertical direction, and the second segment has a second height in the vertical direction less than the first height, and wherein a maximum thickness of the first portion of the insulating capping line between respective second segments of the first pair of source/drain contact patterns is less than a maximum thickness of the asymmetric capping portion.

* * * * *